United States Patent
Miyairi

(10) Patent No.: US 7,749,820 B2
(45) Date of Patent: Jul. 6, 2010

(54) THIN FILM TRANSISTOR, MANUFACTURING METHOD THEREOF, DISPLAY DEVICE, AND MANUFACTURING METHOD THEREOF

(75) Inventor: Hidekazu Miyairi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/393,121

(22) Filed: Feb. 26, 2009

(65) Prior Publication Data

US 2009/0227076 A1    Sep. 10, 2009

(30) Foreign Application Priority Data

Mar. 7, 2008   (JP)   ............... 2008-057208

(51) Int. Cl.
H01L 21/84   (2006.01)
(52) U.S. Cl. ............. 438/151; 438/22; 438/29; 438/38; 438/45; 438/158; 257/E21.411; 257/E21.414; 257/E33.053
(58) Field of Classification Search ........... 438/22, 438/29, 38, 45, 151, 158; 257/E21.411, E21.414, 257/E33.053
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,485,997 B2 | 11/2002 | Lee et al. | |
| 6,493,048 B1 | 12/2002 | Baek et al. | |
| 6,635,581 B2 * | 10/2003 | Wong | 438/736 |
| 7,116,384 B2 * | 10/2006 | Chen | 349/47 |
| 7,223,643 B2 | 5/2007 | Ohnuma et al. | |
| 2001/0049064 A1 * | 12/2001 | Lee et al. | 430/5 |
| 2002/0125477 A1 * | 9/2002 | So et al. | 257/59 |
| 2006/0290867 A1 | 12/2006 | Ahn et al. | |

(Continued)

FOREIGN PATENT DOCUMENTS

JP   64-084669   3/1989

(Continued)

OTHER PUBLICATIONS

C.W. Kim et al.; "42.1: A Novel Four-Mask-Count Process Architecture for TFT-LCDs"; *SID Digest '00 : SID International Symposium Digest of Technical Papers*; pp. 1006-1009; 2000.

Primary Examiner—Alexander G Ghyka
Assistant Examiner—Leonard Chang
(74) Attorney, Agent, or Firm—Fish & Richardson P.C.

(57) ABSTRACT

Disclosed is a manufacturing method of a thin film transistor, which enables the formation of a thin film transistor by using only one photomask. The method includes: over a substrate sequentially forming a first insulating film, a first conductive film, a second insulating film, a semiconductor film, an impurity semiconductor film, and a second conductive film; forming a resist mask thereover using a first photomask; performing a first etching to allow the side surface of the layers including an upper portion of the first insulating film, the first conductive film, the second insulating film, the semiconductor film, the impurity semiconductor film, and the second conductive film to be coplanar to a side surface of the resist mask; and performing a second etching to selectively etch the first conductive film to allow the side surface of the first conductive film is located inside the side surface of the layers.

22 Claims, 43 Drawing Sheets

U.S. PATENT DOCUMENTS

| | | |
|---|---|---|
| 2007/0002249 A1 | 1/2007 | Yoo et al. |
| 2007/0126969 A1* | 6/2007 | Kimura et al. ............... 349/141 |
| 2007/0139571 A1 | 6/2007 | Kimura |
| 2007/0146591 A1 | 6/2007 | Kimura et al. |
| 2007/0222936 A1 | 9/2007 | Shih |

FOREIGN PATENT DOCUMENTS

| | | |
|---|---|---|
| JP | 03-011744 | 1/1991 |
| JP | 03-161938 | 7/1991 |
| JP | 2003-179069 | 6/2003 |
| WO | 2008/099528 A1 | 8/2008 |

* cited by examiner 108 110 112

100 101 102 104 106

114

113 115 d1    116C    d1

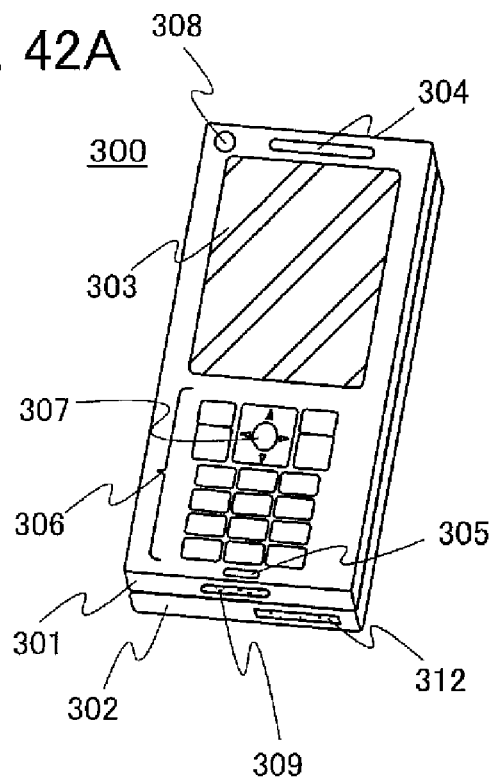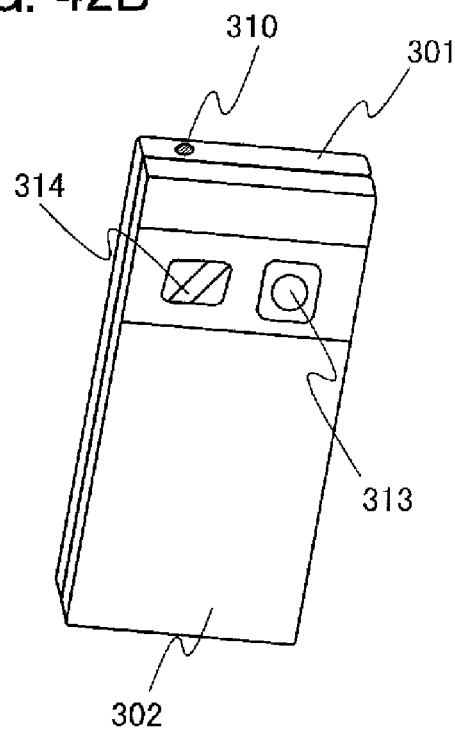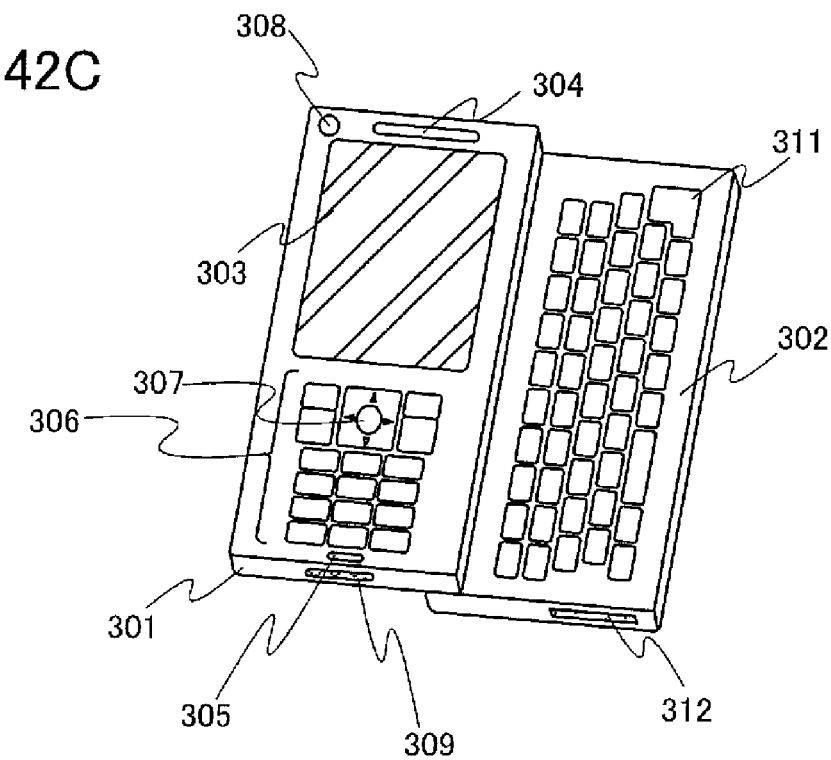

THIN FILM TRANSISTOR, MANUFACTURING METHOD THEREOF, DISPLAY DEVICE, AND MANUFACTURING METHOD THEREOF

BACKGROUND OF THE INVENTION

1. Field of the Invention

The present invention relates to a thin film transistor, a manufacturing method thereof, a display device including the thin film transistor, and a manufacturing method thereof.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as ICs (integrated circuits) and electro-optical devices. In particular, rapid development of thin film transistors as switching elements of image display devices typified by liquid crystal display devices, EL (electro luminescence) display devices, and the like has been demanded. In an active matrix liquid crystal display device, a voltage is applied to a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements. An active matrix EL display device means an EL display device which employs a method in which a display pattern is formed on a screen by driving pixels arranged in matrix using switching elements.

The application range of the active matrix liquid crystal display device and the active matrix EL display device is expanding, and demands for larger screen size, higher definition, and higher aperture ratio are expanding. In addition, it is demanded that the active matrix liquid crystal display device and the active matrix EL display device have high reliability and that a production method of the active matrix liquid crystal display device and the active matrix EL display device offers high yield and reduces production cost. As a method for increasing yield and reducing production cost, simplification of the process can be given.

In an active matrix liquid crystal display device and an EL display device, thin film transistors are mainly used as switching elements. In manufacturing thin film transistors, reduction in the number of photomasks used in photolithography is important for simplification of the process. For example, if one photomask is additionally used, the following steps are further needed: resist application, prebaking, light exposure, development, postbaking, and the like and, moreover, steps before and after the aforementioned steps, such as film formation, etching, resist removal, cleaning, drying, and the like. The number of steps is significantly increased only by adding one step using a photomask in the manufacturing process. Therefore, many techniques for reducing the number of photomasks required in a manufacturing process have been developed.

Thin film transistors are broadly classified into top gate thin film transistors in each of which a channel formation region is provided below a gate electrode and bottom gate thin film transistors in each of which a channel formation region is provided above a gate electrode. It is known that the number of photomasks used in a process for manufacturing a bottom gate thin film transistor is smaller than that in a process for manufacturing a top gate thin film transistor. A bottom gate thin film transistor is generally manufactured using three photomasks.

Many conventional techniques for reducing the number of photomasks use a complicated technique such as backside light exposure, resist reflow, or a lift-off method, which requires a special apparatus. There is a possibility that the yield or the like is decreased due to various problems caused by usage of such a complicated technique. Moreover, in many cases, electric characteristics of thin film transistors are sacrificed due to the priority of the process simplification.

As typical means for reducing the number of photomasks in a manufacturing process of a thin film transistor, a technique using a multi-tone mask (called a half-tone mask or a gray-tone mask) is widely known. A technique for reducing the number of manufacturing steps by using a multi-tone mask is disclosed in Patent Document 1 (Japanese Published Patent Application No. 2003-179069), for example.

SUMMARY OF THE INVENTION

However, even in the case where a bottom gate thin film transistor is manufactured using the above multi-tone mask, at least two photomasks are required, and it is difficult to further reduce the number of photomasks. Here, one of the two photomasks is used for patterning of a gate electrode layer.

In view of the above problems, an object of an embodiment of the invention is to provide a new method for manufacturing a thin film transistor which requires no additional photomask for patterning a gate electrode layer. Namely, a manufacturing method is disclosed, which enables the manufacture of a thin film transistor without a complicated technique even if only a single photomask is employed.

This method makes it possible to reduce the number of photomasks in a manufacture of a thin film transistor compared with the conventional photolithography technique.

Further, the embodiment of the invention can be particularly applied to the manufacture of a thin film transistor used in a pixel of a display device (also referred to as a pixel TFT). Therefore, it is an object of an embodiment of the invention disclosed in this specification to provide a manufacturing method of a display device, in which the number of photomasks used in photolithography is smaller than that in a conventional process without using a complicated technique.

Furthermore, it is an object to provide a thin film transistor which is manufactured using a reduced number of photomasks and, in addition, has low off current and favorable electric characteristics, and a display device including such a thin film transistor.

In a manufacturing method of a thin film transistor which is an embodiment of the invention, a first insulating film, a first conductive film, and a thin-film stack body, in which a second insulating film, a semiconductor film, an impurity semiconductor film, and a second conductive film are stacked in this order over the first conductive film, are formed; part (upper portion) of the first insulating film, the first conductive film, and the thin-film stack body are etched by first etching to form a pattern of the thin-film stack body; and a pattern of the first conductive film is formed by second etching. Here, the second etching is performed under such conditions as to selectively side-etch the first conductive film.

Here, as the first etching, dry etching or wet etching may be employed and a highly anisotropic etching method (physical etching) is preferably employed. By employing a highly anisotropic etching method as the first etching, processing accuracy of a pattern can be improved. Note that the first etching can be performed in one step when dry etching is employed as the first etching, while the first etching is performed in plural steps when wet etching is employed as the first etching. Therefore, dry etching is preferably employed as the first etching.

As the second etching, dry etching or wet etching may be employed and a highly isotropic etching method (chemical etching) is preferably employed. By employing a highly isotropic etching method (chemical etching) as the second etching, the first conductive film can be side-etched. Therefore, wet etching is preferably employed as the second etching.

Note that the "pattern of the first conductive film" means, for example, a top view layout of a metal wiring which forms a gate electrode, a gate wiring, a capacitor electrode, and a capacitor wiring.

One aspect of another embodiment of the invention disclosed in this specification is a manufacturing method of a thin film transistor which includes the steps of: sequentially forming a first insulating film, a first conductive film, a second insulating film, a semiconductor film, an impurity semiconductor film, and a second conductive film; forming a first resist mask over the second conductive film; performing first etching on part of the first insulating film, the first conductive film, the second insulating film, the semiconductor film, the impurity semiconductor film, and the second conductive film using the first resist mask; performing second etching in which part of the first conductive film is side-etched to form a gate electrode layer; forming a second resist mask over the second conductive film; and performing third etching on the second conductive film, the impurity semiconductor film, and part of the semiconductor film using the second resist mask to form source and drain electrode layers, source and drain region layers, and a semiconductor layer.

One aspect of an another embodiment of the invention disclosed in this specification is a manufacturing method of a thin film transistor which includes the steps of: sequentially forming a first insulating film, a first conductive film, a second insulating film, a semiconductor film, an impurity semiconductor film, and a second conductive film; forming a first resist mask over the second conductive film; performing first etching on part of the first insulating film, the first conductive film, the second insulating film, the semiconductor film, the impurity semiconductor film, and the second conductive film using the first resist mask; forming a second resist mask over the second conductive film; performing second etching in which part of the first conductive film is side-etched to form a gate electrode layer; and performing third etching on the second conductive film, the impurity semiconductor film, and part of the semiconductor film using the second resist mask to form source and drain electrode layers, source and drain region layers, and a semiconductor layer.

One aspect of an another embodiment of the invention disclosed in this specification is a manufacturing method of a thin film transistor which includes the steps of: sequentially forming a first insulating film, a first conductive film, a second insulating film, a semiconductor film, an impurity semiconductor film, and a second conductive film; forming a first resist mask having a recessed portion, over the second conductive film; performing first etching on part of the first insulating film, the first conductive film, the second insulating film, the semiconductor film, the impurity semiconductor film, and the second conductive film using the first resist mask; performing second etching in which part of the first conductive film is side-etched to form a gate electrode layer; forming a second resist mask by reducing a thickness of the first resist mask, allowing exposure of part of the second conductive film which overlaps with the recessed portion of the first resist mask; and performing third etching on the second conductive film, the impurity semiconductor film, and part of the semiconductor film using the second resist mask to form source and drain electrode layers, source and drain region layers, and a semiconductor layer.

One aspect of an another embodiment of the invention disclosed in this specification is a manufacturing method of a thin film transistor which includes the steps of: sequentially forming a first insulating film, a first conductive film, a second insulating film, a semiconductor film, an impurity semiconductor film, and a second conductive film; forming a first resist mask having a recessed portion, over the second conductive film; performing first etching on part of the first insulating film, the first conductive film, the second insulating film, the semiconductor film, the impurity semiconductor film, and the second conductive film using the first resist mask; forming a second resist mask by reducing a thickness of the first resist mask, allowing exposure of part of the second conductive film which overlaps with the recessed portion of the first resist mask performing second etching in which part of the first conductive film is side-etched to form a gate electrode layer; and performing third etching on the second conductive film, the impurity semiconductor film, and part of the semiconductor film using the second resist mask to form source and drain electrode layers, source and drain region layers, and a semiconductor layer.

In the manufacturing methods having the above-described structures, in the case where the first resist mask has a recessed portion, the first resist mask is preferably formed using a multi-tone mask. By using the multi-tone mask, a resist mask having a recessed portion can be formed by a simple process.

By employing the manufacturing method of a thin film transistor having any of the above-described structures, an element region can be formed by the first etching, and the second etching allows a side surface of the gate electrode layer to be located inside a side surface of the element region keeping an almost uniform distance between the side surface of the gate electrode and the side surface of the element region.

In the manufacturing method having any of the structures using the first etching and the second etching, it is preferable that the first etching be performed by dry etching and the second etching be performed by wet etching. The processing by the first etching is preferably performed with high accuracy, and side-etching needs to be performed in the processing by the second etching. For high-accuracy processing, dry etching is preferable. Since a chemical reaction is utilized in wet etching, side-etching more readily occurs in wet etching than in dry etching.

One aspect of another embodiment of the invention disclosed in this specification is a manufacturing method of a display device which includes the steps of: sequentially forming a first insulating film, a first conductive film, a second insulating film, a semiconductor film, an impurity semiconductor film, and a second conductive film; forming a first resist mask over the second conductive film; performing first etching on part of the first insulating film, the first conductive film, the second insulating film, the semiconductor film, the impurity semiconductor film, and the second conductive film using the first resist mask; performing second etching in which part of the first conductive film is side-etched to form a gate electrode layer; forming a second resist mask over the second conductive film; performing third etching on the second conductive film, the impurity semiconductor film, and part of the semiconductor film using the second resist mask to form source and drain electrode layers, source and drain region layers, and a semiconductor layer, so that a thin film transistor is formed; removing the second resist mask; forming a third insulating film to cover the thin film transistor; forming an opening portion in the third insulating film so as to expose part of the source and drain electrode layers; and selectively forming a pixel electrode over the opening portion and the third insulating film.

One aspect of an another embodiment of the invention disclosed in this specification is a manufacturing method of a display device which includes the steps of: sequentially forming a first insulating film, a first conductive film, a second insulating film, a semiconductor film, an impurity semiconductor film, and a second conductive film; forming a first resist mask over the second conductive film; performing first etching on part of the first insulating film, the first conductive film, the second insulating film, the semiconductor film, the impurity semiconductor film, and the second conductive film using the first resist mask; forming a second resist mask over the second conductive film; performing second etching in which part of the first conductive film is side-etched to form a gate electrode layer; performing third etching on the second conductive film, the impurity semiconductor film, and part of the semiconductor film using the second resist mask to form source and drain electrode layers, source and drain region layers, and a semiconductor layer, so that a thin film transistor is formed; removing the second resist mask; forming a third insulating film to cover the thin film transistor; forming an opening portion in the third insulating film so as to expose part of the source and drain electrode layers; and selectively forming a pixel electrode over the opening portion and the third insulating film.

One aspect of another embodiment of the invention disclosed in this specification is a manufacturing method of a display device which includes the steps of: sequentially forming a first insulating film, a first conductive film, a second insulating film, a semiconductor film, an impurity semiconductor film, and a second conductive film; forming a first resist mask having a recessed portion, over the second conductive film; performing first etching on part of the first insulating film, the first conductive film, the second insulating film, the semiconductor film, the impurity semiconductor film, and the second conductive film using the first resist mask; performing second etching in which part of the first conductive film is side-etched to form a gate electrode layer; forming a second resist mask by reducing a thickness of the first resist mask, allowing exposure of part of the second conductive film which overlaps with the recessed portion of the first resist mask; performing third etching on the second conductive film, the impurity semiconductor film, and part of the semiconductor film using the second resist mask to form source and drain electrode layers, source and drain region layers, and a semiconductor layer, so that a thin film transistor is formed; removing the second resist mask; forming a third insulating film to cover the thin film transistor; forming an opening portion in the third insulating film so as to expose part of the source and drain electrode layers; and selectively forming a pixel electrode over the opening portion and the third insulating film.

One aspect of another embodiment of the invention disclosed in this specification is a manufacturing method of a display device which includes the steps of: sequentially forming a first insulating film, a first conductive film, a second insulating film, a semiconductor film, an impurity semiconductor film, and a second conductive film; forming a first resist mask having a recessed portion, over the second conductive film; performing first etching on part of the first insulating film, the first conductive film, the second insulating film, the semiconductor film, the impurity semiconductor film, and the second conductive film using the first resist mask; forming a second resist mask by reducing a thickness of the first resist mask, allowing exposure of part of the second conductive film which overlaps with the recessed portion of the first resist mask; performing second etching in which part of the first conductive film is side-etched to form a gate electrode layer; performing third etching on the second conductive film, the impurity semiconductor film, and part of the semiconductor film using the second resist mask to form source and drain electrode layers, source and drain region layers, and a semiconductor layer, so that a thin film transistor is formed; removing the second resist mask; forming a third insulating film to cover the thin film transistor; forming an opening portion in the third insulating film so as to expose part of the source and drain electrode layers; and selectively forming a pixel electrode over the opening portion and the third insulating film.

Also in the manufacturing methods of a display device having the above-described structures, the first resist mask is preferably formed using a multi-tone mask.

By employing the manufacturing method of a display device having any of the above-described structures, an element region can be formed by the first etching, and the second etching allows a side surface of the gate electrode layer to be located inside a side surface of the element region keeping an almost uniform distance between the side surface of the gate electrode and the side surface of the element region.

Also in the manufacturing method of a display device having any of the structures, it is preferable that the first etching be performed by dry etching and the second etching be performed by wet etching.

In the manufacturing method of a display device having any of the above-described structures, the third insulating film is preferably formed by stacking an insulating film by a CVD method or a sputtering method and an insulating film by a spin coating method. More preferably, the third insulating film is formed by stacking a silicon nitride film by a CVD method or a sputtering method and an organic resin film by a spin coating method. By formation of the third insulating film in this manner, the thin film transistor can be protected from an impurity element or the like which may adversely affect electric characteristics of the thin film transistor, and planarity of a surface over which a pixel electrode is formed can be improved; accordingly, reduction in yield can be prevented.

Further, a thin film transistor manufactured by using any of the manufacturing methods having the above-described structures includes a gate electrode layer over a base insulating film, a gate insulating film over the gate electrode layer, a semiconductor layer over the gate insulating film, an impurity semiconductor layer, which has a source region and a drain region, over the semiconductor layer, a source and drain electrode layer over the source region and the drain region, and a cavity adjacent to a side surface of the gate electrode layer. The cavity enables the reduction of dielectric constant (low-k) of the vicinity of an edge portion of the gate electrode.

Note that a "film" is one formed over an entire surface without being formed into a pattern, and a "layer" means one which is formed in a pattern with a desired shape using a resist mask or the like. However, as for each layer of a stacked film, a "film" and a "layer" are used in an indistinguishable manner in some cases.

Note that etching is preferably performed under such conditions as to cause unintended etching as little as possible.

In this specification, "a film has heat resistance" means that the film can keep the shape as a film and required function and characteristics under a temperature of a process.

Note that a "gate wiring" means a wiring connected to a gate electrode of a thin film transistor. The gate wiring is formed using a gate electrode layer. Further, the gate wiring is also referred to as a scanning line.

Note that a "source wiring" means a wiring connected to one of a source electrode and a drain electrode of a thin film transistor. The source wiring is formed using a source and drain electrode layer. Further, the source wiring is also referred to as a signal line.

Note that a "power supply line" means a wiring which is connected to a power source and held at a fixed potential.

In the embodiments of the invention, an additional photomask is not necessary for patterning a gate electrode layer, so that the number of manufacturing steps of a thin film transistor can be significantly reduced. Since the thin film transistor can be applied to a display device, the steps for manufacturing a display device can be significantly reduced as well.

More specifically, the number of photomasks can be reduced. It is also possible to manufacture a thin film transistor using one photomask (multi-tone mask). Accordingly, the number of manufacturing steps of a display device can be significantly reduced. Further, since a thin film transistor can be manufactured using one photomask, photomask misalignment can be prevented.

In addition, a complicated step using backside light exposure, resist reflow, a lift-off method, or the like is not needed unlike the conventional technique which aims at reducing the number of photomasks. Therefore, the number of manufacturing steps of a display device can be significantly reduced without reducing yield.

In the conventional technique which aims at reducing the number of photomasks, electric characteristics is often sacrificed due to the priority of process simplification. In the embodiments of the invention disclosed in this specification, the number of manufacturing steps of a thin film transistor can be significantly reduced while electric characteristics of the thin film transistor are maintained.

Furthermore, by the aforementioned effects, manufacturing cost of a thin film transistor and a display device can be significantly reduced.

Even if a glass substrate containing an impurity metal element is used as the substrate, the impurity metal element can be prevented from attaching to and entering a semiconductor layer, so that degradation of electric characteristics (e.g., high off current) of the thin film transistor can be prevented. Accordingly, a thin film transistor having favorable electric characteristics can be manufactured. Further, variation in characteristics over the substrate of the thin film transistor to be manufactured can be decreased. Therefore, display unevenness of the display device can be reduced Furthermore, since a thin film transistor in which leakage current generated at an end portion of the gate electrode layer is low can be manufactured, a display device with a high contrast ratio and favorable display quality can be obtained.

BRIEF DESCRIPTION OF THE DRAWINGS

In the accompanying drawings:

FIGS. 42A to 42C illustrate an electronic device; and

DETAILED DESCRIPTION OF THE INVENTION

Figure 1A:
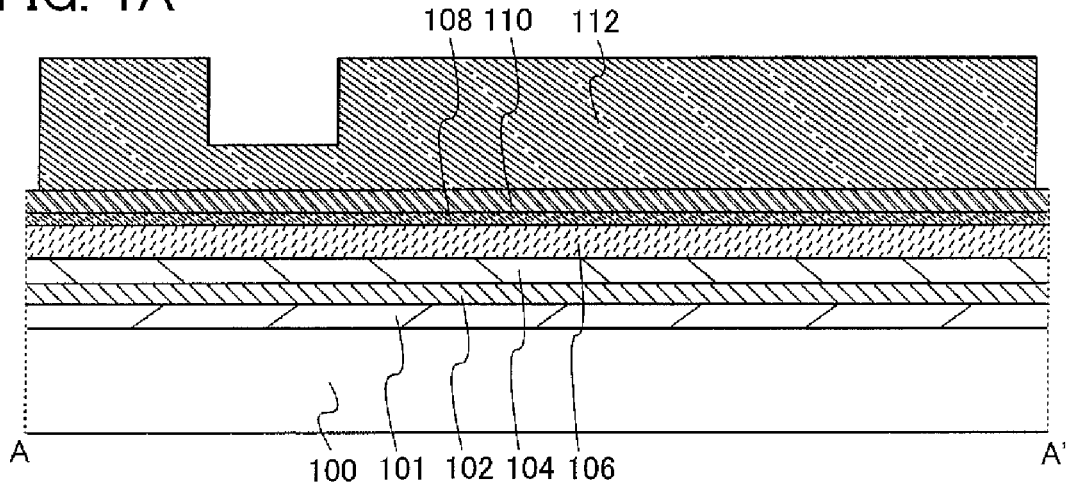
FIGS. 1A to 1C illustrate an example of a manufacturing method of a thin film transistor and a display device.
Figure 1B:
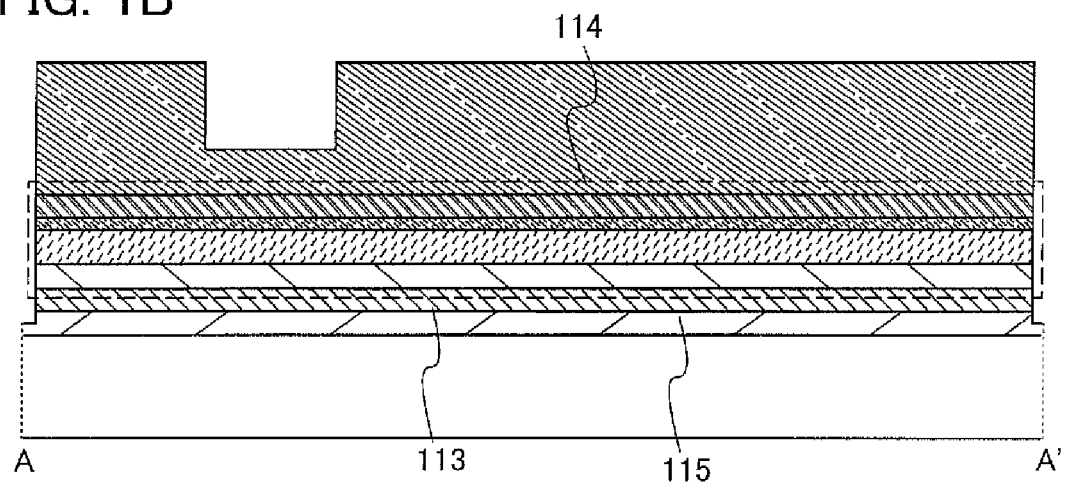

Embodiments of the invention will be described below with reference to the drawings. However, the invention disclosed in this specification is not limited to the following description. It is easily understood by those skilled in the art that the mode and details can be changed in various ways without departing from the scope and spirit of the invention. Thus, interpretation of the invention is not limited by the embodiment described below. Note that in description of structures of the invention with reference to the drawings, the same reference numerals are commonly used to denote the same components among different drawings. The same hatching pattern is applied to similar parts, and the similar parts are not especially denoted by reference numerals in some cases. In addition, a second insulating film and a third insulating film are not illustrated in the top views.

Embodiment 1

In Embodiment 1, an example of a manufacturing method of a thin film transistor and a manufacturing method of a display device in which the thin film transistors are arranged in matrix will be described with reference to FIG. 1A to FIG. 25B-2.

Figure 20:
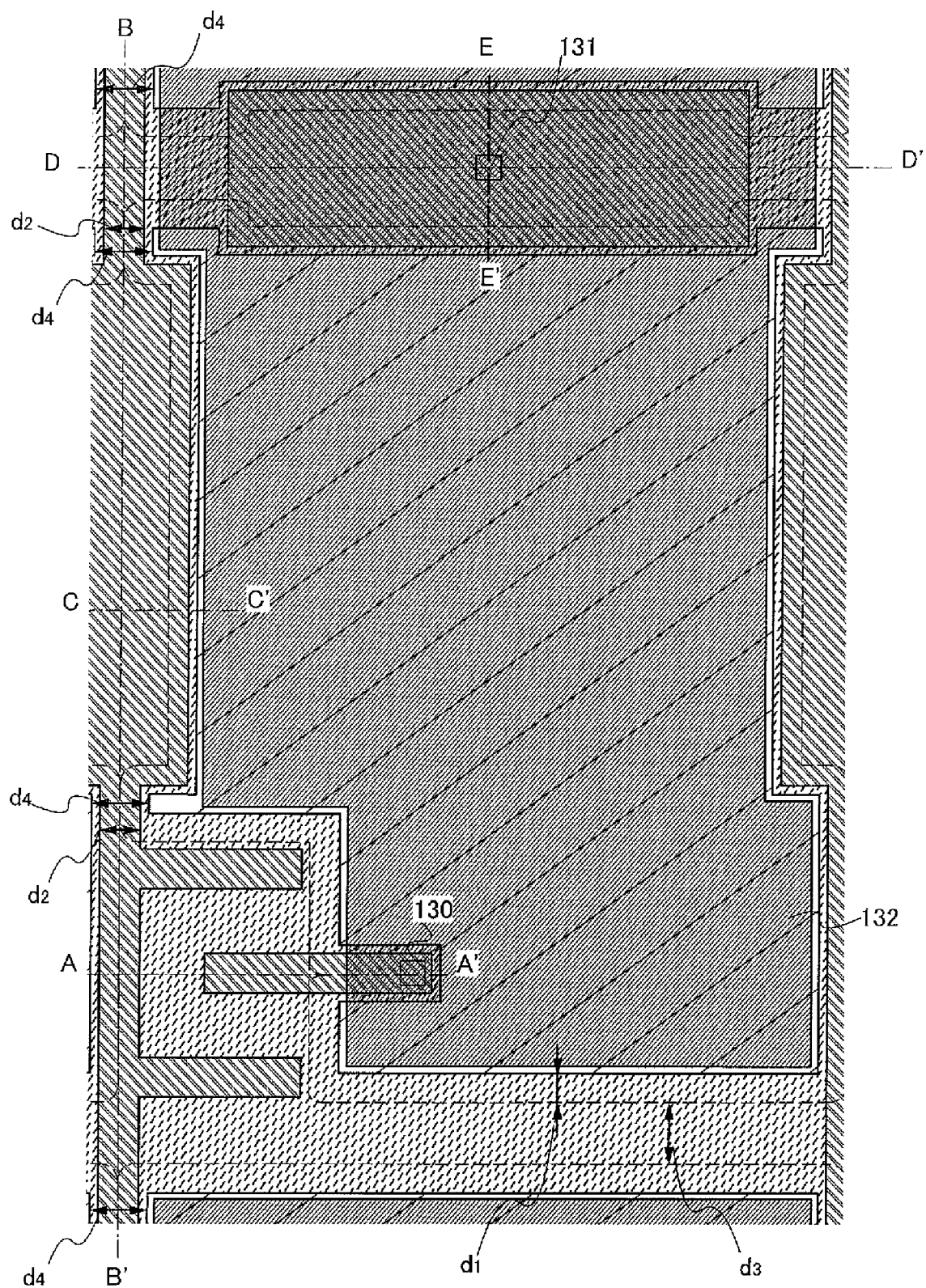
FIG. 20 illustrates an example of a manufacturing method of a thin film transistor and a display device.

FIG. 16 to FIG. 20 are top views of thin film transistors according to this embodiment. FIG. 20 is a completion drawing in the situation that formation of a pixel electrode is finished. FIG. 1A to FIG. 3C are cross-sectional views taken along the line A-A' in FIG. 16 to FIG. 20. FIG. 4A to FIG. 6C are cross-sectional views taken along the line B-B' in FIG. 16 to FIG. 20. FIG. 7A to 9C are cross-sectional views taken along the line C-C' in FIG. 16 to FIG. 20. FIG. 10A to FIG. 12C are cross-sectional views taken along the line D-D' in FIG. 16 to FIG. 20. FIG. 13A to FIG. 15C are cross-sectional views taken along the line E-E' in FIG. 16 to FIG. 20.

First, a first insulating film 101, a first conductive film 102, a second insulating film 104, a semiconductor film 106, an impurity semiconductor film 108, and a second conductive film 110 are formed over a substrate 100. These films may each have a single layer structure or a stacked structure including a plurality of films.

The substrate 100 is an insulating substrate. In the case of manufacturing a display device using the substrate 100, a glass substrate or a quartz substrate can be used as the substrate 100. In this embodiment, a glass substrate is used.

The first insulating film 101 is formed using an insulating material. For example, the first insulating film 101 can be formed using a silicon oxide film, a silicon nitride film, a silicon oxynitride film, a silicon nitride oxide film, or the like. Note that the material of the first insulating film 101 needs to have such heat resistance as to withstand a later step (e.g., formation of the second insulating film 104 and so on). In addition, a material which is not unintentionally etched or eroded in a later step (e.g., etching of the second conductive film 110 and so on) is selected as the material of the first insulating film 101.

In the case of using a glass substrate as the substrate 100, a silicon nitride film or a silicon nitride oxide film is preferably used as the first insulating film 101. This is because if the first insulating film 101 includes nitrogen, an impurity metal element in the glass substrate 100 can be effectively prevented from entering a semiconductor layer formed later. Further, the first insulating film 101 preferably includes a halogen (fluorine, chlorine, or bromine). If a halogen is included in the first insulating film 101, an impurity metal element in the glass substrate 100 can be effectively prevented from entering the semiconductor layer. In order that a halogen is included in the first insulating film 101, a gas used in formation of the first insulating film 101 is added with a halogen gas or a gas containing a halogen element.

Note that the first insulating film 101 can be formed by, for example, a CVD method (a thermal CVD method, a plasma CVD method, or the like), a sputtering method, or the like; however, the formation method of the first insulating film 101 is not limited to a particular method. In addition, the first insulating film 101 may be formed using a single layer structure or a stacked structure including a plurality of layers.

Note that the first insulating film 101 can also be referred to as a base film or a base insulating film.

The first conductive film 102 is formed using a conductive material. The first conductive film 102 can be formed using a conductive material such as a metal, e.g., titanium, molybdenum, chromium, tantalum, tungsten, aluminum, copper, neodymium, niobium, or scandium, or an alloy including any of these metals as a main component. Note that the material of the first conductive film 102 needs to be a material which has such heat resistance as to withstand a later step (e.g., formation of the second insulating film 104 and so on) and is not unintentionally etched or eroded in a later step (e.g., etching of the second conductive film 110 and so on). Only in these conditions, the material of the first conductive film 102 is not limited to a particular material.

In addition, the first conductive film 102 can be formed by, for example, a sputtering method, a CVD method (a thermal CVD method, a plasma CVD method, or the like), or the like. However, the formation method of the first conductive film 102 is not limited to a particular method.

The second insulating film 104 is formed using an insulating material. The second insulating film 104 can be formed using, for example, a silicon oxide film, a silicon nitride film, a silicon oxynitride film, a silicon nitride oxide film, or the like. Note that similar to the first conductive film 102, the material of the second insulating film 104 needs to be a material which has heat resistance and is not unintentionally etched or eroded in a later step. As long as these requirements are satisfied, the material of the second insulating film 104 is not limited to a particular material.

In addition, the second insulating film 104 can be formed by, for example, a CVD method (a thermal CVD method, a plasma CVD method, or the like), a sputtering method, or the like; however, the formation method of the second insulating film 104 is not limited to a particular method.

Note that the second insulating film 104 functions as a gate insulating film.

The semiconductor film 106 is formed using a semiconductor material. The semiconductor film 106 can be formed using, for example, amorphous silicon formed using a silane gas or the like. Note that similarly to the first conductive film 102 and the like, the material of the semiconductor film 106 needs to be a material which has heat resistance and is not unintentionally etched or eroded in a later step. As long as these requirements are satisfied, the material of the semiconductor film 106 is not limited to a particular material. Therefore, germanium or the like may be used. Note that the crystallinity of the semiconductor film 106 is not particularly limited as well.

In addition, the semiconductor film 106 can be formed by, for example, a CVD method (a thermal CVD method, a plasma CVD method, or the like), a sputtering method, or the like. However, the formation method of the semiconductor film 106 is not limited to a particular method.

The impurity semiconductor film 108 is a semiconductor film containing an impurity element imparting one conductivity type, and is formed using a gas for the formation of a semiconductor material to which the impurity element imparting one conductivity type is added or the like. For example, the impurity semiconductor film 108 is a silicon film containing phosphorus or boron, which is formed using a silane gas containing phosphine (chemical formula: $PH_3$) or diborane (chemical formula: $B_2H_6$). Note that similarly to the first conductive film 102 and the like, the material of the impurity semiconductor film 108 needs to be a material which has heat resistance and is not unintentionally etched or eroded in a later step. As long as these requirements are satisfied, the material of the impurity semiconductor film 108 is not limited to a particular material. Note that the crystallinity of the impurity semiconductor film 108 is not particularly limited as well.

In the case of manufacturing an n-channel thin film transistor, phosphorus, arsenic, or the like may be used as the impurity element imparting one conductivity type to be added. That is, a silane gas used for formation of the impurity semiconductor film 108 may contain phosphine, arsine (chemical formula: $AsH_3$), or the like at a predetermined concentration. On the contrary, in the case of manufacturing a p-channel thin film transistor, boron or the like may be added as the impurity element imparting one conductivity type. That is, a silane gas used for formation of the impurity semiconductor film 108 may contain diborane or the like at a predetermined concentration. In the case where a region capable of an ohmic contact with a source and drain electrode layer is provided in part of the semiconductor layer, which is formed using the semiconductor film 106, by doping or the like, the impurity semiconductor film 108 need not be provided.

In addition, the impurity semiconductor film 108 can be formed by, for example, a CVD method (a thermal CVD method, a plasma CVD method, or the like), or the like. However, the formation method of the impurity semiconductor film 108 is not limited to a particular method.

The second conductive film 110 is formed of a material which is conductive (e.g., the materials mentioned as the material of the first conductive film 102) but is different from the material used for the first conductive film 102. Here, the "different material" means a material having a different main component. Specifically, a material which is not easily etched by second etching which is described later is preferably selected. Further, similarly to the first conductive film 102 and the like, the material of the second conductive film 110 needs to be a material which has heat resistance and is not unintentionally etched or eroded in a later step. Accordingly, only in these conditions, the material of the second conductive film 110 is not limited to a particular material.

In addition, the second conductive film 110 can be formed by, for example, a sputtering method, a CVD method (a thermal CVD method, a plasma CVD method, or the like), or the like. However, the formation method of the second conductive film 110 is not limited to a particular method.

Note that the highest heat resistance is required for the first conductive film 102 among the first conductive film 102, the second insulating film 104, the semiconductor film 106, the impurity semiconductor film 108, and the second conductive film 110. Then, the required heat resistance is higher in the order of the second insulating film 104, the semiconductor film 106, the impurity semiconductor film 108, and the second conductive film 110. The heat resistance required for the second conductive film 110 is the lowest. For example, in the case where the semiconductor film 106 is an amorphous semiconductor film containing hydrogen, hydrogen in the semiconductor film 106 is removed at around or above 300° C., which results in the change in its electric characteristics t. Therefore, for example, a step after the formation of the semiconductor film 106 is preferably conducted at a temperature which does not exceed 300° C.

Next, a first resist mask 112 is formed over the second conductive film 110 (see FIG. 1A, FIG. 4A, FIG. 7A, FIG. 10A, and FIG. 13A). The first resist mask 112 is a resist mask having a recessed portion or a projected portion. In other words, the first resist mask 112 can also be referred to as a resist mask including a plurality of regions (here, two regions) having different thicknesses. In the first resist mask 112, the thick region is called a projected portion of the first resist mask 112 and the thin region is called a recessed portion of the first resist mask 112.

In the first resist mask 112, the projected portion is formed in a region where a source and drain electrode layer 120 is formed, and the recessed portion is formed in a region where a semiconductor layer is exposed and the source and drain electrode layer 120 is not formed.

The first resist mask 112 can be formed using a multi-tone mask. Here, multi-tone masks will be described with reference to FIGS. 25A-1 to 25B-2.

A multi-tone mask is a mask capable of light exposure with multi-level light intensity, typically, light exposure with three levels of light intensity to provide an exposed region, a half-exposed region, and an unexposed region. When using the multi-tone mask, one-time light exposure and development process allow a resist mask with plural thicknesses (typically, two levels of thicknesses) to be formed. Therefore, by the usage of a multi-tone mask, the number of photomasks can be reduced.

Figures 1, 25A:
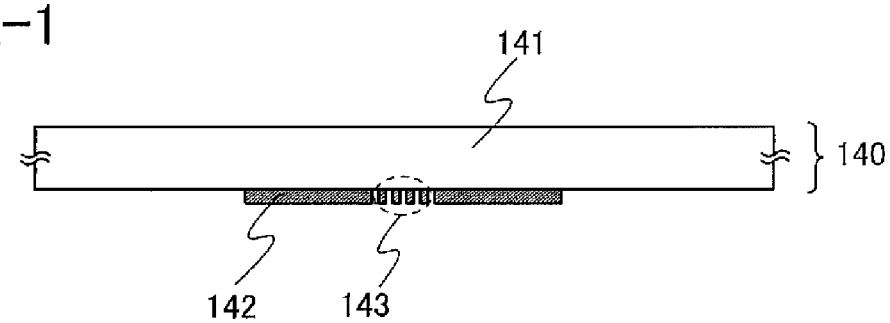
FIGS. 25A-1 and 25A-2 and FIGS. 25B-1 and 25B-2 each illustrate a multi-tone mask.
Figures 2, 25A:
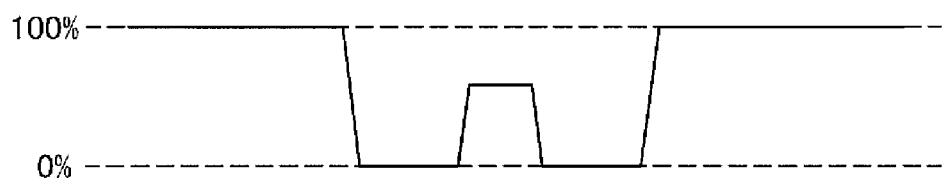
Figures 1, 25B:
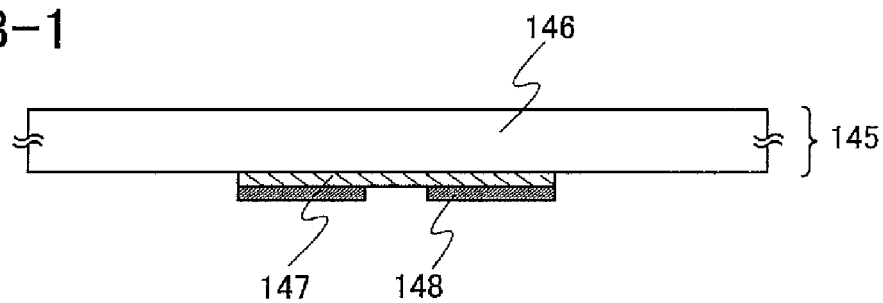
Figures 2, 25B:
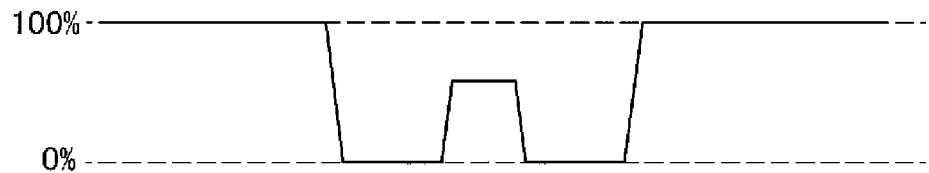

FIG. 25A-1 and FIG. 25B-1 are cross-sectional views of typical multi-tone masks. A gray-tone mask 140 is illustrated in FIG. 25A-1 and a half-tone mask 145 is illustrated in FIG. 25B-1.

The gray-tone mask 140 illustrated in FIG. 25A-1 includes a light-blocking portion 142 formed using a light-blocking film on a substrate 141 having a light-transmitting property, and a diffraction grating portion 143 provided with a pattern of the light-blocking film.

The diffraction grating portion 143 has slits, dots, mesh, or the like that are provided at an interval equal to or less than the resolution limit of light used for light exposure, whereby the amount of light transmitted through the diffraction grating portion 143 is controlled. Note that the slits, dots, or mesh provided at the diffraction grating portion 143 may be provided at regular or irregular intervals.

As the substrate 141 having a light-transmitting property, quartz or the like can be used. The light-blocking film for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 25A-2, the transmittance in the region overlapping with the light-blocking portion 142 is 0%, and the transmittance in the region where neither the light-blocking portion 142 nor the diffraction grating portion 143 is provided is 100%. Further, the transmittance at the diffraction grating portion 143 is basically in the range of 10% to 70%, which can be adjusted by the interval of slits, dots, mesh, or the like of the diffraction grating.

The half-tone mask 145 illustrated in FIG. 25B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film in a similar manner to the light-blocking film of the gray-tone mask and preferably provided using chromium, chromium oxide, or the like.

In the case where the half-tone mask 145 is irradiated with light for light exposure, as illustrated in FIG. 25B-2, the transmittance in the region overlapping with the light-blocking portion 148 is 0%, and the transmittance in the region where neither the light-blocking portion 148 nor the semi-light-transmitting portion 147 is provided is 100%. Further, the transmittance in the semi-light-transmitting portion 147 is basically in the range of 10% to 70%, which can be adjusted by the kind, the thickness, or the like of the material.

By light exposure using the multi-tone mask and development, a first resist mask 112 which includes regions having different thicknesses can be formed.

Note that the present embodiment is not limited to this, and the first resist mask may be formed without using a multi-tone mask. Further, as described above, the first resist mask may be a resist mask which has neither a recessed portion nor a projected portion.

Next, first etching is performed using the first resist mask 112. That is, the first conductive film 102, the second insulating film 104, the semiconductor film 106, the impurity semiconductor film 108, and the second conductive film 110 are patterned by etching to form a thin-film stack body 114 and an etched first conductive film 113 (see FIG. 1B, FIG. 4B, FIG. 7B, FIG. 10B, FIG. 13B, and FIG. 16). At this time, an upper portion of the first insulating film 101 is also etched to form an etched first insulating film 115. This etching step is called "first etching." As the first etching, dry etching or wet etching may be employed. It is preferable to employ a highly anisotropic etching method (physical etching). By using a highly anisotropic etching method as the first etching, the pattern processing accuracy can be improved. Note that the first etching can be performed in one step when dry etching is employed as the first etching, while the first etching may be performed in plural steps when wet etching is employed as the first etching. This is because in the wet etching, the etching rate varies depending on the kind of a film subjected to etching and thus, it is difficult to etch all films in one step. In this embodiment, when the first etching is performed in one step, dry etching is used; and when the first etching is performed in plural steps, dry etching is used at least for the etching of the first conductive film 102. In other words, it is preferable to process the first conducive film 102 by dry etching to form the etched first conductive film 113.

By the etched first insulating film 115 which serves as a base insulating film, unintentional etching of the substrate 100 can be prevented in the first etching. Therefore, an impurity metal element included in the substrate 100 can be prevented from attaching to and entering a semiconductor layer.

Note that as the first etching, dry etching may be performed in three stages, for example. First, etching is performed using a mixed gas of a $Cl_2$ gas, a $CF_4$ gas, and an $O_2$ gas. Then, etching is performed using only a $Cl_2$ gas, and lastly, etching is performed using only a $CHF_3$ gas.

Next, second etching is performed using the first resist mask 112. That is, the etched first conductive film 113 is further patterned by etching to form a gate electrode layer 116 (see FIG. 1C, FIG. 4C, FIG. 7C, FIG. 10C, FIG. 13C, and FIG. 17). This etching step is called "second etching."

Note that the gate electrode layer 116 forms a gate electrode of a thin film transistor, a gate wiring, one electrode of a capacitor, a capacitor wiring, and a supporting portion. When a gate electrode layer is referred to as a gate electrode layer 116A, the gate electrode layer forms a gate wiring and a gate electrode of a thin film transistor. When a gate electrode layer is referred to as a gate electrode layer 116B or a gate electrode layer 116D, the gate electrode layer forms a supporting portion. When a gate electrode layer is referred to as a gate electrode layer 116C, the gate electrode layer forms a capacitor wiring and one electrode of a capacitor. These gate electrode layers are collectively referred to as the gate electrode layer 116.

The second etching is performed under such etching conditions that a side surface of the gate electrode layer 116 formed from the first conductive film 102 is located inside a side surface of the thin-film stack body 114. In other words, the second etching is performed so that the side surface of the gate electrode layer 116 is in contact with a bottom surface of the thin-film stack body 114 (so that the width of the gate electrode layer 116 is narrower than that of the thin-film stack body 114 in the cross section along the lines A-A' of FIG. 16 to FIG. 20). Further, the second etching is performed under such conditions that the etching rate of the second conductive film 110 is low and the etching rate of the first conductive film 102 is high. In other words, the second etching is performed under the conditions that the etching selectivity of the first conductive film 102 with respect to the second conductive film 110 is high. By performing the second etching under such conditions, the gate electrode layer 116 can be formed.

Note that the shape of the side surface of the gate electrode layer 116 is not particularly limited. For example, the shape may be a tapered shape. The shape of the side surface of the gate electrode layer 116 is determined depending on the conditions such as a chemical used in the second etching.

Here, the phrase "the conditions that the etching rate of the second conductive film 110 is low and the etching rate of the first conductive film 102 is high" or "the conditions that the etching selectivity of the first conductive film 102 with respect to the second conductive film 110 is high" means conditions satisfying the following first requirement and second requirement.

The first requirement is that the gate electrode layer 116 is necessarily left in a prescribed place. The prescribed place for the gate electrode layer 116 is regions indicated by dotted lines in FIG. 17 to FIG. 20. That is, it is necessary that the gate electrode layer 116 is left so as to form a gate wiring, a capacitor wiring, and a supporting portion after the second etching. In order that the gate electrode layer forms the gate wiring and the capacitor wiring, the second etching needs to be performed so as not to disconnect these wirings. As illustrated in FIGS. 1A to 1C and FIG. 20, the side surface of the gate electrode layer 116 is preferably located inside the side surface of the thin-film stack body 114 with a distance $d_1$, and the distance $d_1$ may be set as appropriate by a practitioner according to the layout.

The second requirement is that a minimum width $d_3$ of the gate wiring or the capacitor wiring formed by the gate electrode layer 116 and a minimum width $d_2$ of a source wiring formed by a source and drain electrode layer 120A have appropriate values (see FIG. 20). This is because if the source and drain electrode layer 120A is unintentionally etched in the second etching, the minimum width $d_2$ of the source wiring is reduced, resulting in excessive increase in the current density of the source wiring and degradation of electric characteristics. Therefore, the second etching is performed under the conditions that the etching rate of the first conductive film 102 is not exclusively high and the etching rate of the second conductive film 110 is as low as possible.

It is difficult to enlarge the minimum width $d_2$ of the source wiring. This is because since the minimum width $d_2$ of the source wiring is determined by a minimum width $d_4$ of the semiconductor layer overlapping with the source wiring, enlargement of the minimum width $d_2$ of the source wiring larger requires the increase in the minimum width $d_4$ of the semiconductor layer, which provides difficulty in insulating the gate wiring and the capacitor wiring, which are adjacent to each other, from each other. Therefore, the minimum width $d_4$ of the semiconductor layer is set smaller than about twice the distance $d_1$. In other words, the distance $d_1$ is set larger than about half the minimum width $d_4$ of the semiconductor layer.

It is acceptable as long as there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring and a region adjacent to the capacitor wiring be the minimum width $d_4$ as illustrated in FIG. 20.

In addition, the width of the electrode in a portion connected to a pixel electrode layer, which is formed of the source and drain electrode layer, be equal to the minimum width $d_2$ of the source wiring.

As described above, the second etching under the condition in which side-etching can be performed is very important. This is because by the second etching in which the first conductive film 102 is side-etched, the gate wiring and capacitor wiring, which are adjacent to each other and are formed of the gate electrode layer 116, can be formed to be insulated from each other (see FIG. 17).

Here, since the second etching is etching in which side-etching is performed, the second etching proceeds in a substantially isotropic manner. When the first conductive film 102 is processed by the first etching to form the etched first conductive film 113 and the gate electrode layer 116 is formed by the second etching in the above-described manner, the distance $d_1$ can be made smaller than the thickness of the first conductive film 102. That is, the distance $d_1$ can be controlled independently of the thickness of the first conductive film 102, thereby increasing the freedom of layout design of a pixel structure.

Here, "side-etching" means etching in which a film is etched in not only a thickness direction of the film (a direction perpendicular to the substrate surface or a direction perpendicular to the surface of a base film) but also in a direction perpendicular to the thickness direction (a direction parallel to the substrate surface or a direction parallel to the surface of the base film). An end portion of the film subjected to side-etching can have various shapes depending on the etching rate of an etching gas or a chemical used for the etching of the film. The end portion of the film is, in many cases, formed with a curved surface.

Figure 17:
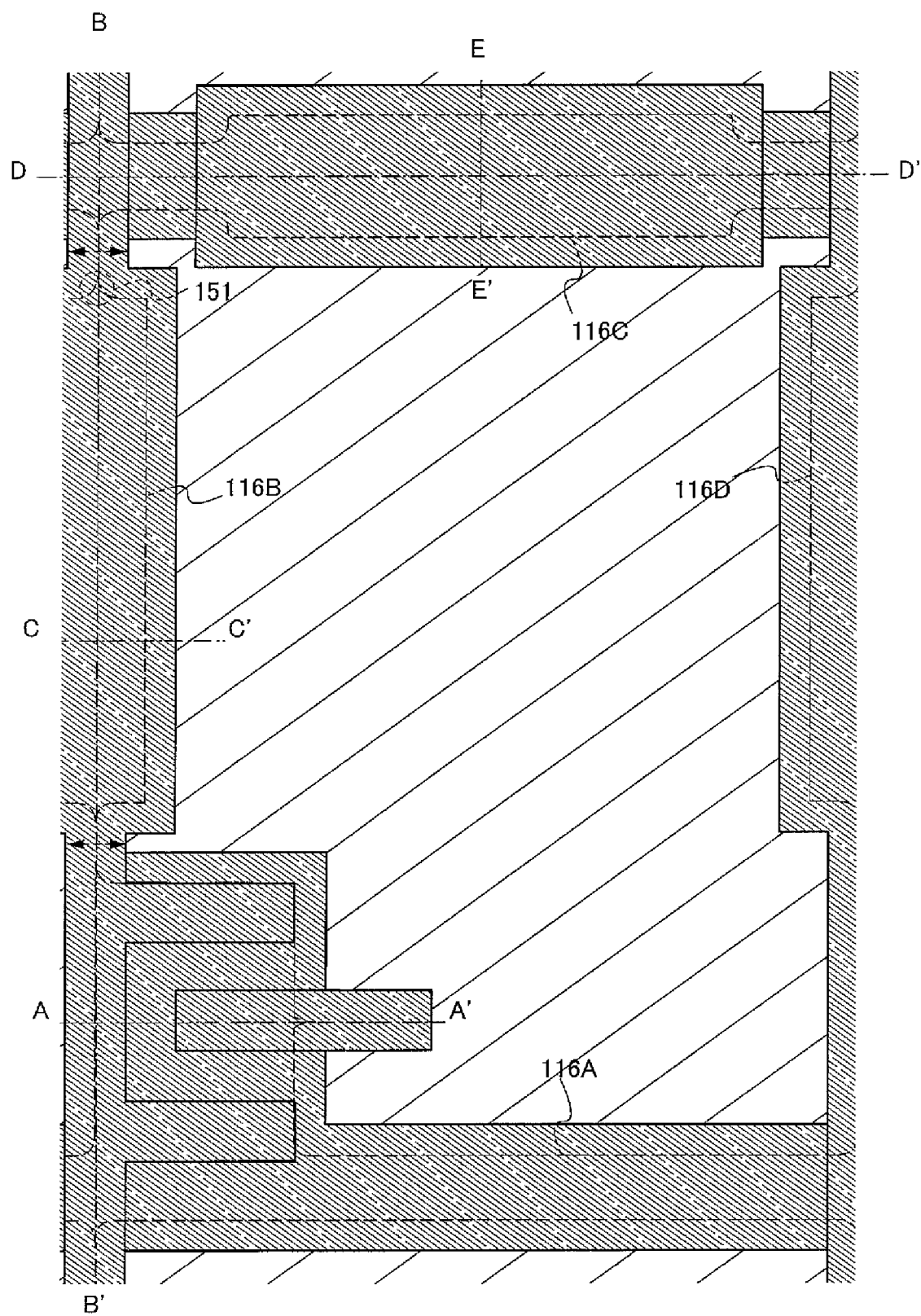
FIG. 17 illustrates an example of a manufacturing method of a thin film transistor and a display device.
Figure 18:
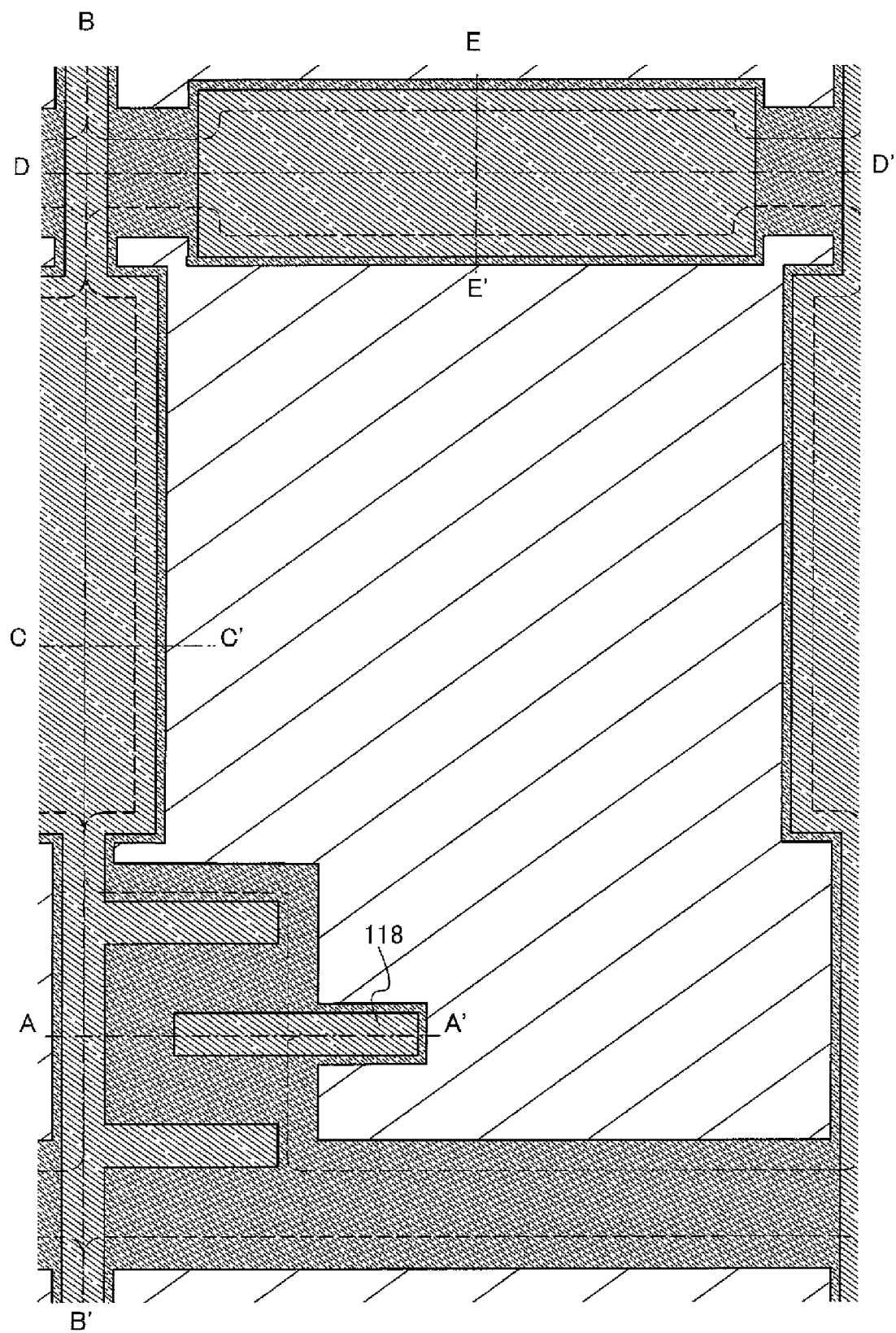
FIG. 18 illustrates an example of a manufacturing method of a thin film transistor and a display device.
Figure 19:
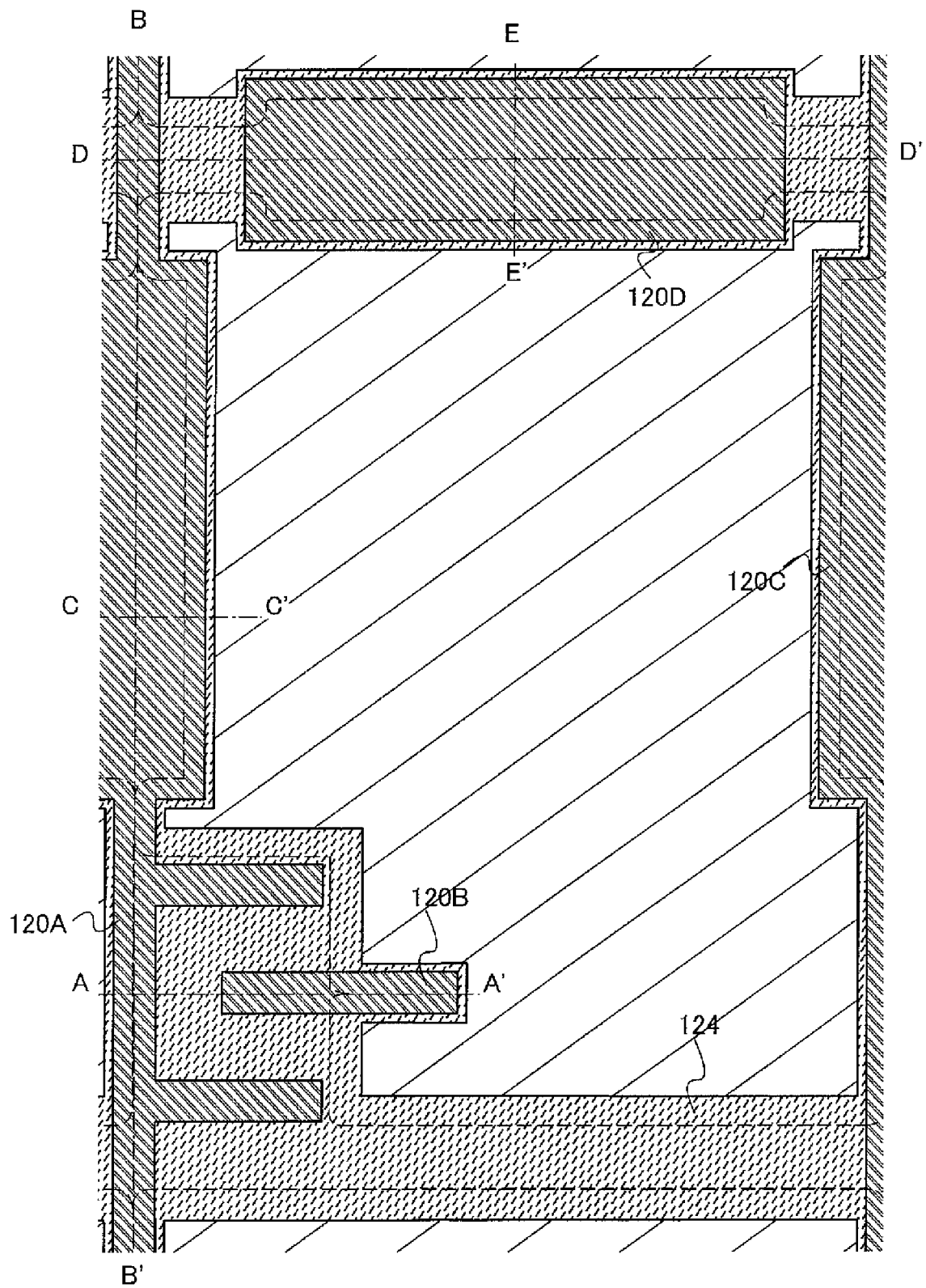
FIG. 19 illustrates an example of a manufacturing method of a thin film transistor and a display device.

As illustrated in FIG. 17, the thin-film stack body 114 formed by the first etching is designed to be narrow in a portion which is in contact with a supporting portion formed by the gate electrode layer 116B and the gate electrode layer 116D (see the portions indicated by the arrows in FIG. 17). With this structure, the gate electrode layer 116A and the gate electrode layer 116B or the gate electrode layer 116D can be disconnected to be insulated from each other by the second etching.

Figure 21:
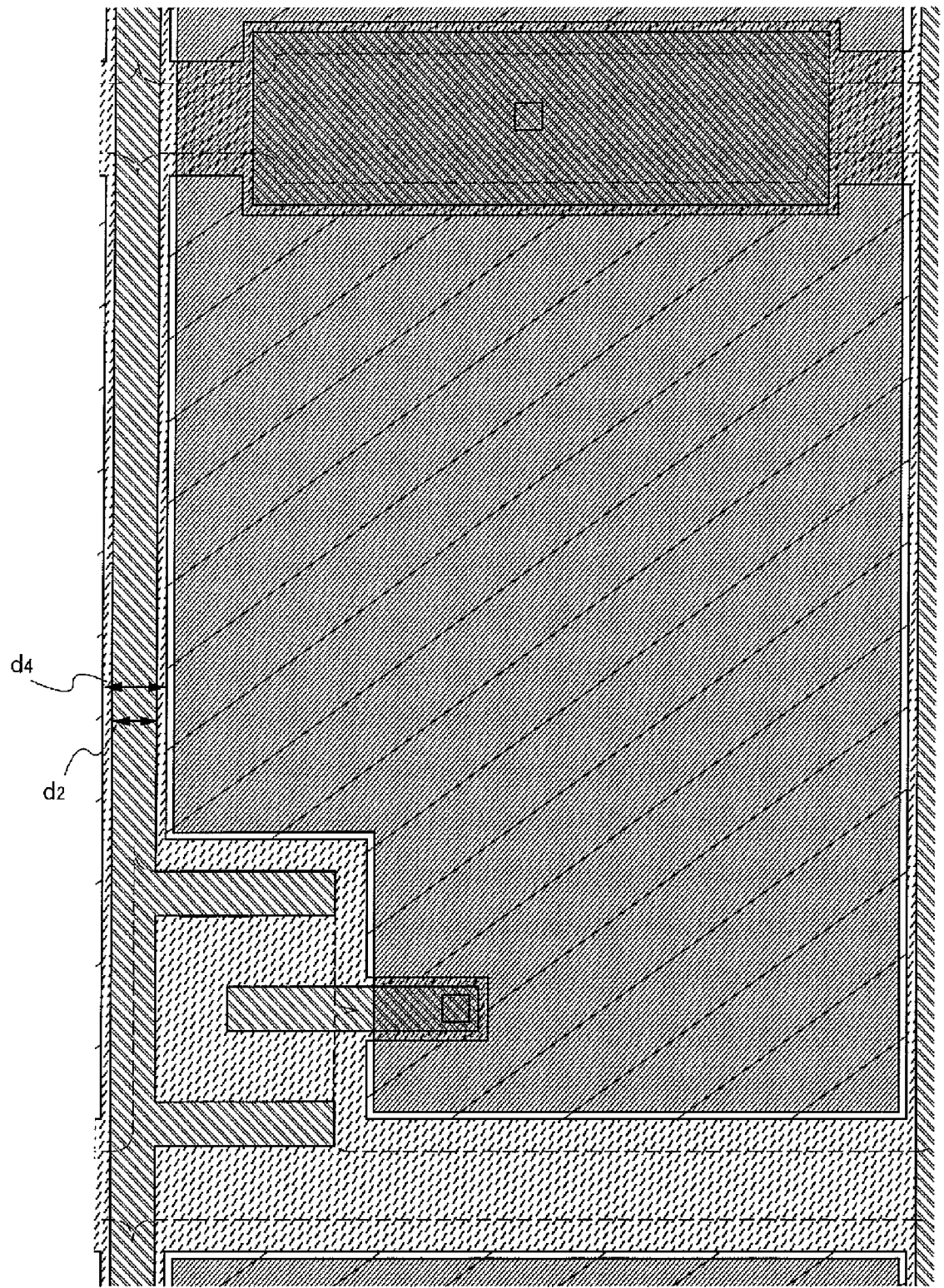
FIG. 21 illustrates an example of a manufacturing method of a thin film transistor and a display device.

The gate electrode layer 116B and the gate electrode layer 116D illustrated in FIG. 17 each serve as a supporting portion which supports the thin-film stack body 114. By the existence of the supporting portion, peeling of a film such as a gate insulating film formed over the gate electrode layer can be prevented. Further, by the existence of the supporting portion, a cavity region formed adjacent to the gate electrode layer 116 by the second etching can be prevented form being larger than necessary. Furthermore, it is preferable to provide the supporting portion because the thin-film stack body 114 can be prevented from being broken or damaged due to its own weight and, accordingly, yield is increased. However, the present embodiment is not limited to the mode with the supporting portion, and the supporting portion is not necessarily provided. An example of a top view of the mode without the supporting portion (corresponding to FIG. 20) is illustrated in FIG. 21.

As described above, the second etching is preferably performed by wet etching.

In the case where the second etching is performed by wet etching, aluminum or molybdenum may be deposited as the first conductive film 102, titanium or tungsten may be deposited as the second conductive film 110, and a chemical containing nitric acid, acetic acid, and phosphoric acid may be used for etching. Alternatively, molybdenum may be deposited as the first conductive film 102, titanium, aluminum, or tungsten may be deposited as the second conductive film 110, and a chemical containing an aqueous solution of hydrogen peroxide may be used for etching.

In the case where the second etching is performed by wet etching, it is most preferable that a stacked film in which molybdenum is deposited over aluminum to which neodymium is added be formed as the first conductive film 102, tungsten be deposited as the second conductive film 110, and a chemical containing nitric acid at 2%, acetic acid at 10%, and phosphoric acid at 72% be used for etching. By usage of a chemical having such a composition, the etched first conductive film 113 can be further etched without the second conductive film 110 being etched. Note that neodymium is added to the first conductive film 102 for the purpose of reducing electrical resistance of aluminum and preventing the formation of hillocks.

As illustrated in FIG. 17, the gate electrode layer 116 has a projection (e.g., a horn 151) when seen from the above. This is because the second etching for forming the gate electrode layer 116 proceeds almost isotropically so that the distance $d_1$ between the side surface of the gate electrode layer 116 and the side surface of the thin-film stack body 114 is almost uniform.

Next, the thickness of the first resist mask 112 is reduced. For example, the first resist mask 112 is thinned. Accordingly, the second conductive film 110 is exposed and a second resist mask 118 is formed. As means for forming the second resist mask 118 by reduction of the thickness of the first resist mask 112, for example, ashing using oxygen plasma can be given.

However, the means for forming the second resist mask 118 by the reduction of the thickness of the first resist mask 112 is not limited to this method. Note that the case where the second resist mask 118 is formed after the second etching is described here; however, the present embodiment is not limited to this case and the second etching may be performed after formation of the second resist mask 118.

Next, the second conductive film 110 in the thin-film stack body 114 is etched using the second resist mask 118, so that the source and drain electrode layer 120 is formed (see FIG. 2A, FIG. 5A, FIG. 8A, FIG. 11A, FIG. 14A, and FIG. 18). Here, as the etching conditions, the conditions by which the unintentional etching or erosion of the films other than the second conductive film 110 is negligible are selected. In particular, it is important that etching be performed under the conditions that the unintentional etching or erosion of gate electrode layer 116 can be neglected.

Note that the source and drain electrode layer 120 forms the source electrode and the drain electrode of a thin film transistor, the source wiring, the electrode which connects the thin film transistor and the pixel electrode to each other, and the other electrode of a capacitor. Here, the terms "a source and drain electrode layer 120A" and "a source and drain electrode layer 120C" each mean an electrode layer which has one of the source and drain electrodes of a thin film transistor and a source wiring. The term "a source and drain electrode layer 120B" means an electrode layer which has the other of the source electrode and the drain electrode of the thin film transistor and an electrode layer which connects the thin film transistor and the pixel electrode to each other. A term "a source and drain electrode layer 120B" means an electrode layer having the other electrode of the capacitor. These electrode layers are collectively referred to as the "source and drain electrode layer 120".

Note that for etching the second conductive film 110 in the thin-film stack body 114, either wet etching or dry etching may be performed.

Then, the impurity semiconductor film 108 and an upper portion of the semiconductor film 106 (back channel portion) in the thin-film stack body 114 are etched to form a source and drain region 122 (see FIG. 2B, FIG. 5B, FIG. 8B, FIG. 11B, FIG. 14B, and FIG. 19). Here, as the etching conditions, the conditions by which films other than the impurity semiconductor film 108 and the semiconductor film 106 are negligibly unintentionally etched or eroded are selected. In particular, it is important that etching be performed under the conditions that the unintentional etching or erosion of the gate electrode layer 116 is negligible.

Note that the etching of the impurity semiconductor film 108 and the upper portion of the semiconductor film 106 (back channel portion) in the thin-film stack body 114 can be performed by dry etching or wet etching.

Figure 2A:
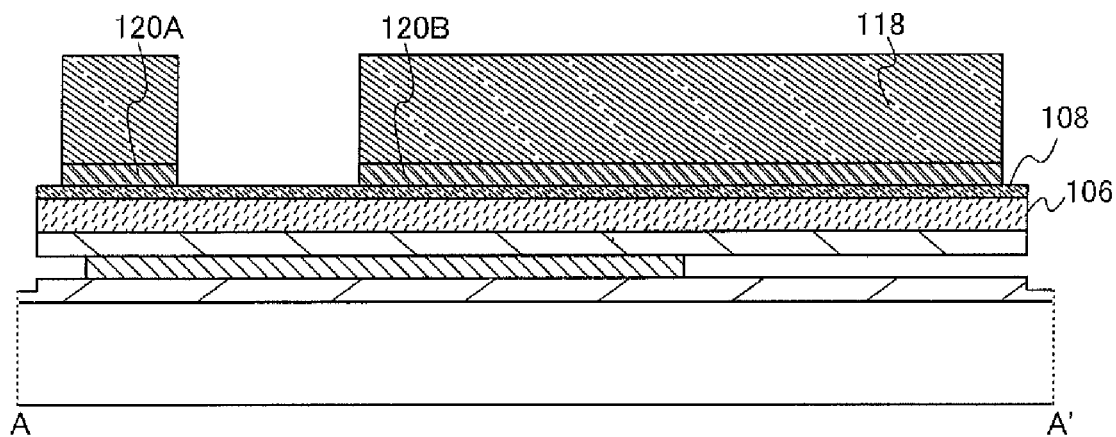
FIGS. 2A to 2C illustrate an example of a manufacturing method of a thin film transistor and a display device.
Figure 2B:
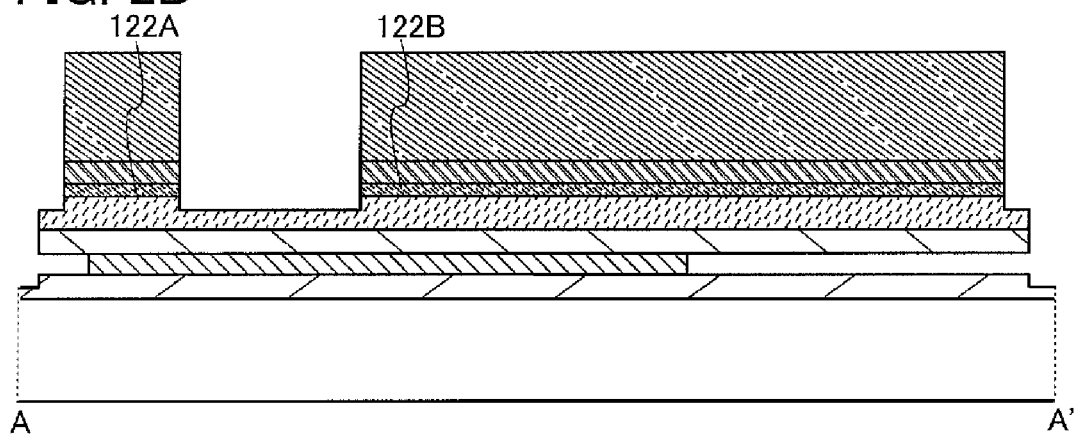
Figure 2C:
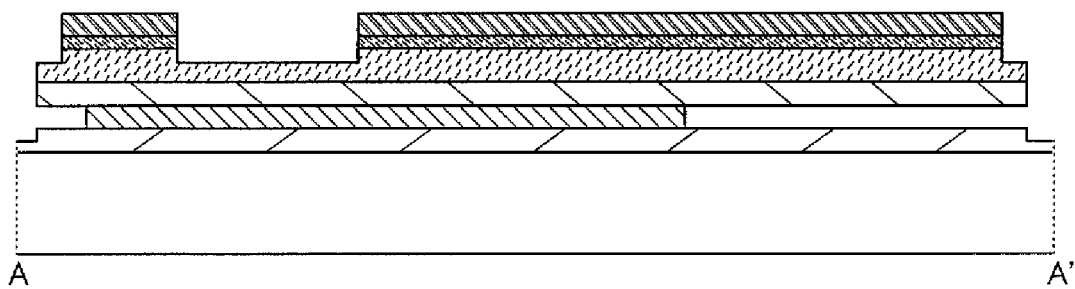

Then, the second resist mask 118 is removed (see FIG. 2C, FIG. 5C, FIG. 8C, FIG. 11C, and FIG. 14C); accordingly, a thin film transistor is completed (see FIG. 2C). As described above, the thin film transistor can be manufactured using one photomask (multi-tone mask).

Note that the steps described with reference to FIG. 2A and FIG. 2B are collectively referred to as "third etching." The third etching may be performed in plural steps as described above or may be performed in a single step.

A third insulating film is formed to cover the thin film transistor which is formed in the above-described manner. Although the third insulating film may be formed of only a first protective film 126, the third insulating film is preferably formed of the first protective film 126 and a second protective film 128 here (see FIG. 3A, FIG. 6A, FIG. 9A, FIG. 12A, and FIG. 15A). The first protective film 126 may be formed in a similar manner to the second insulating film 104.

The second protective film 128 is formed by a method by which the surface thereof becomes almost planar. This is because when the surface of the second protective film 128 is almost planar, disconnection or the like of a pixel electrode layer 132 formed over the second protective film 128 can be prevented. Accordingly, the phrase "almost planar" means planar in such an extent that the aforementioned aim can be achieved, and does not mean that high planarity is required.

The second protective film 128 can be formed, for example, by a spin coating method or the like using photosensitive polyimide, acrylic, epoxy resin, or the like. Note that the material and the formation method of the second protective film 128 are not limited to the above-described materials and formation method.

Next, a first opening portion 130 and a second opening portion 131 are formed in the third insulating film (see FIG. 3B, FIG. 6B, FIG. 9B, FIG. 12B, and FIG. 15B). The first opening portion 130 and the second opening portion 131 are formed so as to reach at least the surface of the source and drain electrode layer 120. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using photolithography.

Note that in the case of forming the opening portions by photolithography, one photomask is used.

Next, the pixel electrode layer 132 is formed over the third insulating film (see FIG. 3C, FIG. 6C, FIG. 9C, FIG. 12C, FIG. 15C, and FIG. 20). The pixel electrode layer 132 is formed so as to be connected to the source and drain electrode layer 120 through the opening portions. Specifically, the pixel electrode layer 132 is formed so as to be connected to the source and drain electrode layer 120B through the first opening portion 130 and connected to the source and drain electrode layer 120D through the second opening portion 131. The pixel electrode layer 132 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the formation method is not limited to a particular method. In addition, the pixel electrode layer 132 may have a single layer structure or a stacked structure including a plurality of films.

In this embodiment, only the pixel electrode layer 132 is formed using the conductive material having a light-transmitting property; however, the present embodiment is not limited to this structure. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate according to this embodiment (so-called array process) is completed. As described in this embodiment, the thin film transistor can be manufactured using one photomask in such a manner that the gate electrode layer is formed utilizing side-etching and, further, the source and drain electrode layer is formed using a multi-tone mask.

Figure 3A:
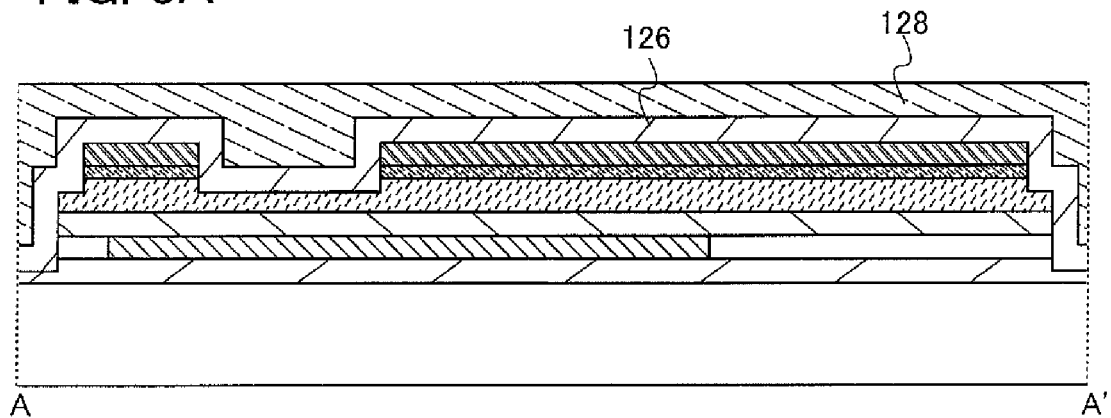
FIGS. 3A to 3C illustrate an example of a manufacturing method of a thin film transistor and a display device.
Figure 3B:
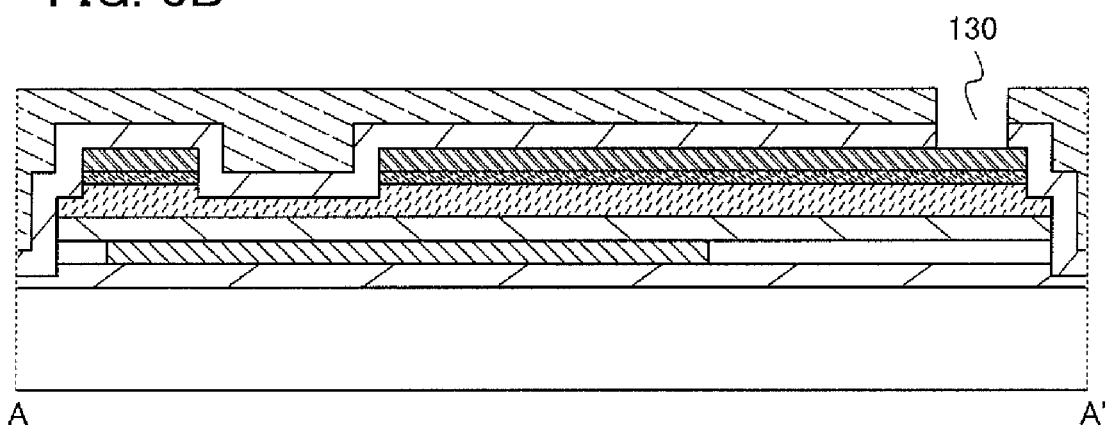
Figure 3C:
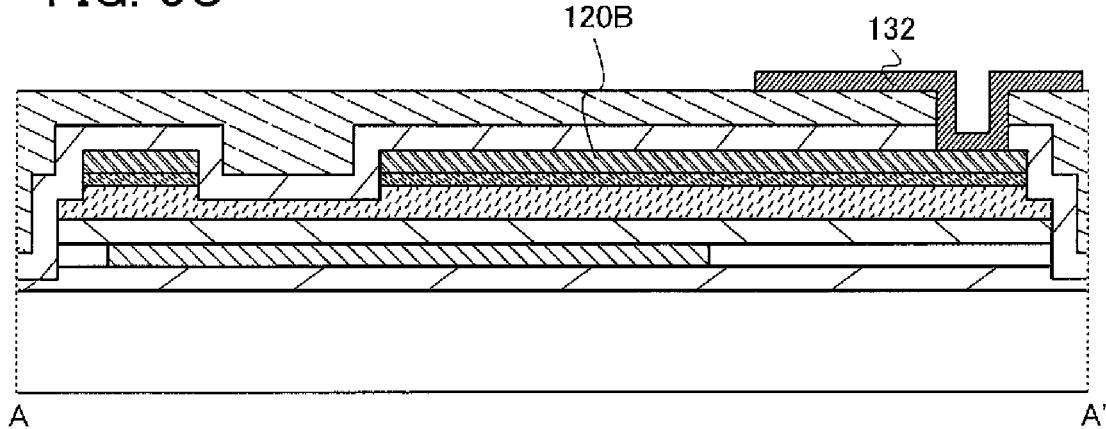
Figure 4A:
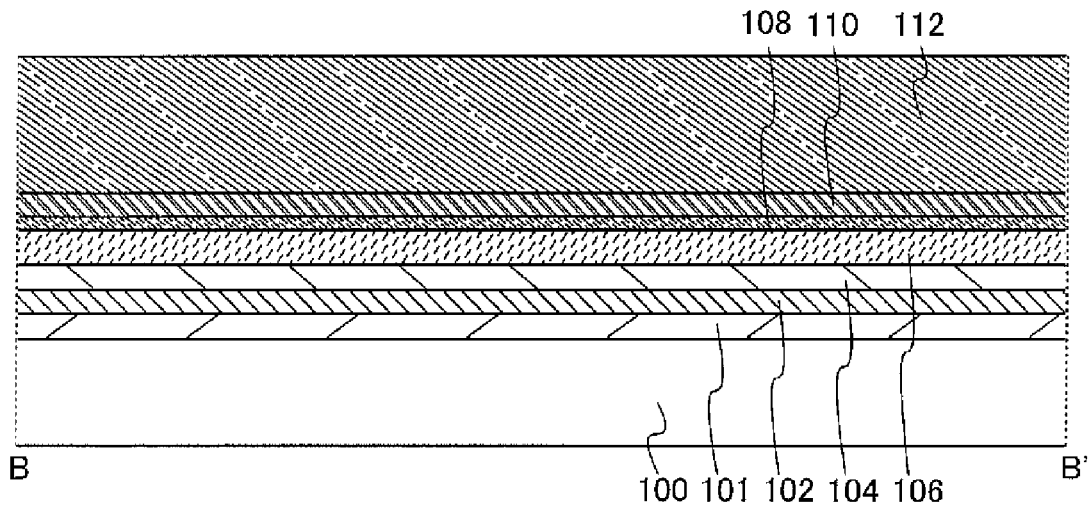
FIGS. 4A to 4C illustrate an example of a manufacturing method of a thin film transistor and a display device.
Figure 4B:
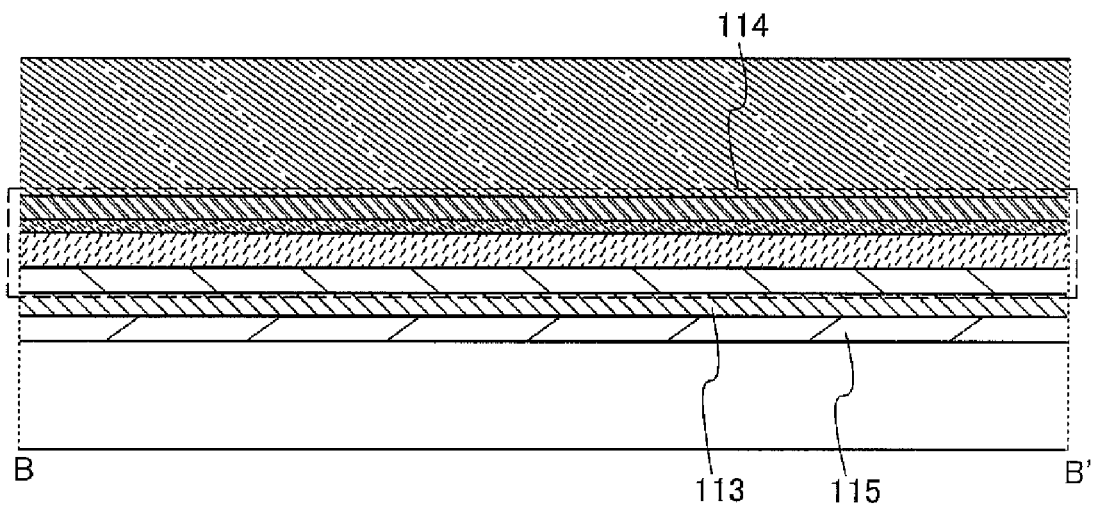
Figure 4C:
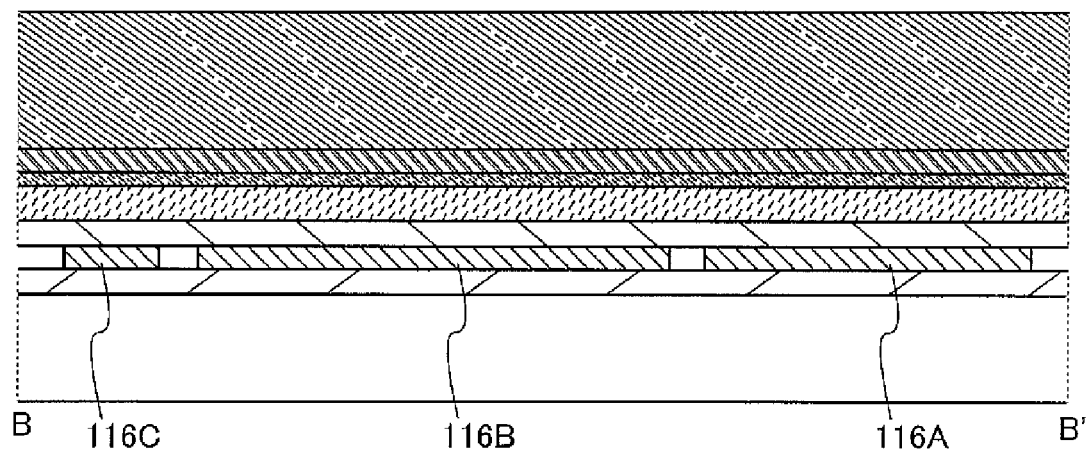
Figure 5A:
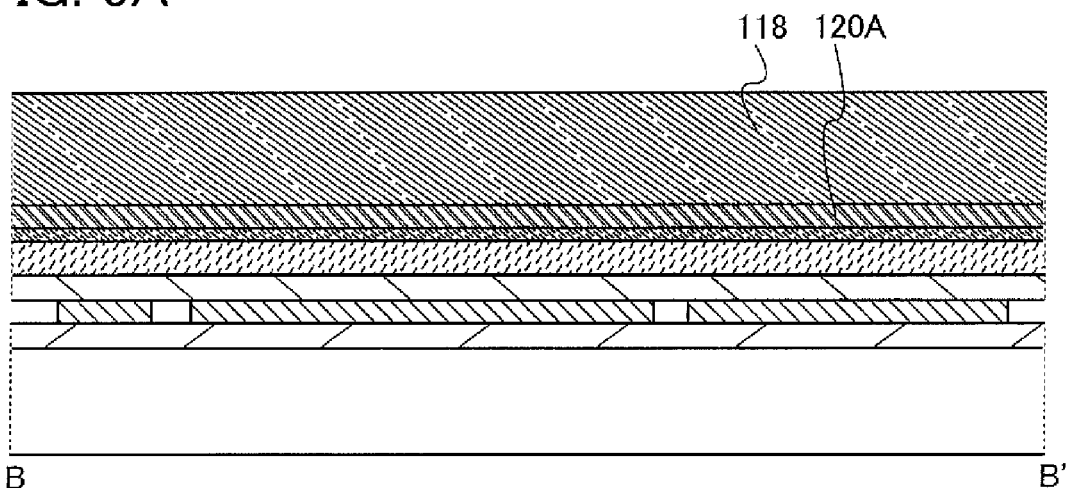
FIGS. 5A to 5C illustrate an example of a manufacturing method of a thin film transistor and a display device.
Figure 5B:
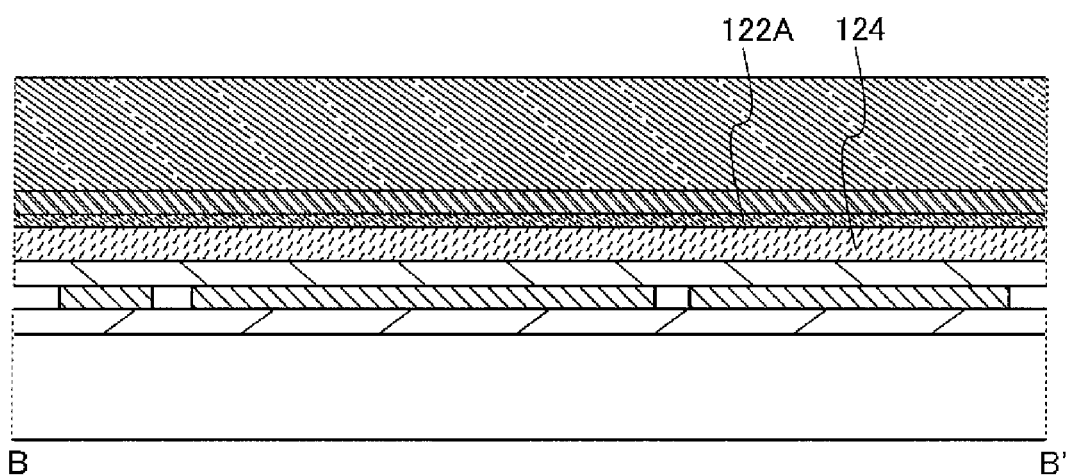
Figure 5C:
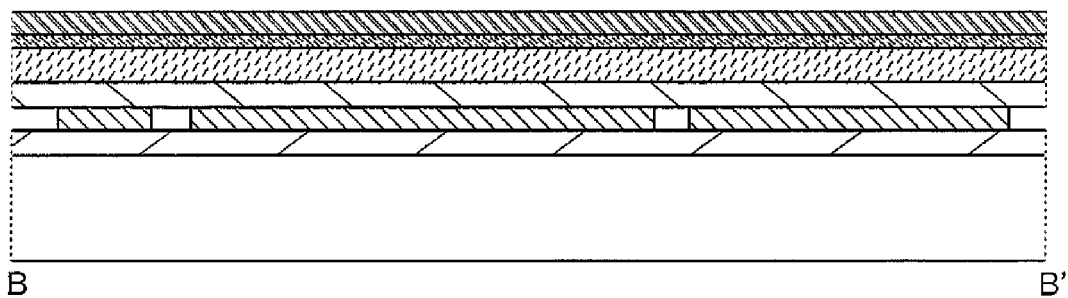
Figure 6A:
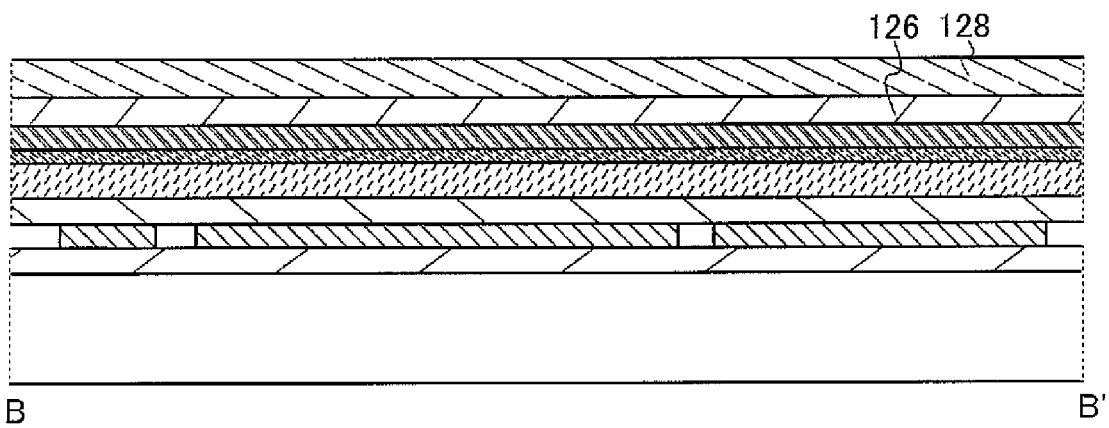
FIGS. 6A to 6C illustrate an example of a manufacturing method of a thin film transistor and a display device.
Figure 6B:
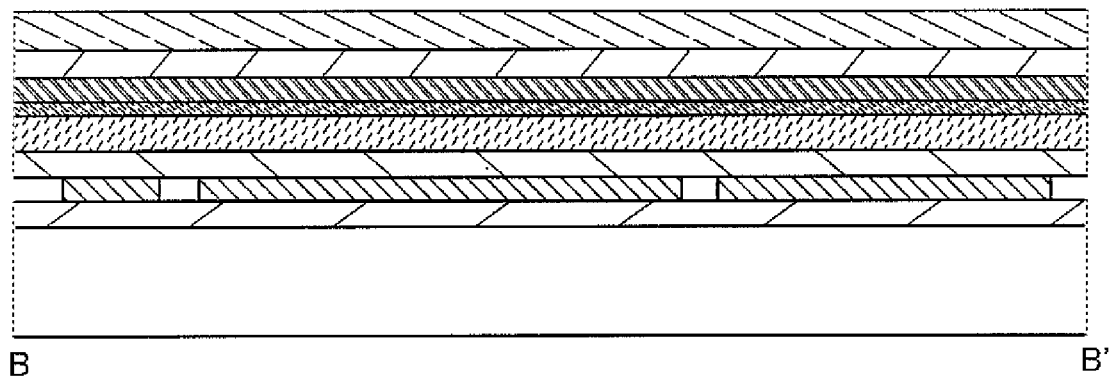
Figure 6C:
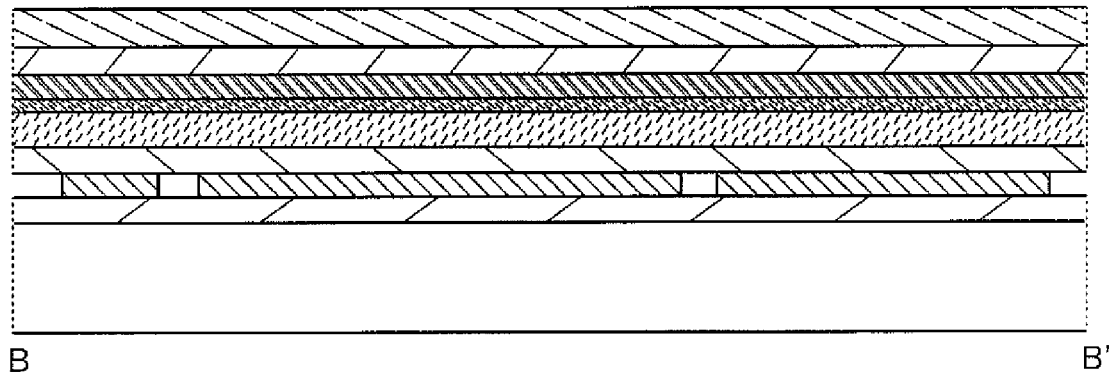
Figure 7A:
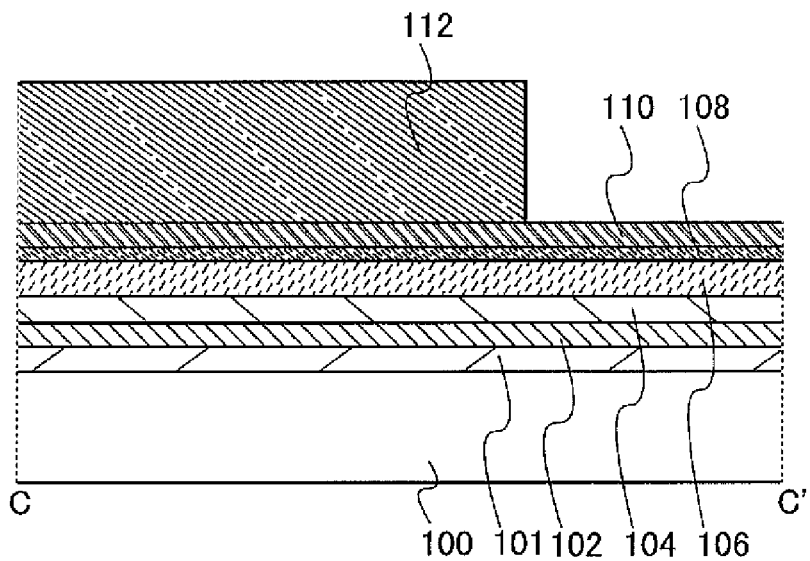
FIGS. 7A to 7C illustrate an example of a manufacturing method of a thin film transistor and a display device.
Figure 7B:
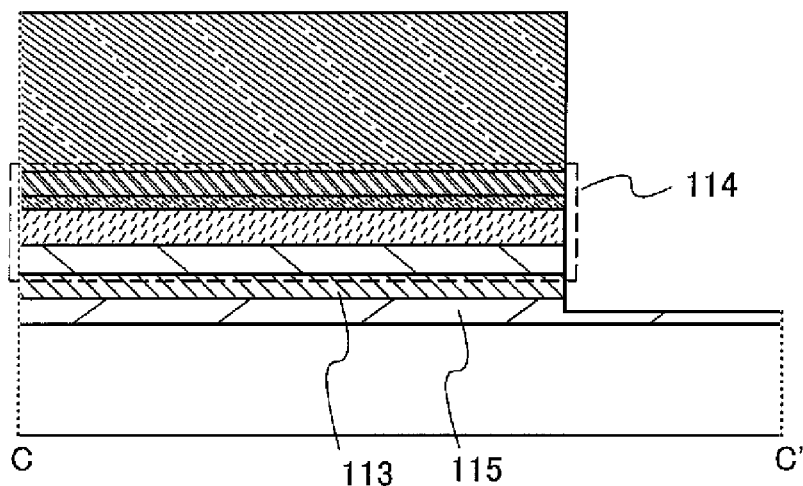
Figure 7C:
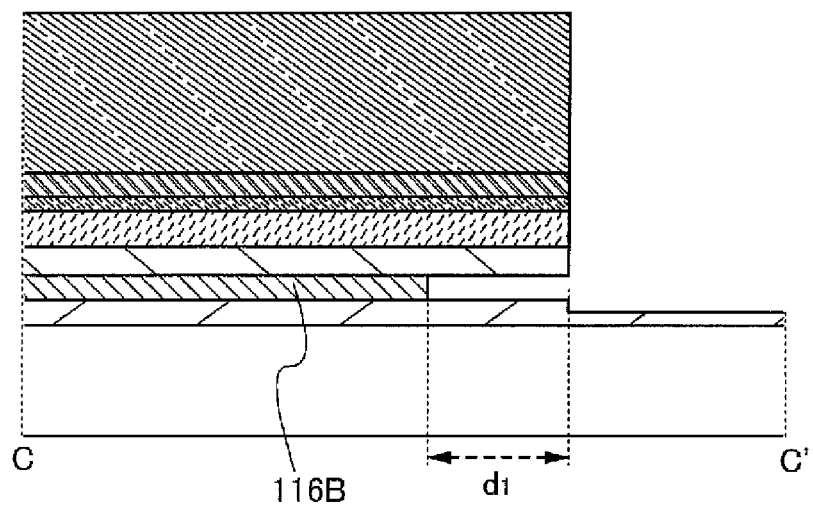
Figure 8A:
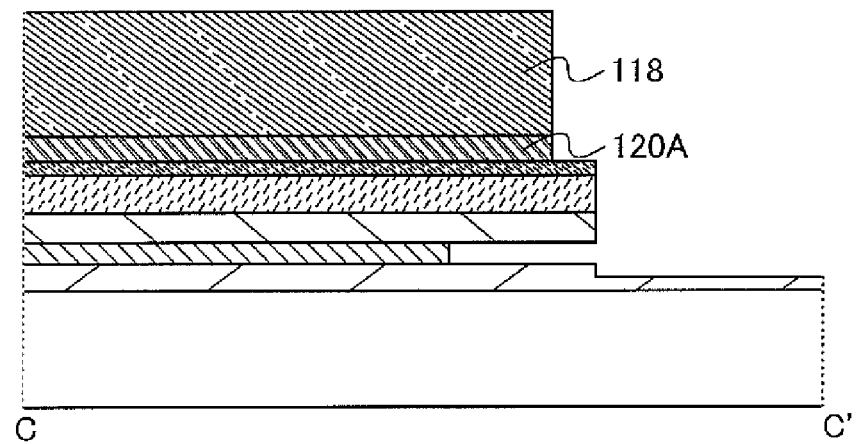
FIGS. 8A to 8C illustrate an example of a manufacturing method of a thin film transistor and a display device.
Figure 8B:
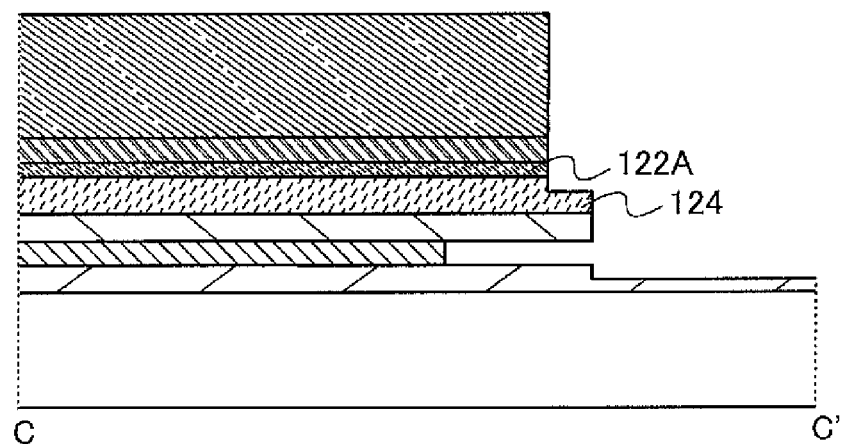
Figure 8C:
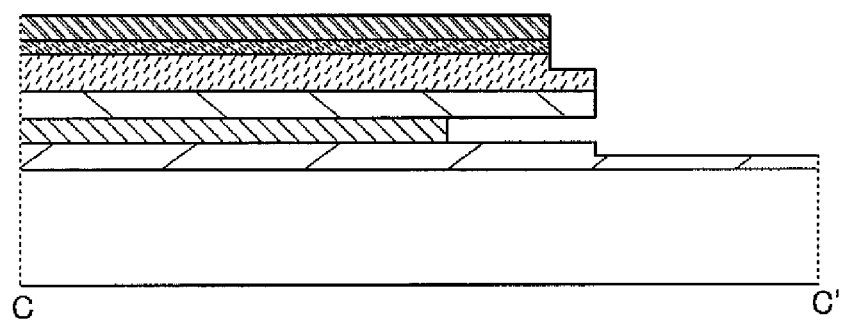
Figure 9A:
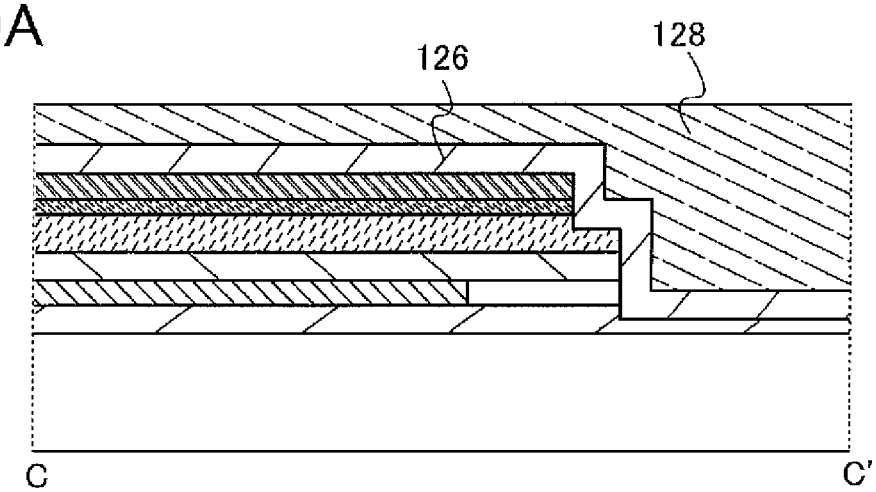
FIGS. 9A to 9C illustrate an example of a manufacturing method of a thin film transistor and a display device.
Figure 9B:
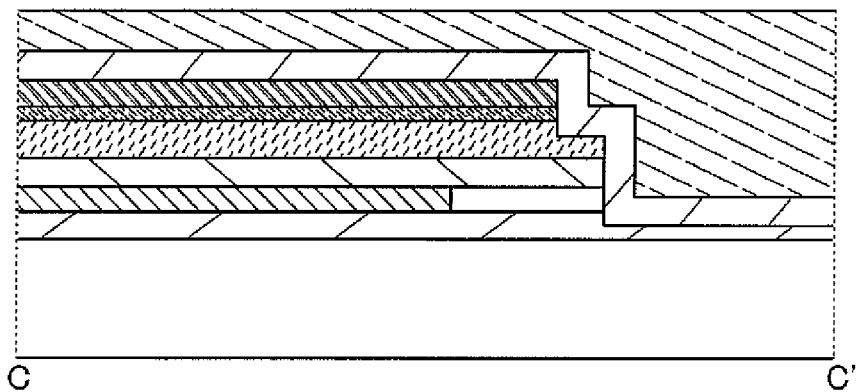
Figure 9C:
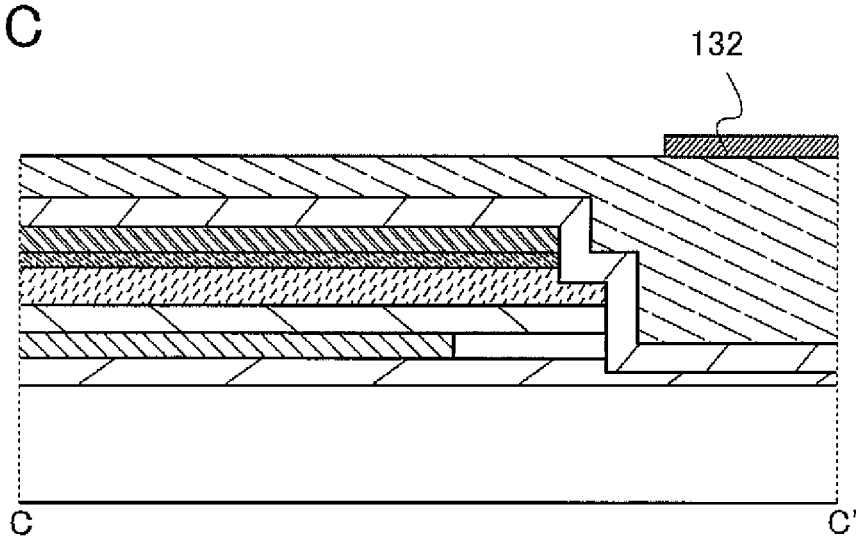
Figure 10A:
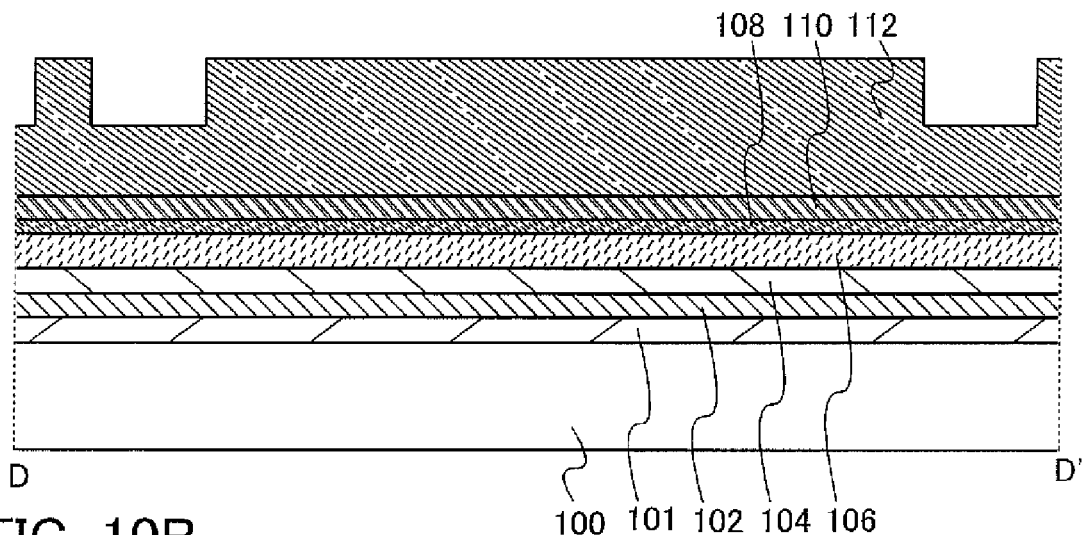
FIGS. 10A to 10C illustrate an example of a manufacturing method of a thin film transistor and a display device.
Figure 10B:
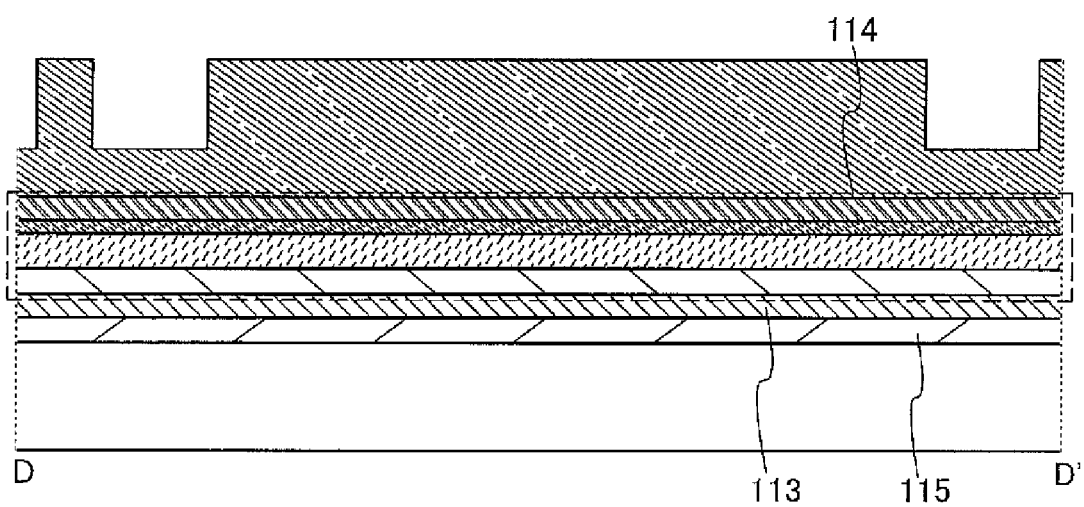
Figure 10C:
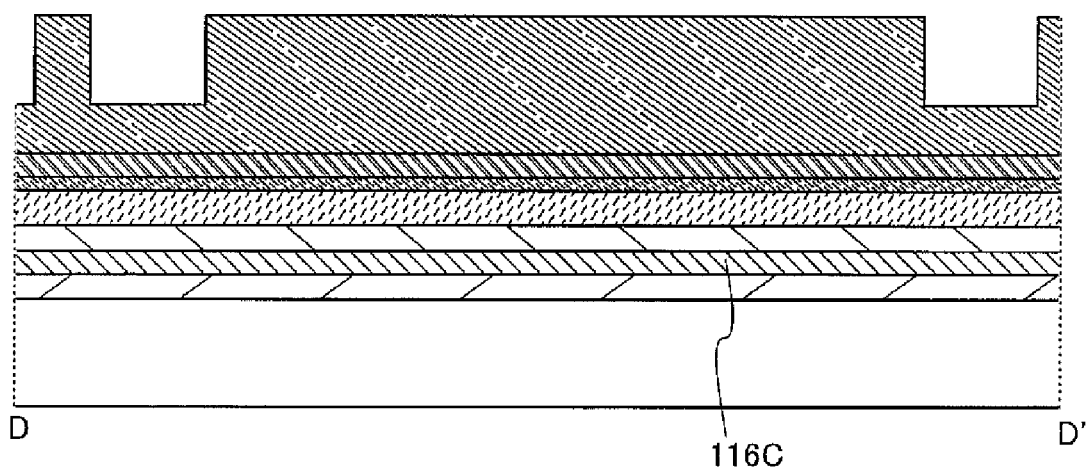
Figure 11A:
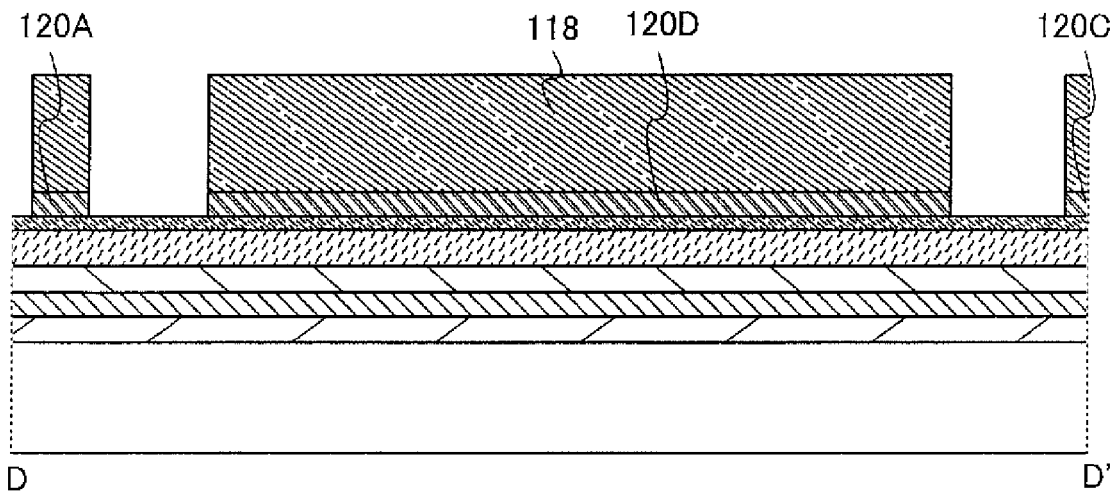
FIGS. 11A to 11C illustrate an example of a manufacturing method of a thin film transistor and a display device.
Figure 11B:
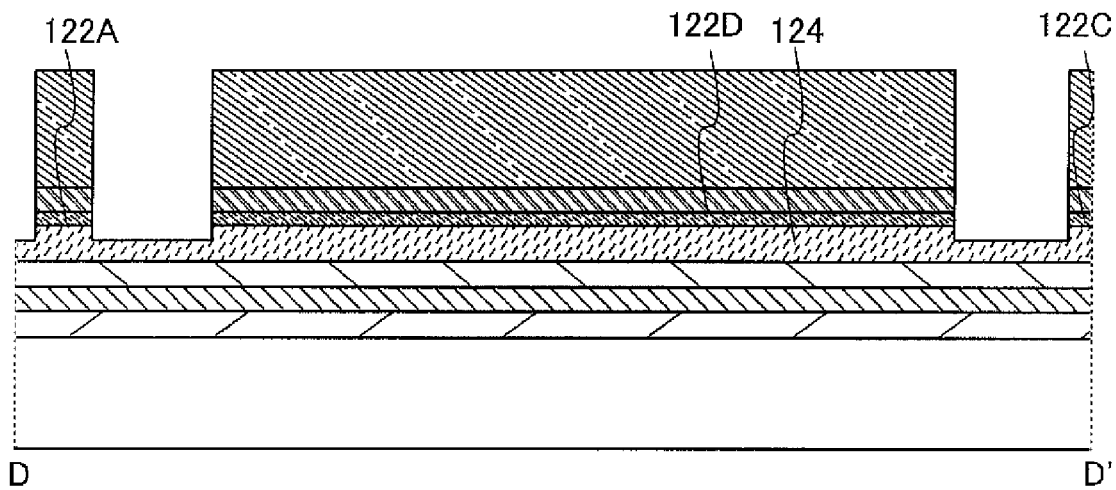
Figure 11C:
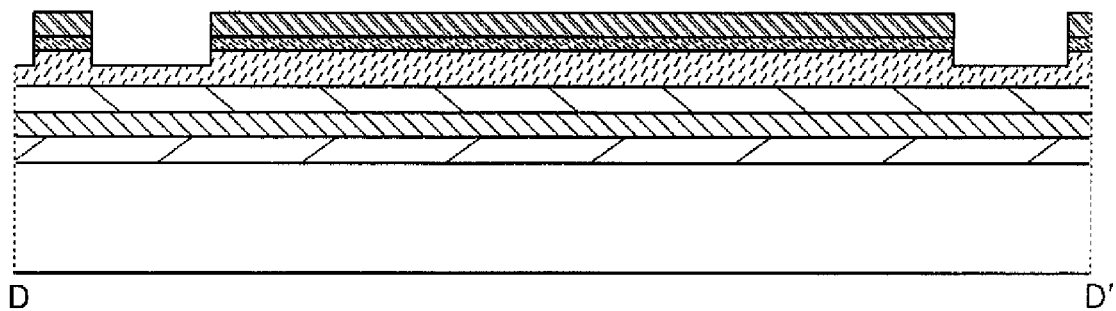
Figure 12A:
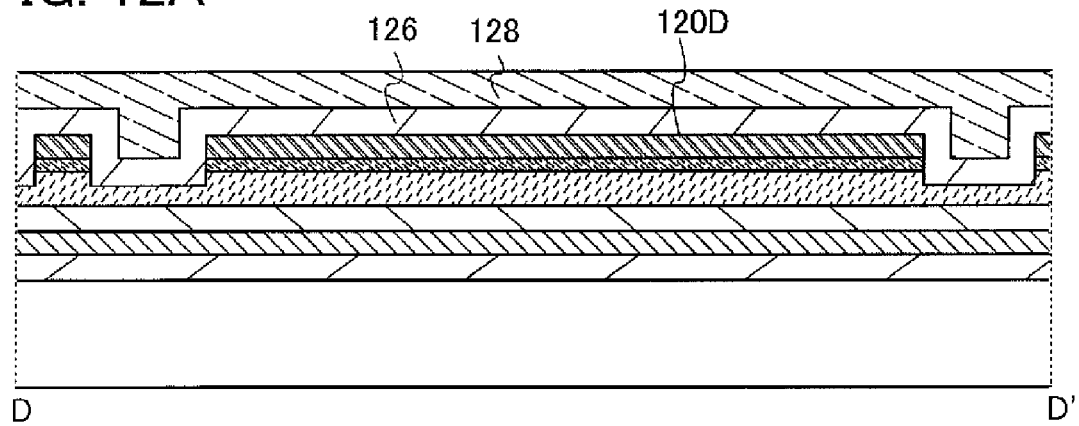
FIGS. 12A to 12C illustrate an example of a manufacturing method of a thin film transistor and a display device.
Figure 12B:
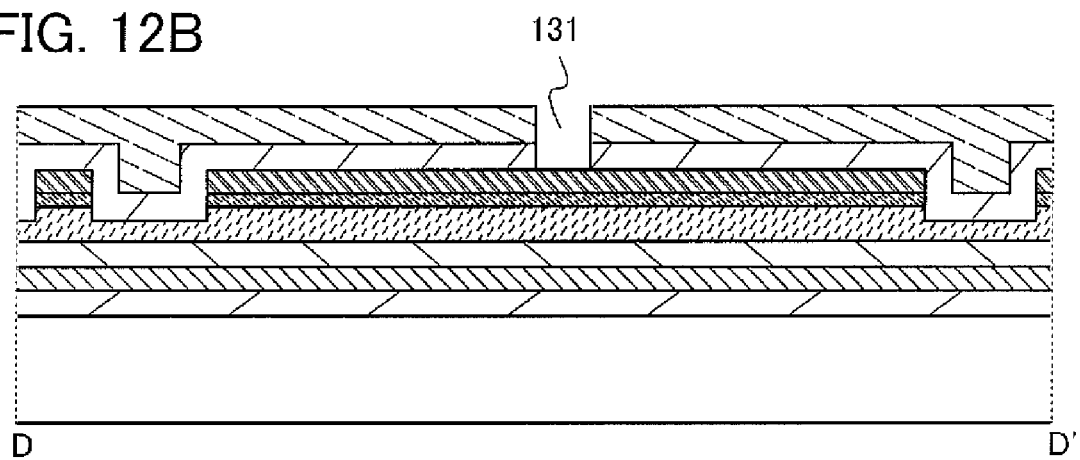
Figure 12C:
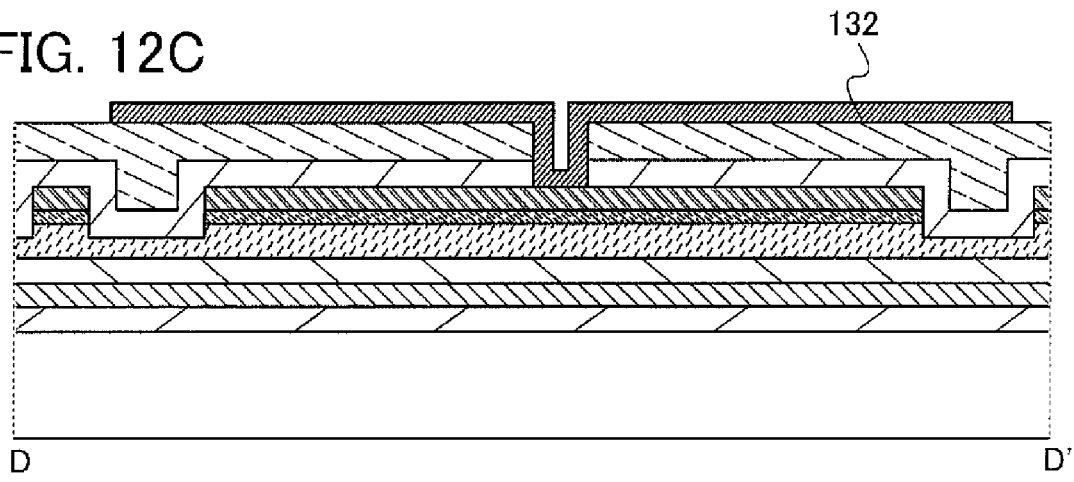
Figure 13A:
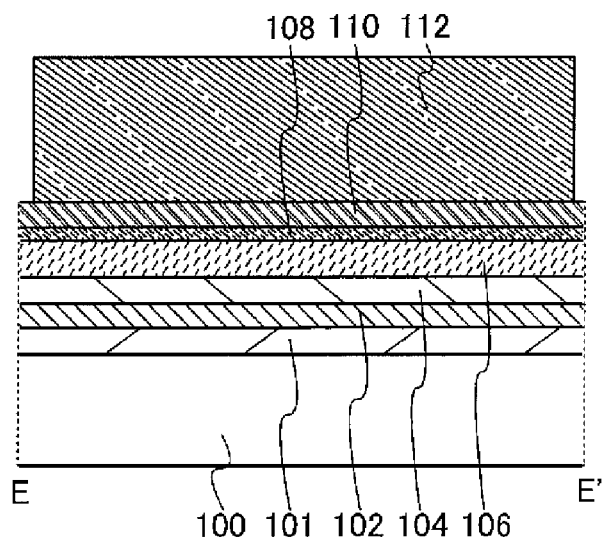
FIGS. 13A to 13C illustrate an example of a manufacturing method of a thin film transistor and a display device.
Figure 13B:
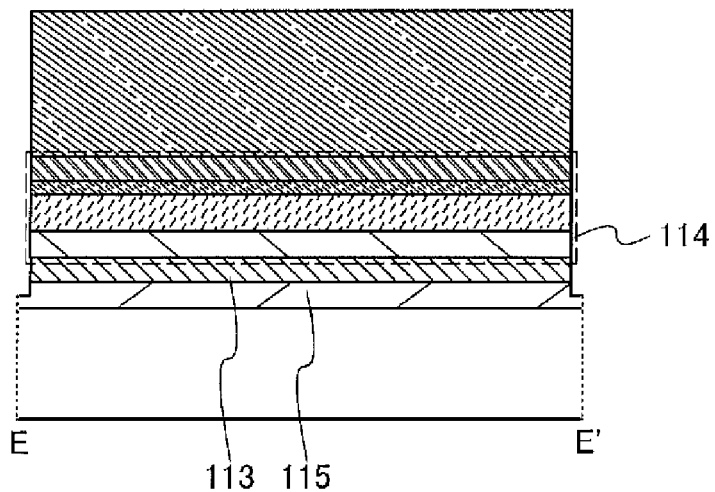
Figure 13C:
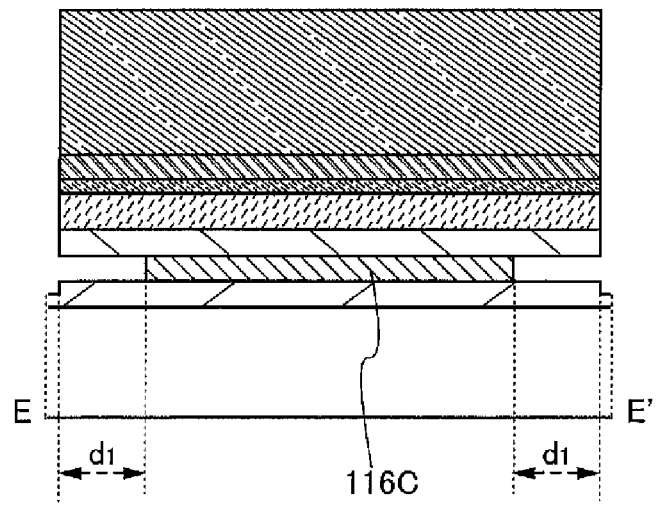
Figure 14A:
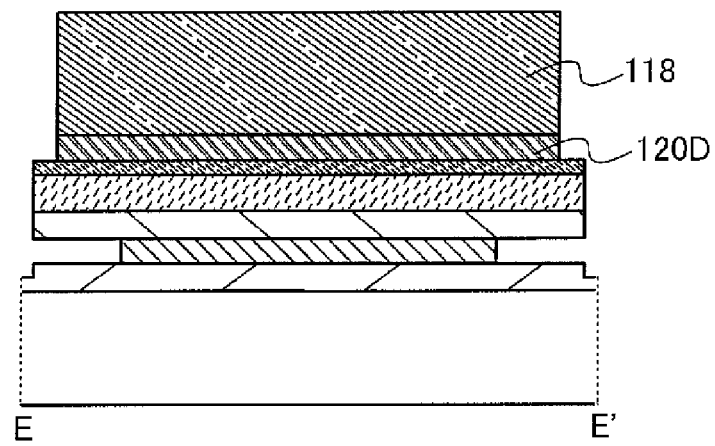
FIGS. 14A to 14C illustrate an example of a manufacturing method of a thin film transistor and a display device.
Figure 14B:
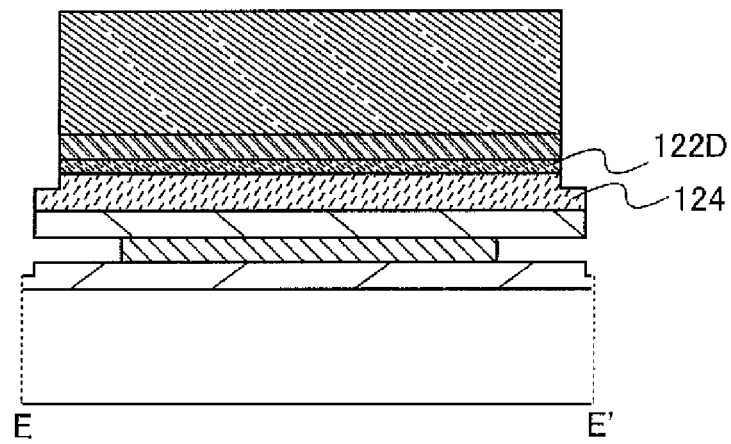
Figure 14C:
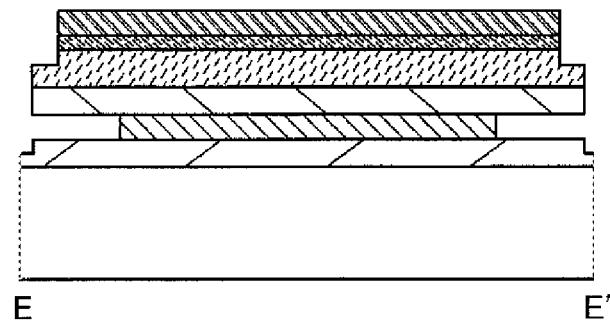
Figure 15A:
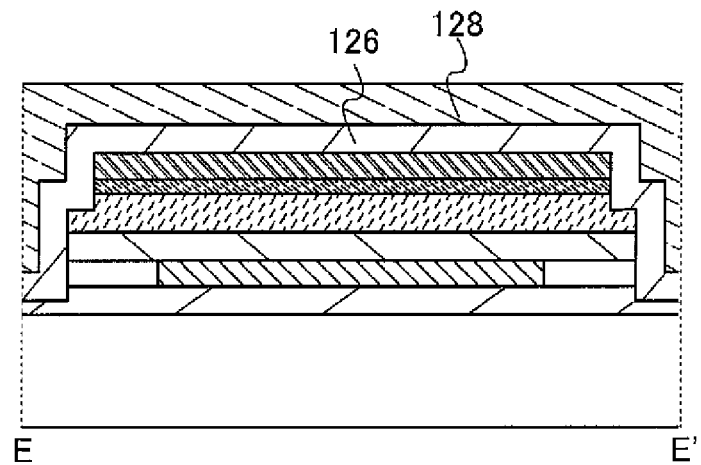
FIGS. 15A to 15C illustrate an example of a manufacturing method of a thin film transistor and a display device.
Figure 15B:
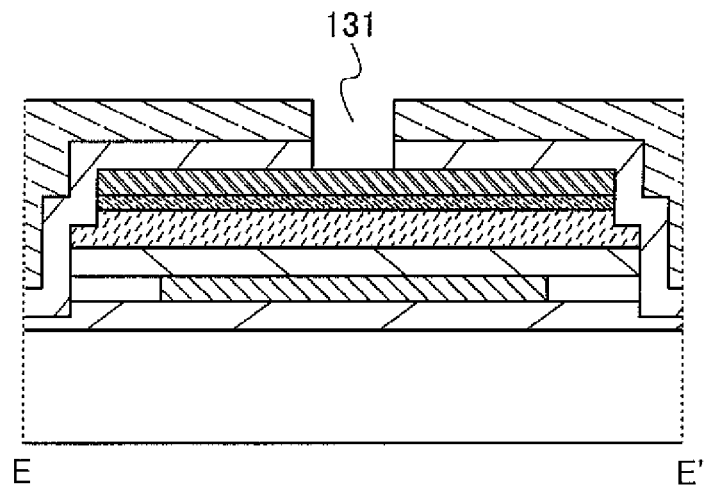
Figure 15C:
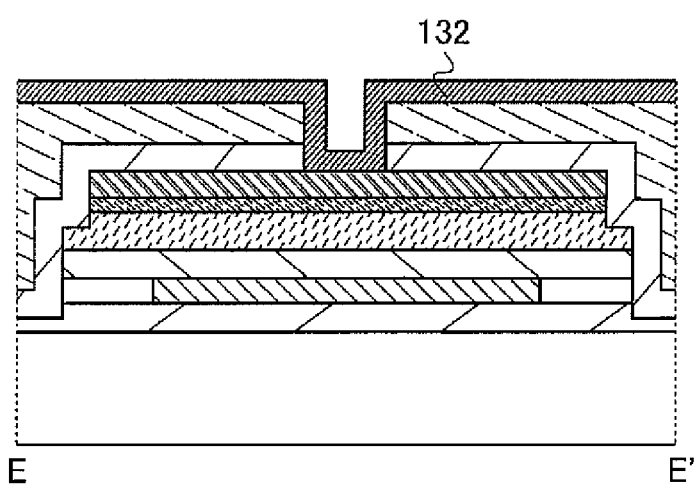
Figure 16:
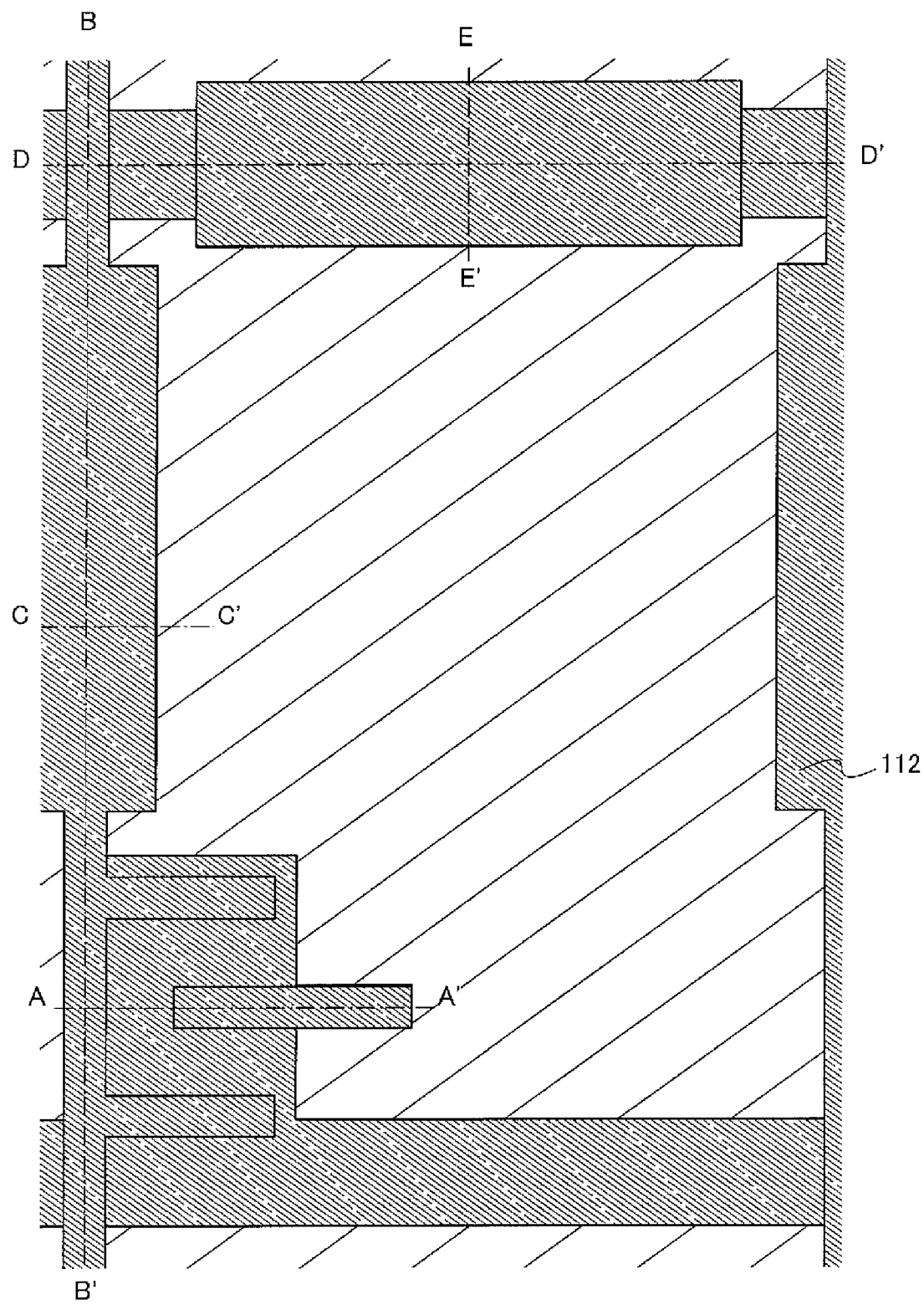
FIG. 16 illustrates an example of a manufacturing method of a thin film transistor and a display device.

The thin film transistor manufactured in the above-described manner has a structure including a gate electrode layer over a base insulating film, a gate insulating film over the gate electrode layer, a semiconductor layer over the gate insulating film, an impurity semiconductor layer having source region and a drain region, over the semiconductor layer, a source and drain electrode layer over the source region and the drain region, and a cavity adjacent to a side surface of the gate electrode layer (see FIG. 3C). Since such a thin film transistor has a cavity adjacent to a side surface of a gate electrode layer, leakage current at an end portion of the gate electrode layer is low. Further, since a base insulating film is included, in the case of using a glass substrate as a substrate, entry of an impurity metal element included in the glass substrate into a semiconductor layer can be prevented. Accordingly, electric characteristics are favorable (e.g., low off current) and variation in electric characteristics over the substrate is small.

Here, a terminal connection portion of the active matrix substrate manufactured in the above-described steps will be described with reference to FIG. 22, FIG. 23, and FIGS. 24A to 24C.

Figure 22:
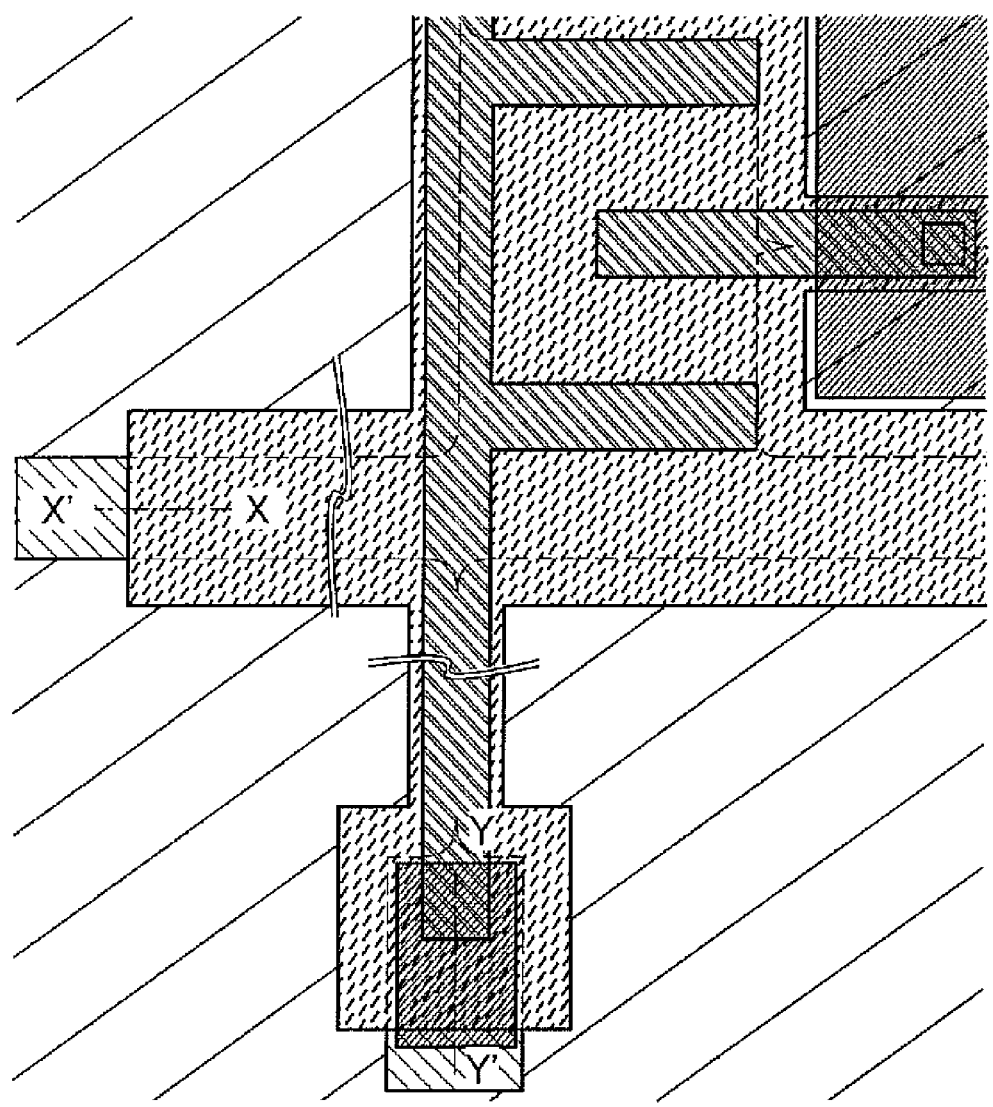
FIG. 22 illustrates a connection portion of an active matrix substrate.

FIG. 22 is a top view and FIG. 23 and FIGS. 24A to 24C are cross-sectional views of a terminal connection portion on the gate wiring side and a terminal connection portion on the source wiring side of the active matrix substrate manufactured in the above-described steps.

FIG. 22 is a top view of the gate wiring and the source wiring extended from the pixel portion, in the terminal connection portion on the gate wring side and the terminal connection portion on the source wiring side.

Figure 23:
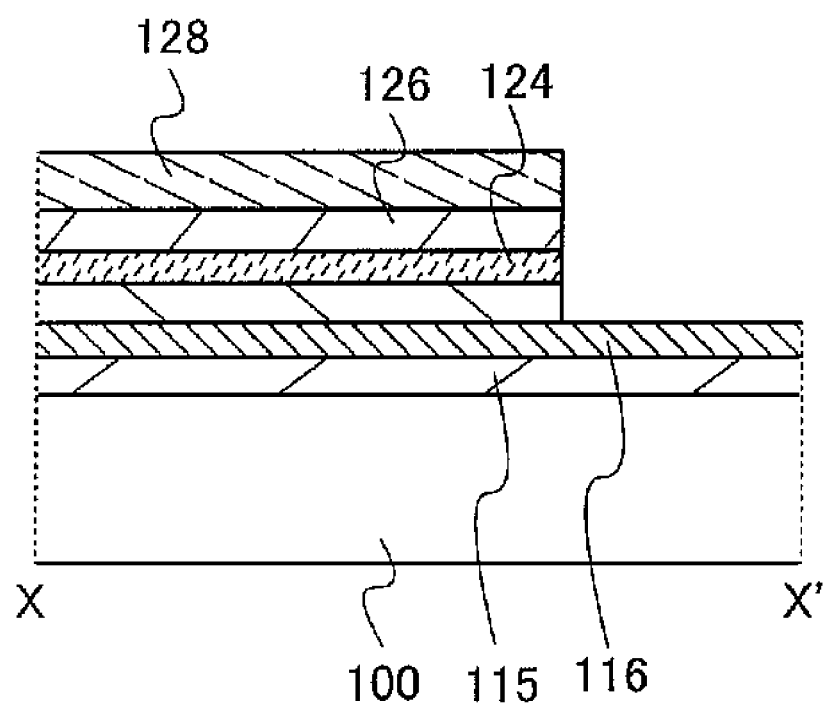
FIG. 23 illustrates a connection portion of an active matrix substrate.

FIG. 23 is a cross-sectional view taken along the line X-X' in FIG. 22. That is, FIG. 23 is a cross-sectional view of the terminal connection portion on the gate wiring side. In FIG. 23, the gate electrode layer 116 is exposed. A terminal portion is connected to the region in which the gate electrode layer 116 is exposed.

Figure 24A:
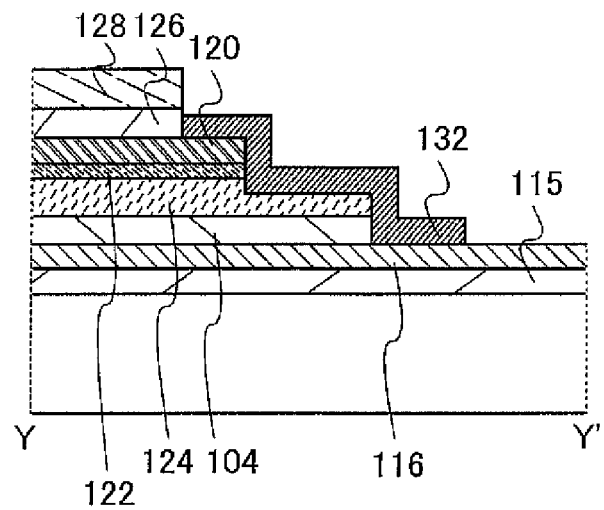
FIGS. 24A to 24C illustrate connection portions of active matrix substrates.
Figure 24B:
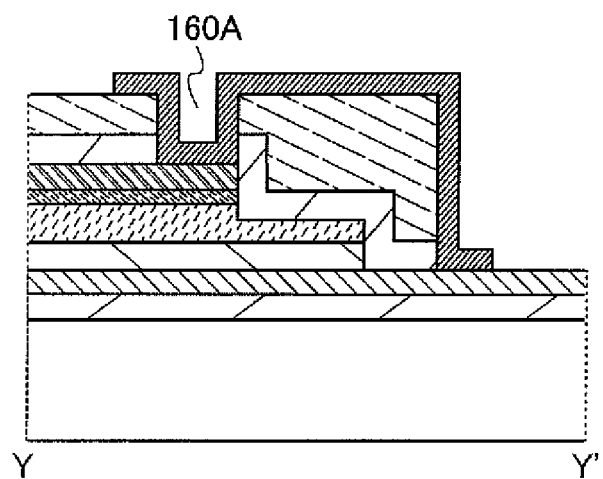
Figure 24C:
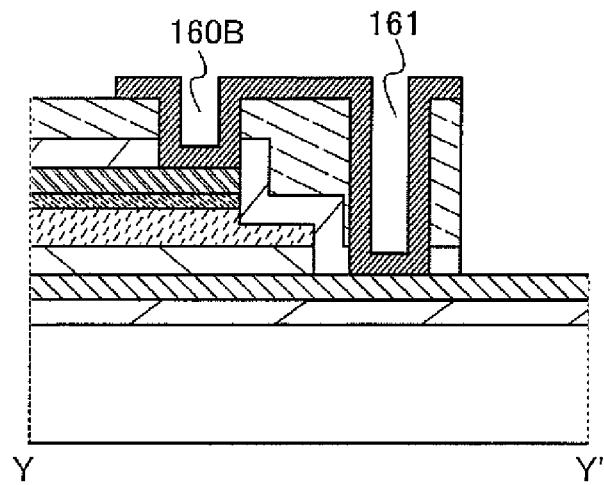

FIGS. 24A to 24C are cross-sectional views of the terminal connection portion on the source wiring side. In FIGS. 24A to 24C, the gate electrode layer 116 and the source and drain electrode layer 120 are connected to each other through the pixel electrode layer 132. FIGS. 24A to 24C illustrate various connection modes between the gate electrode layer 116 and the source and drain electrode layer 120. Any of these modes or modes other than those illustrated in FIGS. 24A to 24C may be used for the terminal connection portion in a display device of an embodiment of the invention disclosed in this specification. By the structure in which the source and drain electrode layer 120 is connected to the gate electrode layer 116, the height of the terminal connection portion can be made almost uniform.

In FIG. 24A, electric connection is realized in such a manner that end portions of the first protective film 126 and the second protective film 128 are removed by etching or the like to expose the gate electrode layer 116 and the source and drain electrode layer 120, and the pixel electrode layer 132 is formed over the exposed region. FIG. 24A corresponds to the cross-sectional view taken along the line Y-Y' of FIG. 22.

Note that the formation of the region in which the gate electrode layer 116 and the source and drain electrode layer 120 are exposed can be performed at the same time as the formation of the first opening portion 130 and the second opening portion 131.

In FIG. 24B, electric connection is realized in such a manner that a third opening portion 160A is provided in the first protective film 126 and the second protective film 128, end portions of the first protective film 126 and the second protective film 128 are removed by etching or the like to expose the gate electrode layer 116 and the source and drain electrode layer 120, and the pixel electrode layer 132 is formed over the exposed region.

Note that the formation of the third opening portion 160A and the formation of the region in which the gate electrode layer 116 is exposed can be performed at the same time as the formation of the first opening portion 130 and the second opening portion 131.

In FIG. 24C, electric connection is realized in such a manner that a third opening portion 160B and a fourth opening portion 161 are provided in the first protective film 126 and the second protective film 128 to expose the gate electrode layer 116 and the source and drain electrode layer 120, and the pixel electrode layer 132 is formed over the exposed region. Here, end portions of the first protective film 126 and the second protective film 128 are removed by etching or the like similarly to FIGS. 24A and 24B, and this etched region is used as a terminal connection portion.

Note that the formation of the third opening portion 160B and the fourth opening portion 161 and the formation of the region in which the gate electrode layer 116 is exposed can be performed at the same time as the formation of the first opening portion 130 and the second opening portion 131.

Note that the number of opening portions is not limited to those in FIGS. 24A to 24C. Not only one opening portion but also a plurality of opening portions may be provided for one terminal. In the case where a plurality of opening portions are provided for one terminal, even when any of the opening portions is not formed favorably due to insufficient etching for forming the opening portion, electric connection can be realized at the other opening portion. Further, even in the case where all the opening portions are formed without any problems, the contact area can be made larger and contact resistance can be reduced, which is preferable.

Next, a manufacturing method of a liquid crystal display device using the active matrix substrate for a display device, which is manufactured in the above-described steps, will be described. That is, a cell process and a module process will be described. Note that the cell process and the module process are not limited to the following description in the manufacturing method of a display device according to this embodiment.

In the cell process, the active matrix substrate manufactured in the above-described steps and a substrate opposite to the active matrix substrate (hereinafter referred to as an opposite substrate) are attached to each other and liquid crystal is injected. First, a manufacturing method of the opposite substrate will be briefly described below. Note that a film formed on the opposite substrate may have a single layer structure or a stacked structure even if not mentioned particularly.

First, a light-blocking layer is formed over a substrate; a color filter layer of any of red, green, and blue is formed over the light-blocking layer; a pixel electrode layer is selectively formed over the color filter layer; and then, a rib is formed over the pixel electrode layer.

As the light-blocking layer, a film of a material having a light-blocking property is selectively formed. As the material having a light-blocking property, for example, an organic resin containing a black resin (carbon black) can be used. Alternatively, a stacked film which includes a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, photolithography or the like is employed.

The color filter layer may be selectively formed using an organic resin film which transmits only light of any of red, green, and blue when irradiated with white light from a backlight. The color filter layer can be selectively formed by selective formation of color materials over predetermined areas. The arrangement of the color filter may be a stripe arrangement, a delta arrangement, or a square arrangement.

The pixel electrode layer over the opposite substrate can be formed in a similar manner to the pixel electrode layer 132 included in the active matrix substrate. Note that since selective formation is not necessary, the pixel electrode layer may be formed over the entire surface of the opposite substrate.

The rib formed over the pixel electrode is an organic resin film formed with a pattern for the purpose of widening the viewing angle. The rib does not need to be formed if not particularly necessary.

As the manufacturing method of the opposite substrate, there are other various modes. For example, after formation of the color filter layer and before formation of the pixel electrode layer, an overcoat layer may be formed. By formation of the overcoat layer, planarity of a surface on which the pixel electrode is formed can be increased, thereby increasing yield. In addition, part of a material included in the color filter layer can be prevented from entering a liquid crystal material. For the overcoat layer, a thermosetting material containing acrylic-based resin or epoxy-based resin is used.

Further, before or after formation of the rib, a post spacer (columnar spacer) may be formed as a spacer. The post spacer means a structural object formed at a constant interval on the opposite substrate in order to keep the gap between the active matrix substrate and the opposite substrate constant. In the case of using a bead spacer (spherical spacer), the post spacer need not be formed.

Next, an alignment film is formed on each of the active matrix substrate and the opposite substrate. Formation of the alignment films is performed, for example, in such a manner that polyimide resin or the like is dissolved in an organic solvent; this solution is applied by a coating method, a spin coating method, or the like; and then the organic solvent is evaporated, and the substrates are subjected to baking. The thickness of the formed alignment film is generally approximately equal to or greater than 50 nm and equal to or less than 100 nm. Rubbing treatment is performed on the alignment film to align liquid crystal molecules with a certain pretilt angle. The rubbing treatment is performed, for example, by rubbing the alignment film with a shaggy cloth such as a velvet.

Then, the active matrix substrate and the opposite substrate are attached with a sealant therebetween. In the case where a post spacer is not provided on the opposite substrate, a bead spacer may be dispersed in a desired region and then attachment may be performed.

Next, a liquid crystal material is injected in a space between the active matrix substrate and the opposite substrate, which are attached to each other. After injection of the liquid crystal material, an inlet for injection is sealed with an ultraviolet curing resin or the like. Alternatively, after dropping a liquid crystal material on one of the active matrix substrate and the opposite substrate, these substrates may be attached to each other.

Next, a polarizing plate is attached to both surfaces of a liquid crystal cell, which is formed by attachment of the active matrix substrate and the opposite substrate. Then, the cell process is finished.

Next, as the module process, a flexible printed circuit (FPC) is connected to an input terminal (in FIGS. 24A to 24C, the region in which the gate electrode layer 116 is exposed) of the terminal portion. The FPC has a wiring formed of a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and with the conductive layer over the terminal connected to the wiring formed in the FPC, electric connection therebetween is achieved. Alternatively, after connection of the FPC, a polarizing plate may be attached to the active matrix substrate and the opposite substrate. In the above-described manner, a liquid crystal panel used for a display device can be manufactured.

As described above, the active matrix substrate including a pixel transistor, which is used for a display device, can be manufactured using three photomasks.

Accordingly, the number of manufacturing steps of a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, since the number of photomasks to be used is reduced, the number of manufacturing steps of a thin film transistor and a display device can be significantly reduced.

In addition, the number of manufacturing steps of a thin film transistor can be significantly reduced without a complicated step using backside light exposure, resist reflow, a lift-off method, or the like. Therefore, the number of manufacturing steps of a display device can be significantly reduced without a complicated step. Thus, the number of manufacturing steps of a display device can be significantly reduced without reducing yield.

Moreover, the number of manufacturing steps of a thin film transistor can be significantly reduced while electric characteristics of the thin film transistor are maintained.

Furthermore, by the aforementioned effects, manufacturing cost can be significantly reduced.

In addition, since the first conductive film 102 is processed by the first etching, the distance $d_1$ between the side surface of the thin-film stack body 114 and the side surface of the gate electrode layer 116 can be controlled independently of the thickness of the first conductive film 102, thereby increasing the freedom of layout design of a pixel structure.

Even if a glass substrate containing an impurity metal element is used as the substrate, the impurity metal element can be prevented from attaching to and entering a semiconductor layer, so that degradation of electric characteristics (e.g., high off current) of the thin film transistor can be prevented. Accordingly, a thin film transistor having favorable electric characteristics can be manufactured. Further, variation in characteristics over the substrate of the thin film transistor to be manufactured can be made small. Therefore, display unevenness of the display device can be made small.

Furthermore, since a thin film transistor in which leakage current generated at an end portion of the gate electrode layer is low can be manufactured, a display device with a high contrast ratio and favorable display quality can be obtained.

The pixel structure of the invention disclosed in this specification is not limited to the one described above and can be applied to a variety of liquid crystal display devices.

Embodiment 2

In Embodiment 2, a manufacturing method of a thin film transistor and a manufacturing method of a display device according to one embodiment of the invention disclosed in this specification, which are different from those of Embodiment 1, will be described. Specifically, a manufacturing method of a thin film transistor which is similar to that of Embodiment 1, without using a multi-tone mask will be described with reference to FIGS. 26A to 26C, FIGS. 27A to 27C, FIG. 28, FIG. 29, and FIG. 30.

Figure 1C:
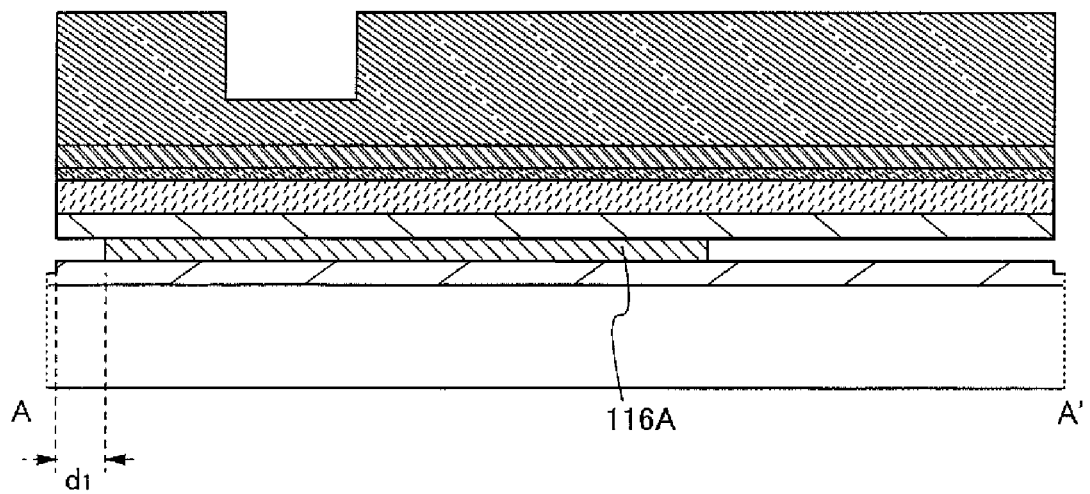
Figure 26A:
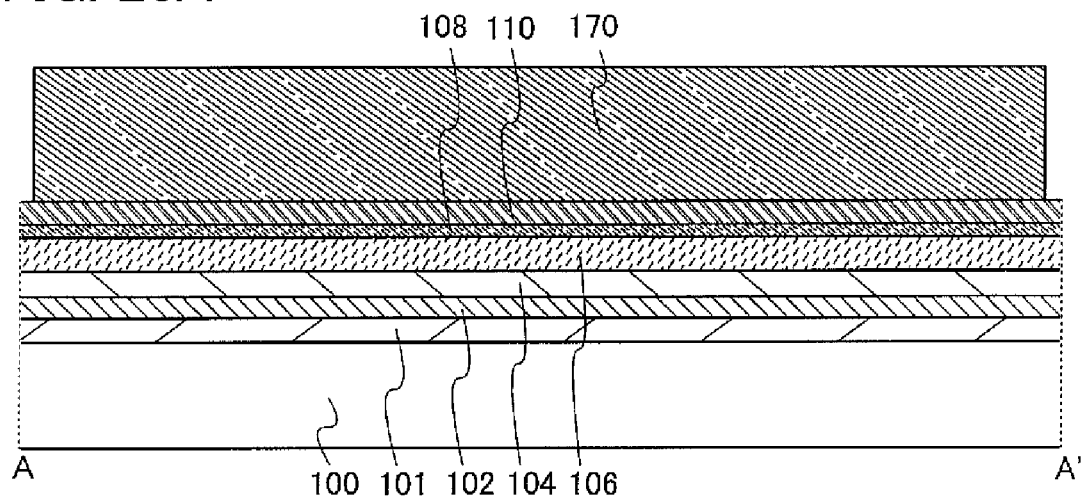
FIGS. 26A to 26C illustrate an example of a manufacturing method of a thin film transistor and a display device.
Figure 26B:
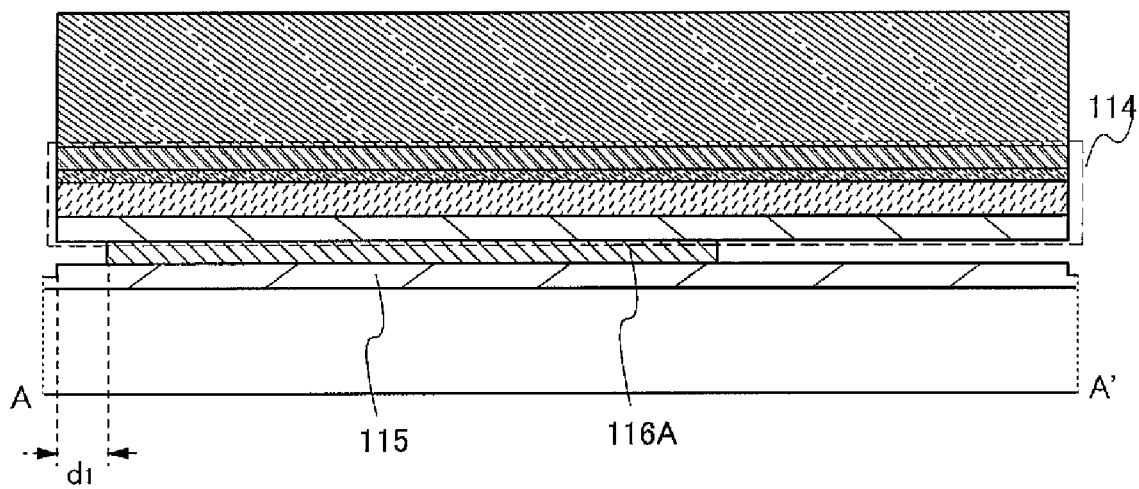
Figure 26C:
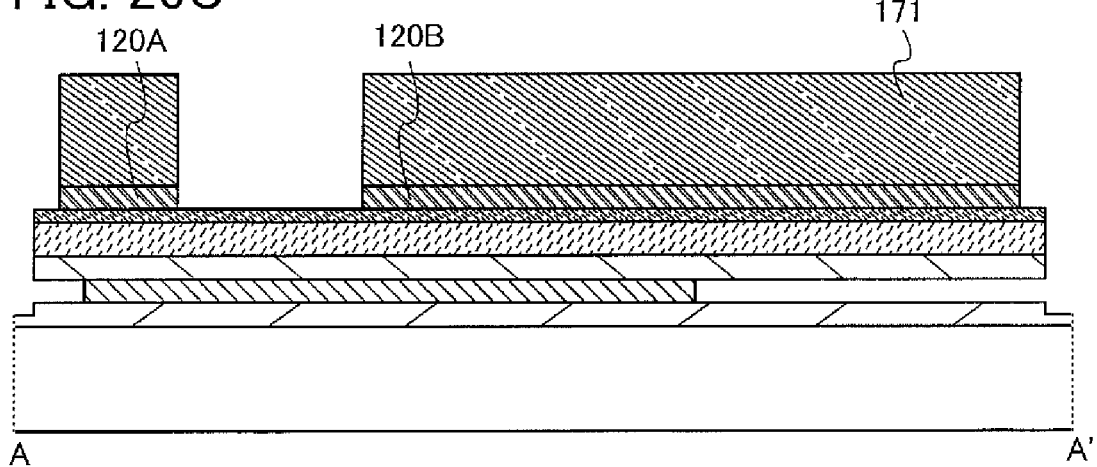
Figure 27A:
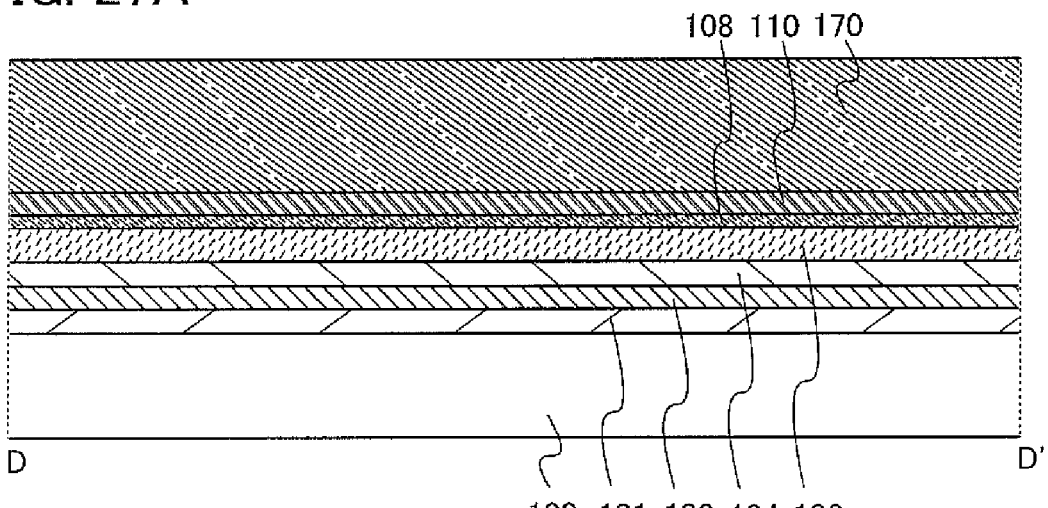
FIGS. 27A to 27C illustrate an example of a manufacturing method of a thin film transistor and a display device.
Figure 27B:
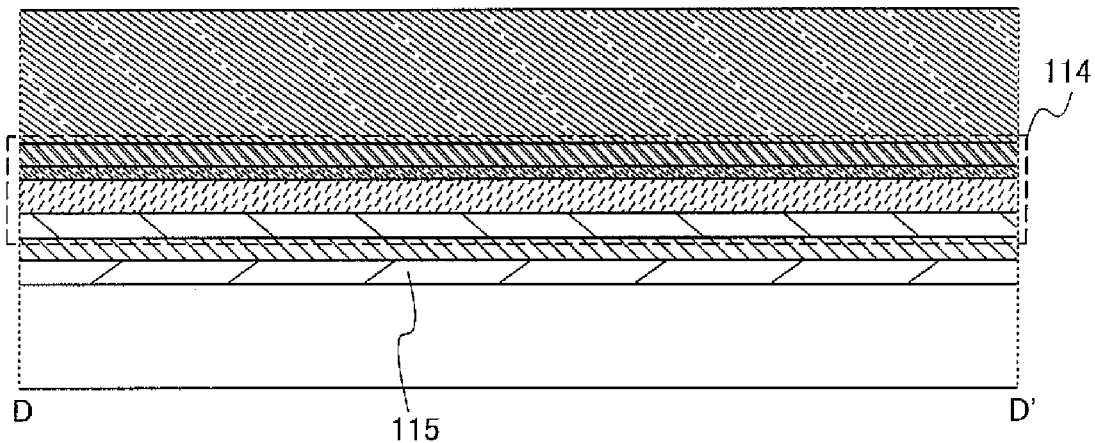
Figure 27C:
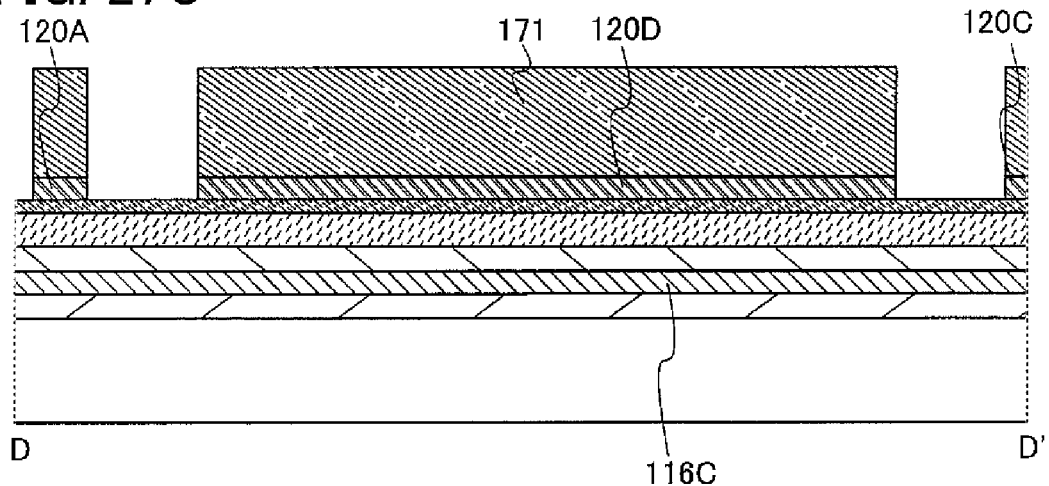
Figure 28:
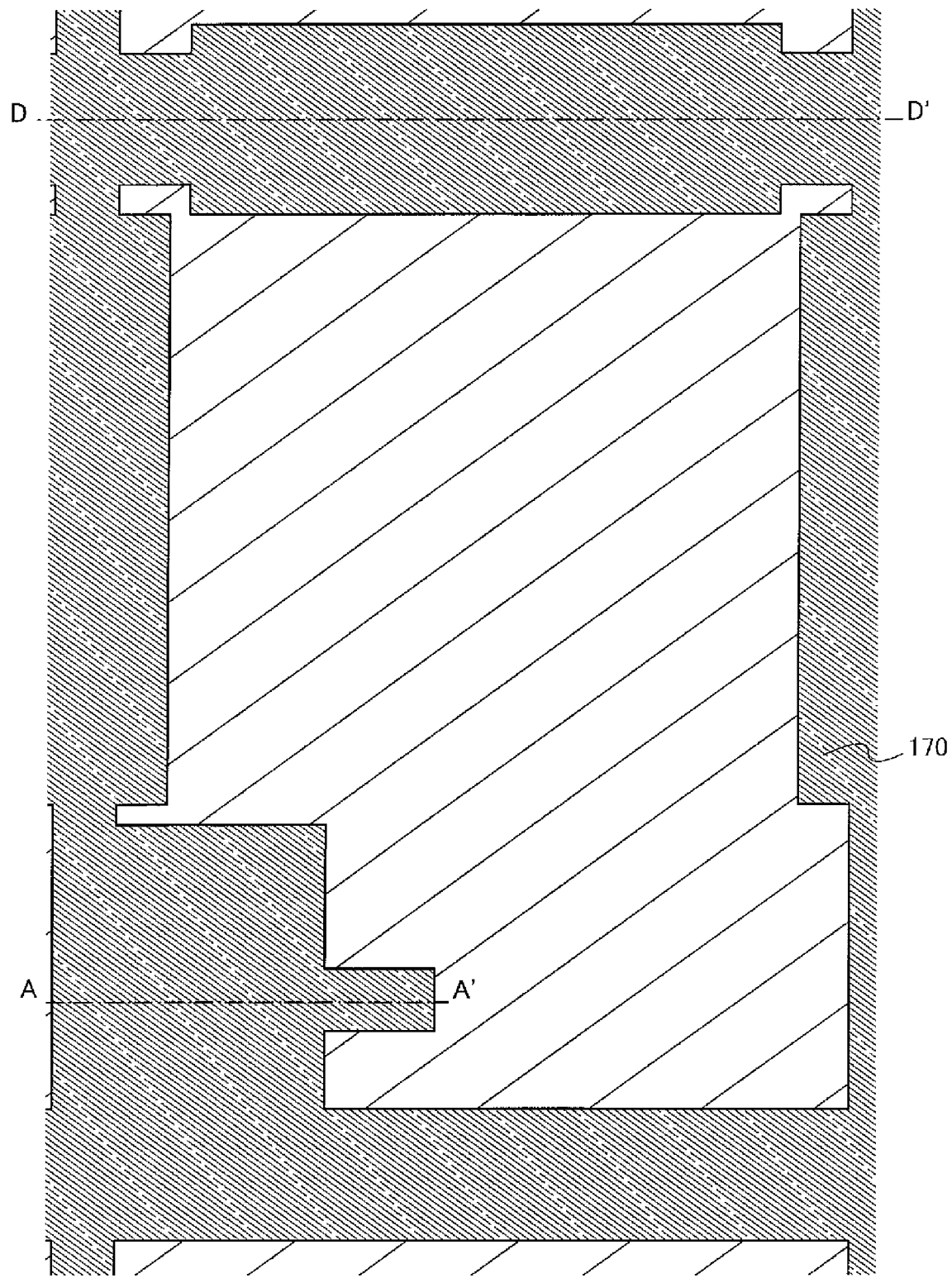
FIG. 28 illustrates an example of a manufacturing method of a thin film transistor and a display device.
Figure 29:
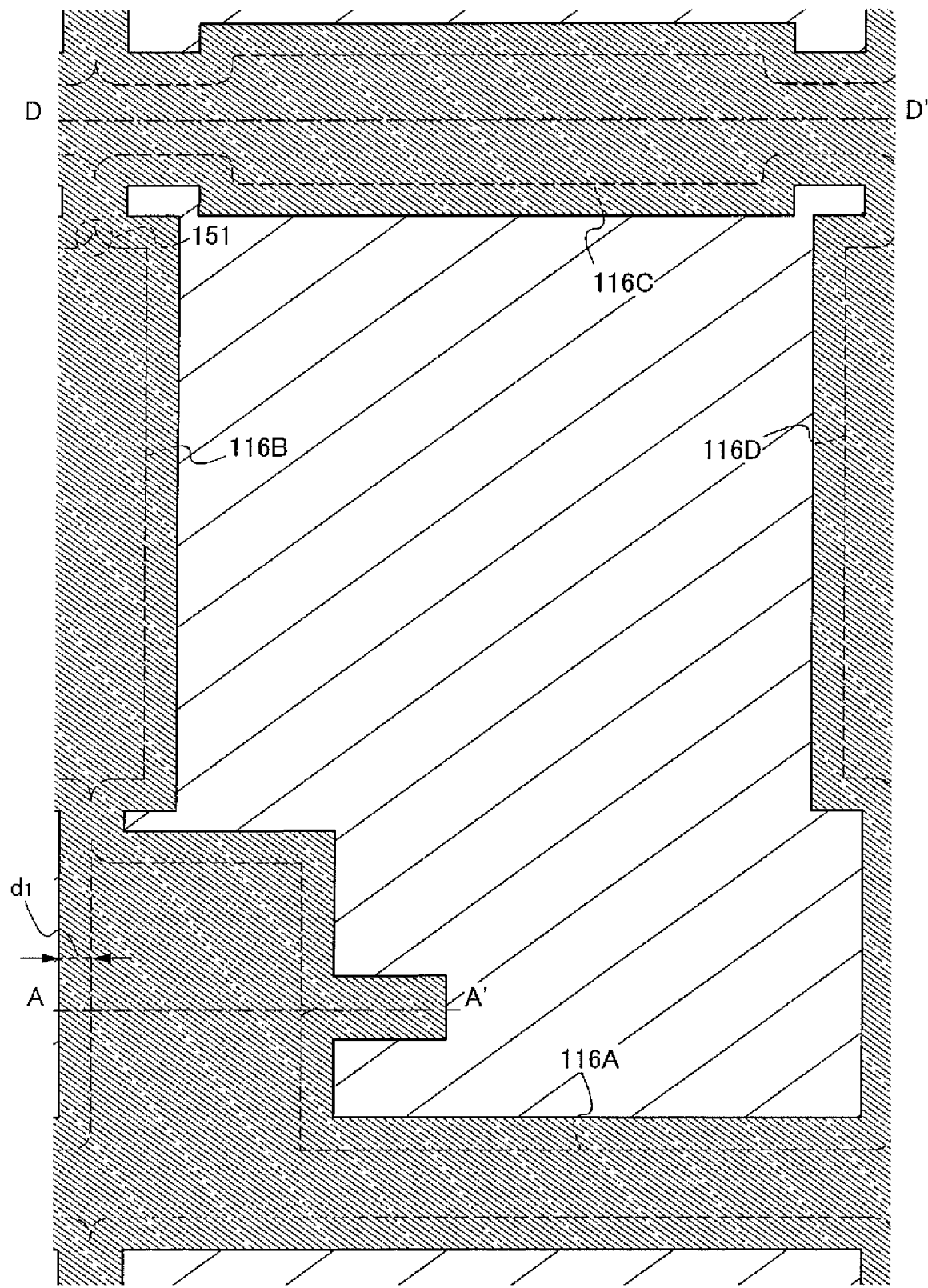
FIG. 29 illustrates an example of a manufacturing method of a thin film transistor and a display device.
Figure 30:
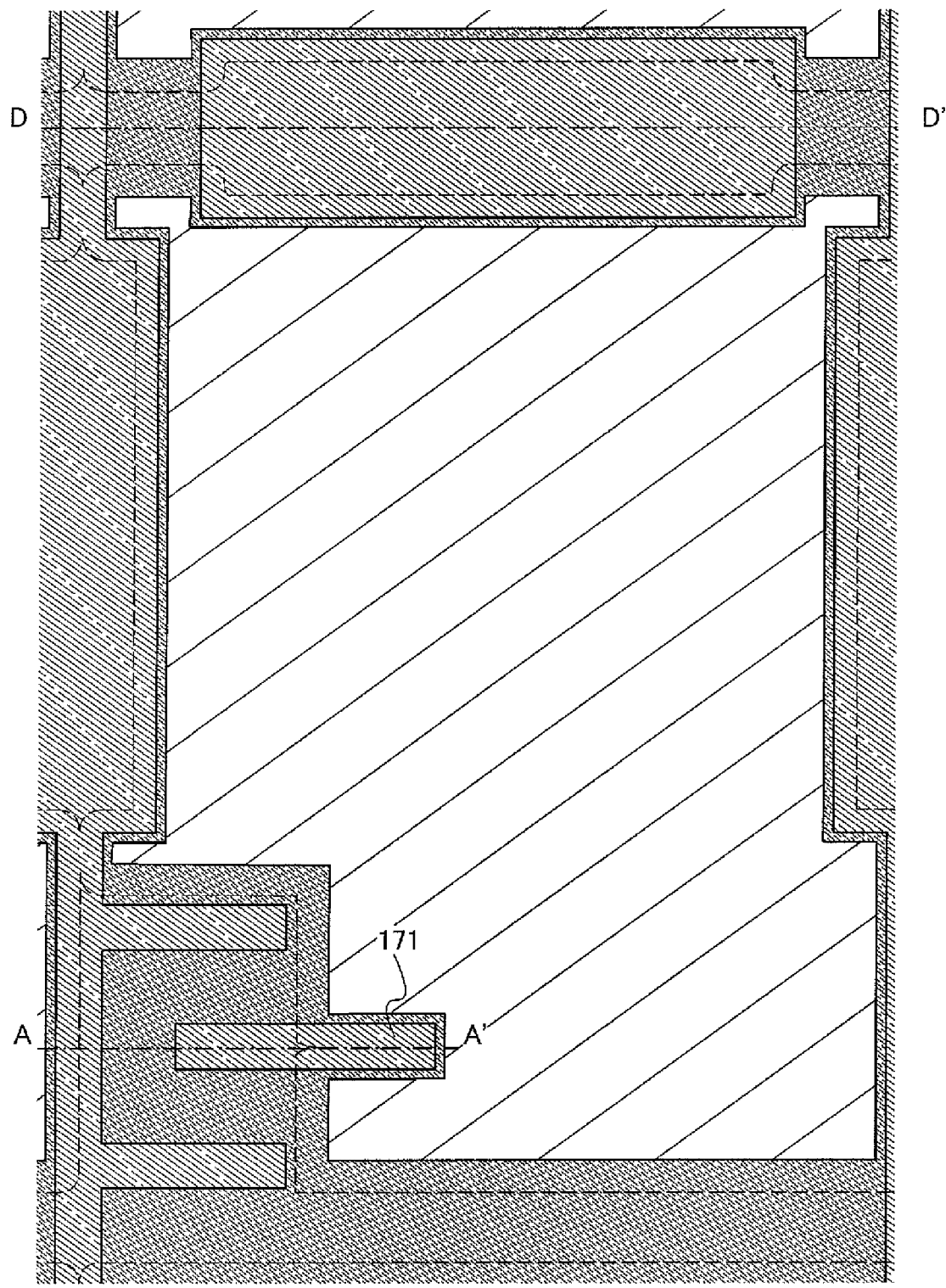
FIG. 30 illustrates an example of a manufacturing method of a thin film transistor and a display device.

FIGS. 26A, 26B, and 26C correspond to FIG. 1A, FIG. 1C, and FIG. 2A of Embodiment 1. FIGS. 27A, 27B, and 27C correspond to FIG. 10A, FIG. 10C, and FIG. 11A of Embodiment 1. FIG. 28, FIG. 29, and FIG. 30 correspond to FIG. 16, FIG. 17, and FIG. 18 of Embodiment 1. The cross-sectional views taken along the line A-A' illustrated in FIG. 28, FIG. 29, and FIG. 30 correspond to FIGS. 26A, 26B, and 26C, and the cross-sectional views taken along the line D-D' illustrated in FIG. 28, FIG. 29, and FIG. 30 correspond to FIGS. 27A, 27B, and 27C.

First, similar to Embodiment 1, a first insulating film 101, a first conductive film 102, a second insulating film 104, a semiconductor film 106, an impurity semiconductor film 108, and a second conductive film 110 are formed over a substrate 100 (see FIG. 26A and FIG. 27A). Materials thereof and formation methods thereof are similar to those in Embodiment 1. In the case where a region capable of an ohmic contact with a source and drain electrode layer is provided in part of the semiconductor layer formed using the semiconductor film 106 by doping or the like, the impurity semiconductor film 108 need not be provided.

Then, a first resist mask 170 is formed over the second conductive film 110 (see FIG. 26A and FIG. 27A). The first resist mask 170 is different from the first resist mask 112 of Embodiment 1 and is formed so as to have an almost uniform thickness without a recessed portion being provided. That is, the first resist mask 170 can be formed without a multi-tone mask.

Next, first etching is performed using the first resist mask 170. That is, the first conductive film 102, the second insulating film 104, the semiconductor film 106, the impurity semiconductor film 108, and the second conductive film 110 are etched to form a thin-film stack body 114 over the first conductive film 102 (see FIG. 28). In addition, similarly to Embodiment 1, an upper portion of the first insulating film 101 is also etched by the first etching to form an etched first insulating film 115.

Then, second etching is performed in a similar manner to Embodiment 1; accordingly, a gate electrode layer 116 is formed (see FIG. 26B, FIG. 27B, and FIG. 29).

Here, the conditions of the second etching are similar to those of the second etching in Embodiment 1.

Next, a second resist mask 171 is formed over the thin-film stack body 114, and a source and drain electrode layer 120 is formed using the second resist mask 171 (see FIG. 26C, FIG. 27C, and FIG. 30). The etching conditions or the like are similar to those of Embodiment 1. In addition, the steps following this are similar to those of Embodiment 1.

Note that the case where the second resist mask 171 is formed after the second etching is described here; however, the present embodiment is not limited to this case and the second etching may be performed after formation of the second resist mask 171.

As described in this embodiment above, a thin film transistor can be manufactured without using a multi-tone mask. Note that the number of masks to be used is increased by one, as compared to that of Embodiment 1.

Note that the manufacturing method of a thin film transistor and a display device according to this embodiment is similar to that of Embodiment 1 except for the point described above. Therefore, effects similar to those of the manufacturing method of a thin film transistor and a display device of Embodiment 1 can be naturally obtained, but the number of used masks is increased by one. In other words, according to this embodiment, a thin film transistor can be manufactured using two photomasks. In addition, an active matrix substrate including a pixel transistor can be manufactured using four photomasks. In this manner, since the number of photomasks can be reduced compared with the traditional technique without the use of a multi-tone mask, the number of manufacturing steps of a thin film transistor and a display device can be significantly reduced. Furthermore, a thin film transistor and a display device can be manufactured with high yield and low cost.

Moreover, similarly to Embodiment 1, the number of manufacturing steps of a thin film transistor can be significantly reduced while electric characteristics of the thin film transistor are maintained.

In addition, similarly to Embodiment 1, since the first conductive film 102 is processed by the first etching, the distance $d_1$ between the side surface of the thin-film stack body 114 and the side surface of the gate electrode layer 116 (see FIG. 26B and FIG. 29) can be controlled independently of the thickness of the first conductive film 102, thereby increasing the freedom of layout design of a pixel structure.

Furthermore, similarly to Embodiment 1, even if a glass substrate containing an impurity metal element is used as the substrate, the impurity metal element can be prevented from attaching to and entering a semiconductor layer, so that degradation of electric characteristics (e.g., high off current) of the thin film transistor can be prevented. Accordingly, a thin film transistor having favorable electric characteristics can be manufactured. Further, variation in characteristics over the substrate of the thin film transistor to be manufactured can be made small. Therefore, display unevenness of the display device can be made small.

Note that the thin film transistor manufactured using the manufacturing method of this embodiment has a structure including a gate electrode layer over an insulating film, a gate insulating film over the gate electrode layer, a semiconductor layer over the gate insulating film, an impurity semiconductor layer having a source region and a drain region, over the semiconductor layer, a source electrode and a drain electrode over the source region and the drain region, and a cavity adjacent to a side surface of the gate electrode layer. By the cavity formed adjacent to the side surface of the gate electrode layer, a thin film transistor with low leakage current at an end portion of the gate electrode layer can be manufactured. Accordingly, a display device with a high contrast ratio and favorable display quality can be obtained.

Embodiment 3

In Embodiment 3, an example of a manufacturing method of a thin film transistor and a manufacturing method of an EL display device in which the thin film transistors are arranged in matrix will be described with reference to FIG. 31 to FIG. 39C and FIG. 43A to FIG. 43C.

Figure 31:
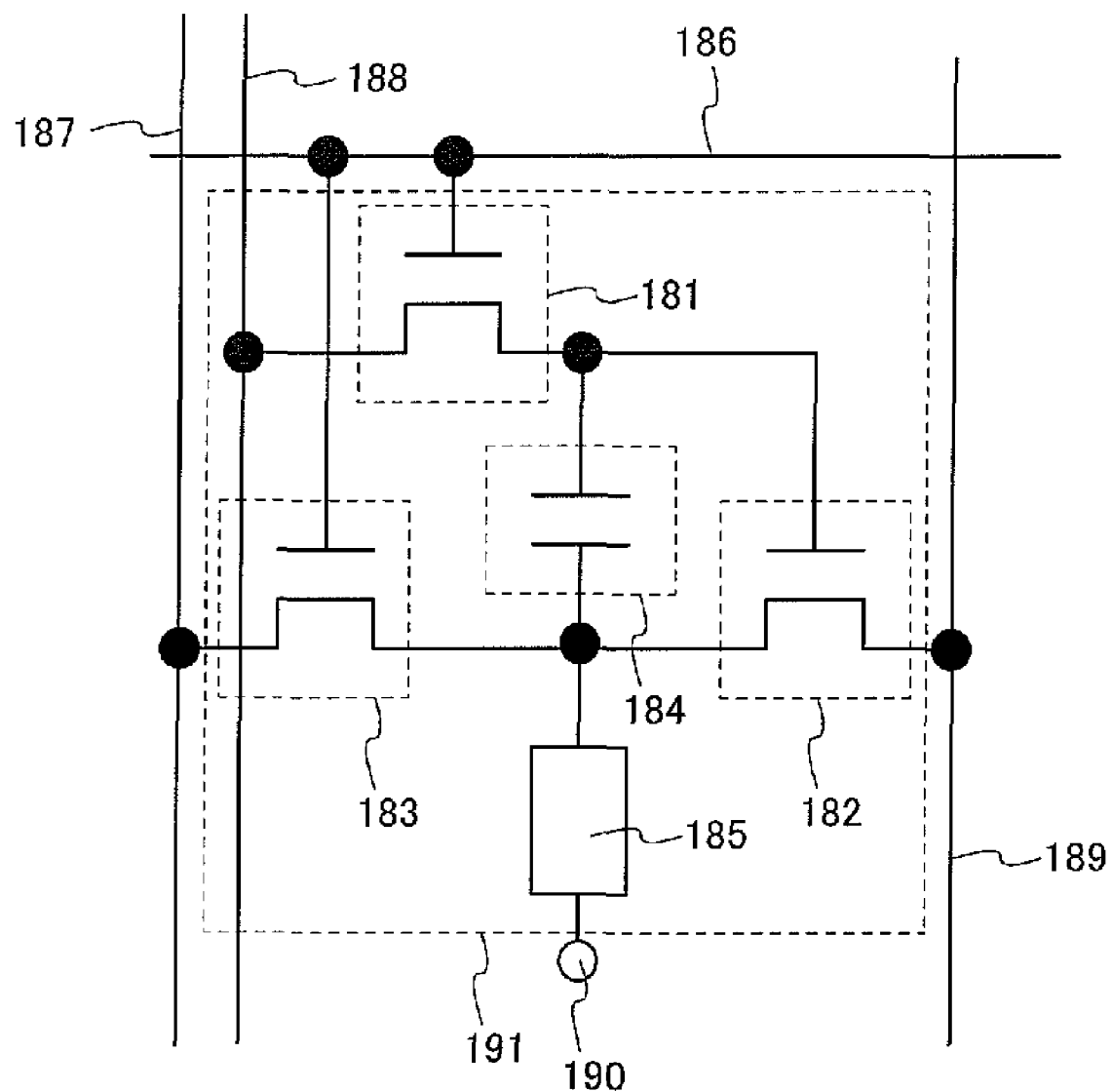
FIG. 31 illustrates an example of a pixel circuit of a display device.
Figure 32:
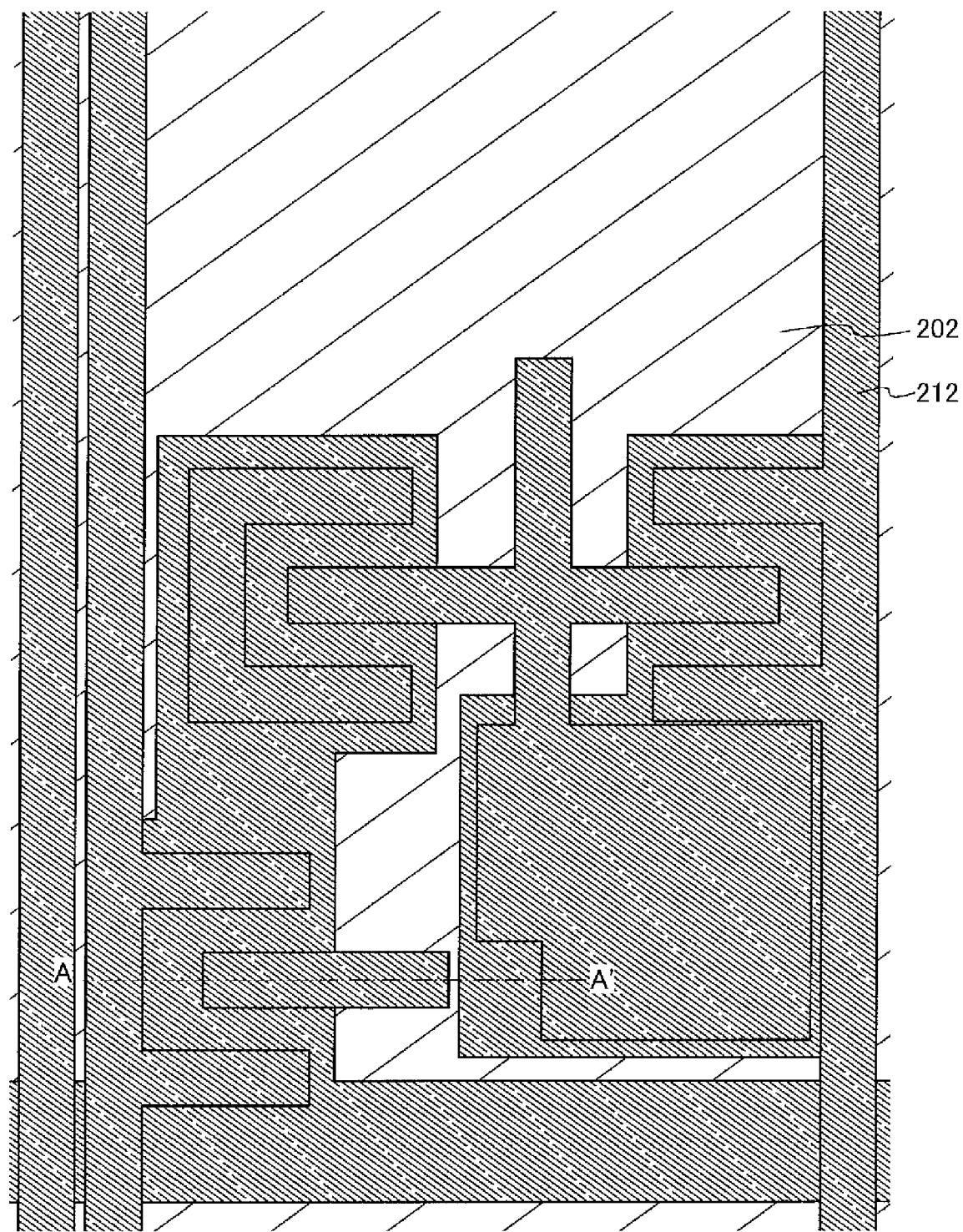
FIG. 32 illustrates an example of a manufacturing method of a thin film transistor and a display device.

Various pixel circuits for EL display devices (active EL display devices) which use thin film transistors as switching elements are considered. FIG. 31 illustrates an example of a simple pixel circuit, and a manufacturing method of a pixel structure using this pixel circuit will be described in this embodiment. However, the pixel circuit of the EL display device disclosed in this specification is not limited to the one having the configuration illustrated in FIG. 31.

In the pixel structure of the EL display device illustrated in FIG. 31, a pixel 191 includes a first transistor 181, a second transistor 182, a third transistor 183, a capacitor 184, and a light-emitting element 185. The first, second, and third transistors are n-channel transistors. A gate electrode of the first transistor 181 is connected to a gate wiring 186, one of a source electrode and a drain electrode (referred to as a first electrode) is connected to a source wiring 188, and the other of the source electrode and the drain electrode (referred to as a second electrode) is connected to a gate electrode of the second transistor 182 and one electrode (referred to as a first electrode) of the capacitor 184. The other electrode (referred to as a second electrode) of the capacitor 184 is connected to one of a source electrode and a drain electrode (referred to as a first electrode) of the second transistor 182, one of a source electrode and a drain electrode (referred to as a first electrode) of the third transistor 183, and one electrode (referred to as a first electrode) of the light-emitting element 185. The other of the source electrode and the drain electrode (referred to as a second electrode) of the second transistor 182 is connected to a second power supply line 189. The other of the source electrode and the drain electrode (referred to as a second electrode) of the third transistor 183 is connected to a first power supply line 187, and a gate electrode of the third transistor 183 is connected to the gate wiring 186. The other electrode (referred to as a second electrode) of the light-emitting element 185 is connected to a common electrode 190. Note that the potential of the first power supply line 187 is different from that of the second power supply line 189.

The operation of the pixel 191 will be described. When the third transistor 183 is turned on by a signal input to the gate wiring 186, the first electrode of the second transistor 182, the first electrode of the light-emitting element 185, and the second electrode of the capacitor 184 each have a potential equal to that of the first power supply line 187 ($V_{187}$). Here, since the potential ($V_{187}$) of the first power supply line 187 is constant, the potential of the first electrode of the second transistor 182 and the like is constant ($V_{187}$).

When the first transistor 181 is selected and turned on by the signal input to the gate wiring 186, a potential of the signal from the source wiring 188 ($V_{188}$) is input to the gate electrode of the second transistor 182 through the first transistor 181. At this time, if the potential of the second power supply line 189 ($V_{189}$) is higher than the potential of the first power supply line 187 ($V_{187}$), the relation, $V_{gs}=V_{188}-V_{187}$, is obtained. If $V_{gs}$ is higher than the threshold voltage of the second transistor 182, the second transistor 182 is turned on.

Accordingly, in the case of operating the second transistor 182 in a linear region, the potential of the source wiring 188 ($V_{188}$) is changed (e.g., binary values), so that on and off of the second transistor 182 can be controlled. That is, it can be controlled whether voltage is applied to the EL layer included in the light-emitting element 185.

In the case of operating the second transistor 182 in a saturation region, the change in potential of the source wiring 188 ($V_{188}$) allows the control of the amount of current flowing through the light-emitting element 185.

In the above-described manner, in the case of operating the second transistor 182 in a linear region, it can be controlled whether voltage is applied to the light-emitting element 185. Thus, the light-emitting state and the non-light emitting state of the light-emitting element 185 can be controlled. The driving method like this can be used for digital time grayscale driving, for example. The digital time grayscale driving is a driving method in which one frame is divided into a plurality of subframes and the light-emitting state and the non-light emitting state of the light-emitting element 185 are controlled in each subframe. On the other hand, in the case of operating the second transistor 182 in a saturation region, the amount of current flowing through the light-emitting element 185 can be controlled and luminance of the light-emitting element 185 can be adjusted.

Next, a pixel structure to which the pixel circuit illustrated in FIG. 31 is applied and a manufacturing method thereof will be described below.

Figure 34:
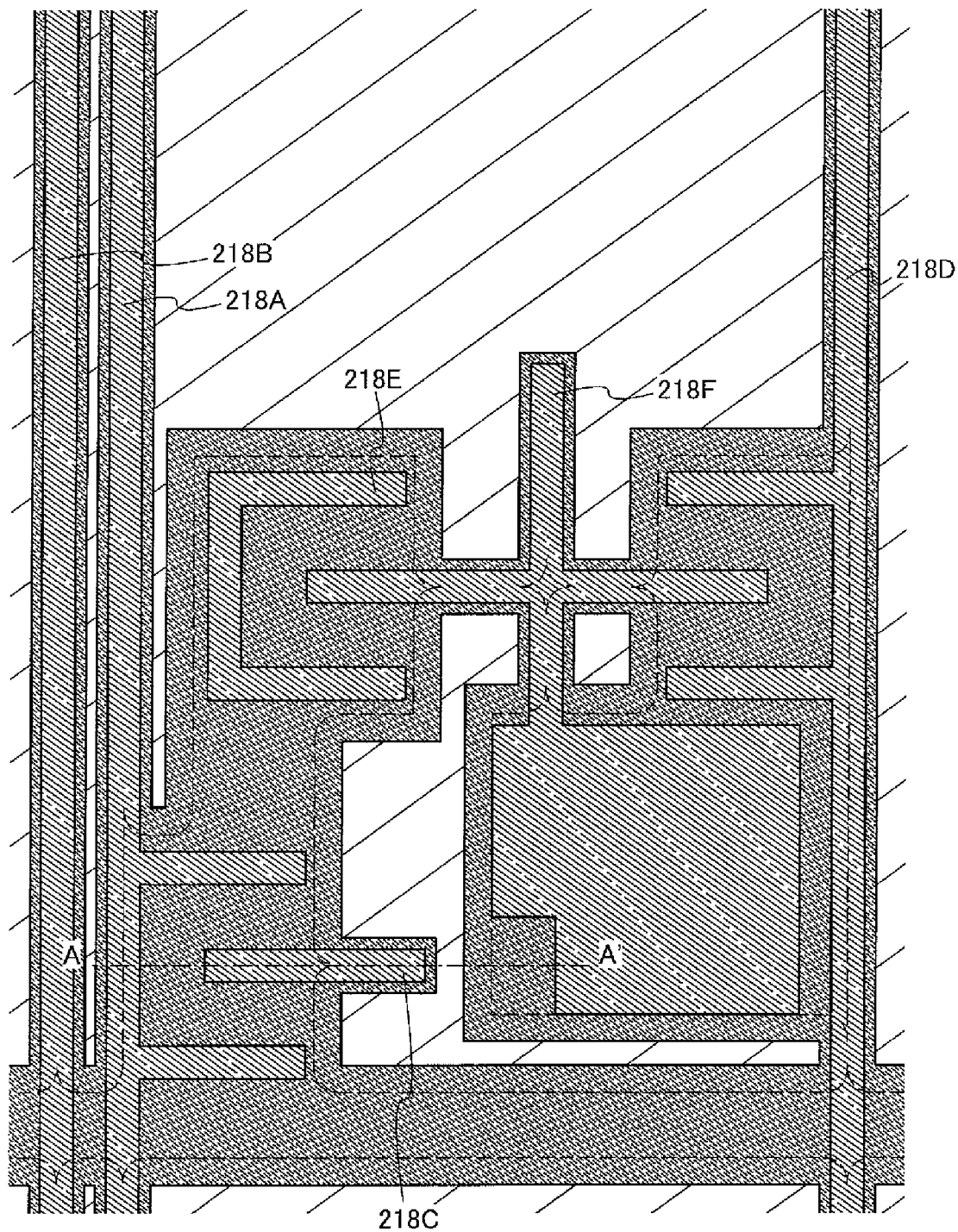
FIG. 34 illustrates an example of a manufacturing method of a thin film transistor and a display device.
Figure 35:
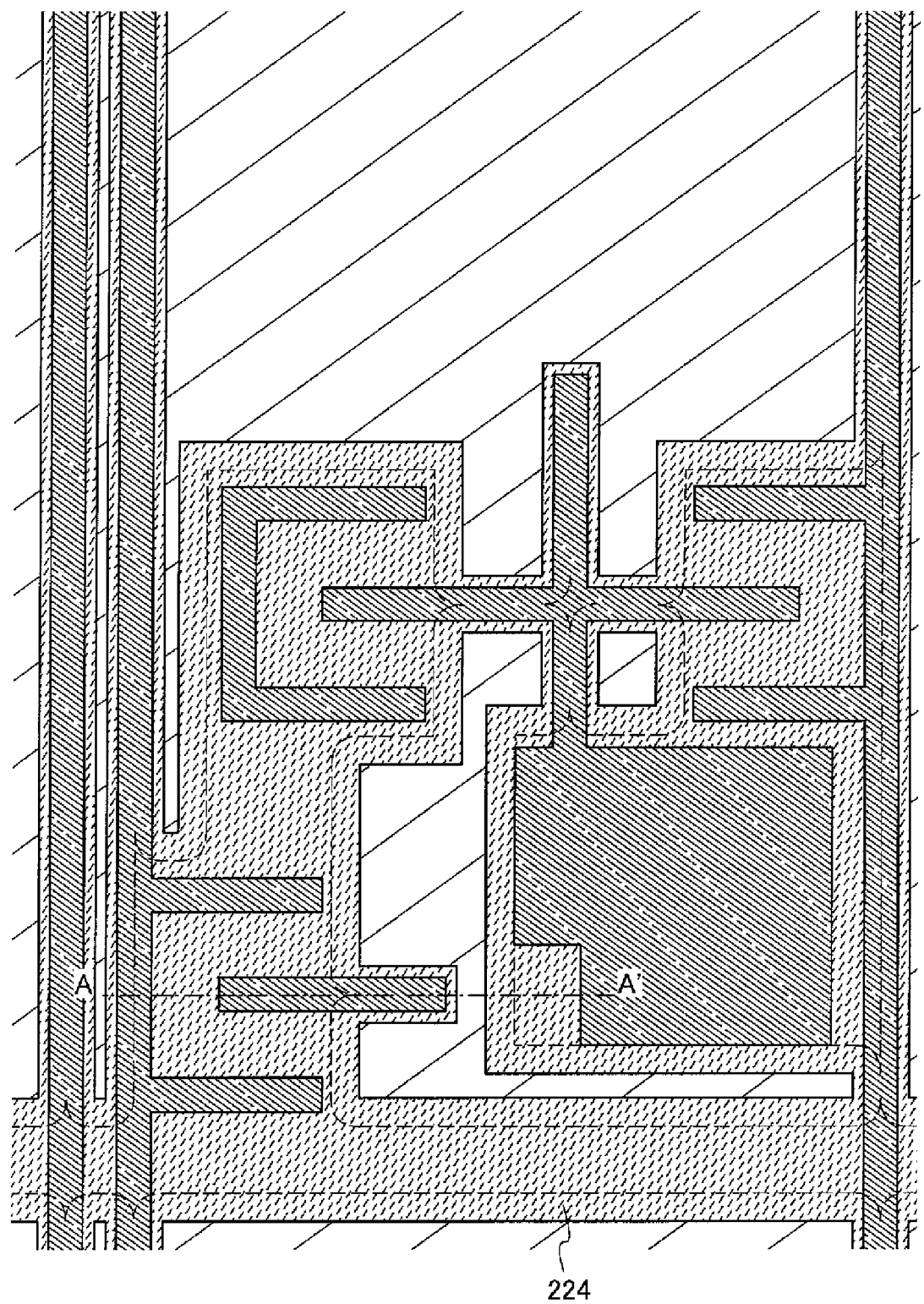
FIG. 35 illustrates an example of a manufacturing method of a thin film transistor and a display device.
Figure 36:
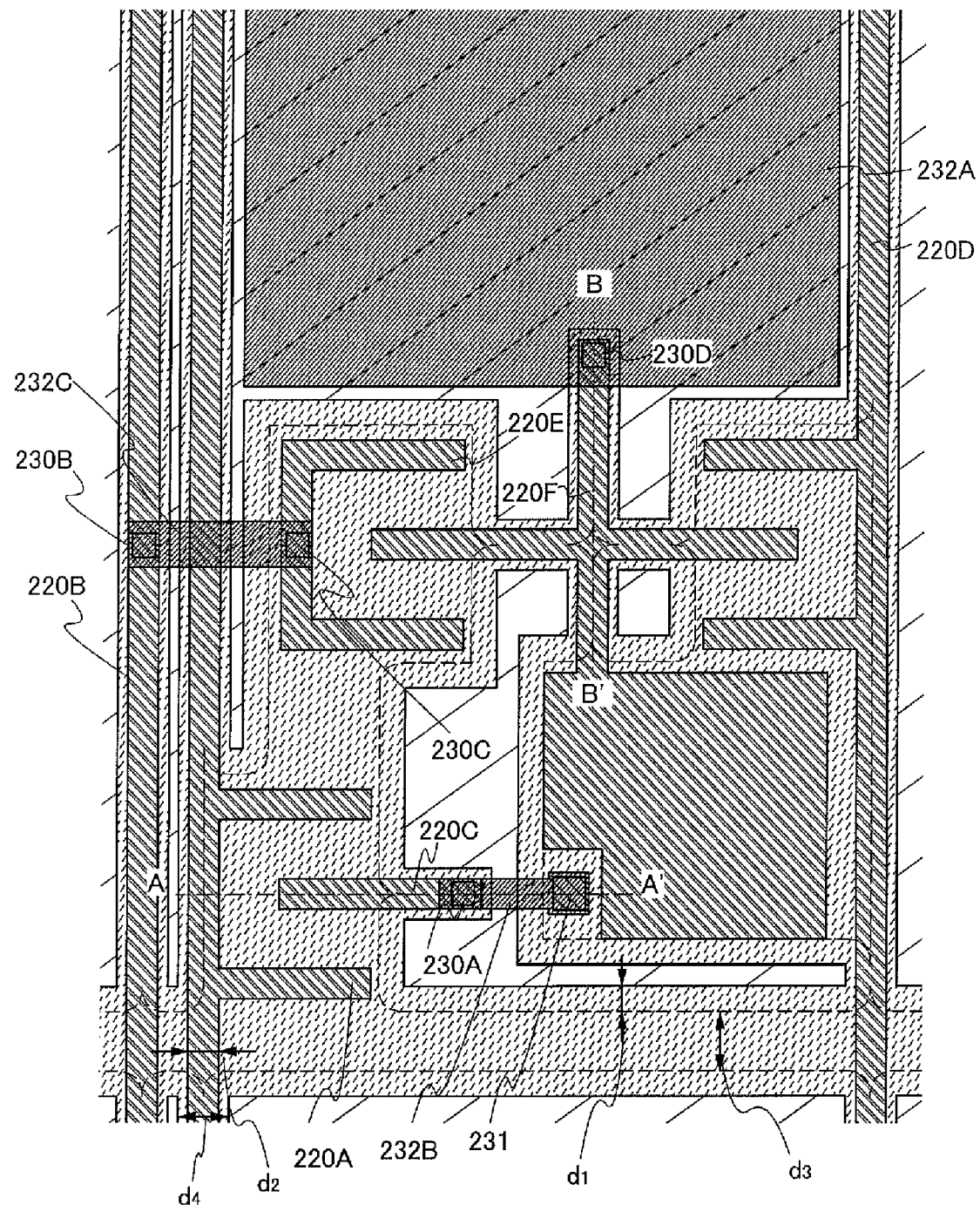
FIG. 36 illustrates an example of a manufacturing method of a thin film transistor and a display device.
Figure 43A:
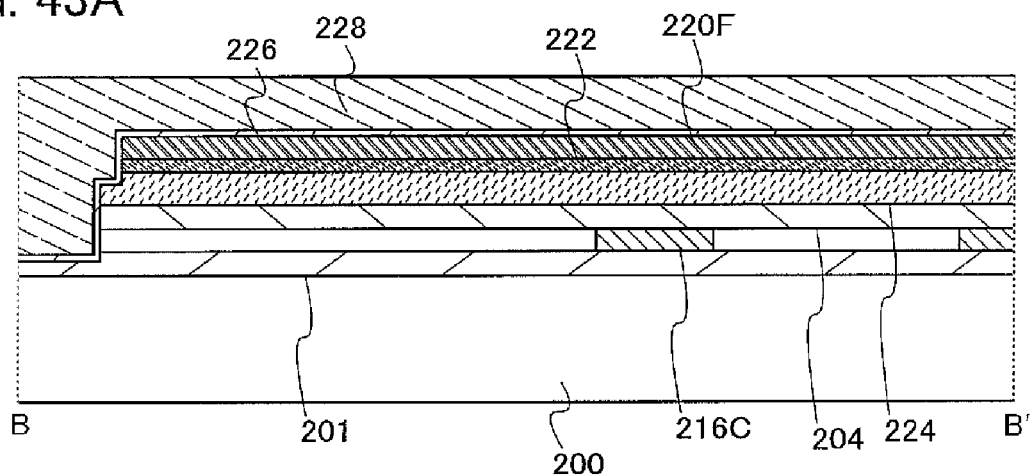
FIGS. 43A to 43C illustrate an example of a manufacturing method of a thin film transistor and a display device.
Figure 43B:
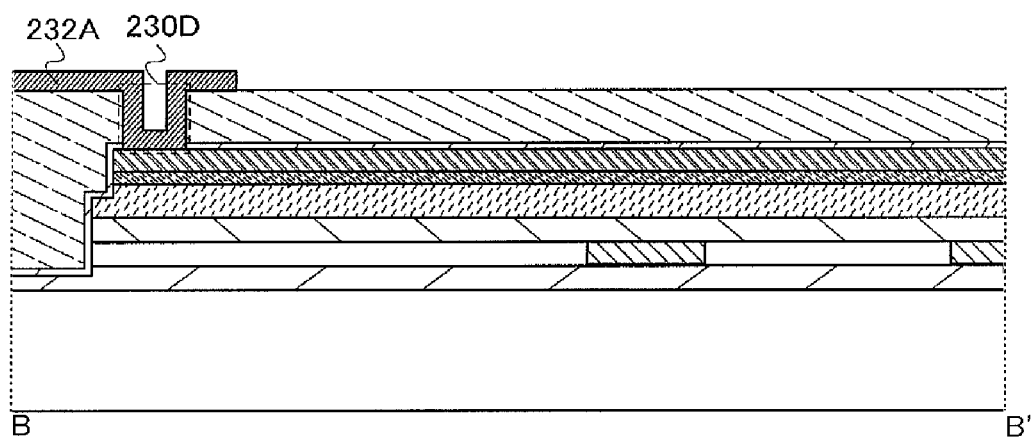
Figure 43C:
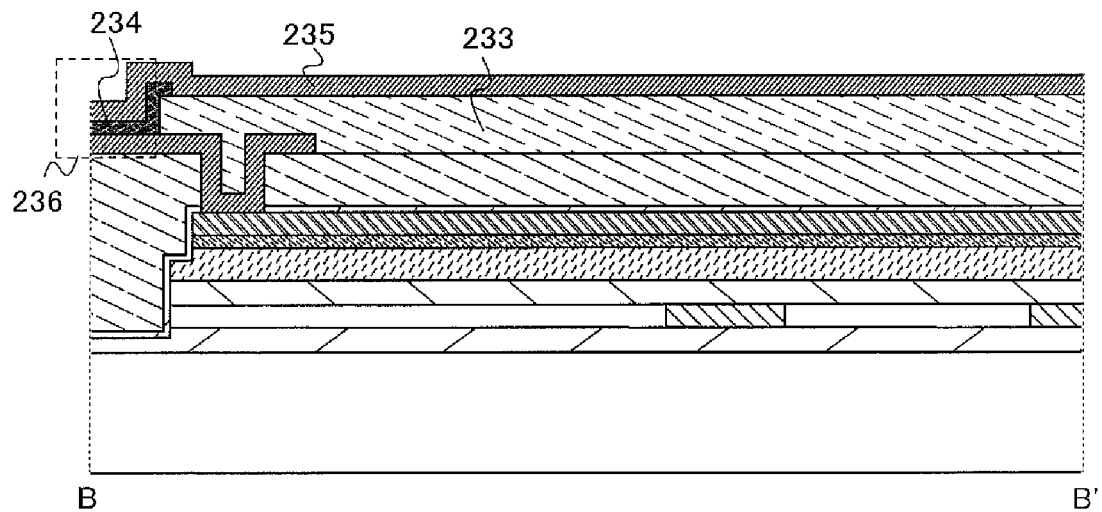

FIG. 32 to FIG. 36 are top views of thin film transistors according to this embodiment. FIG. 36 is a completion drawing in the situation that formation of a pixel electrode is finished. FIG. 37A to FIG. 39C are cross-sectional views taken along the line A-A' in FIG. 32 to FIG. 36. FIG. 43A to FIG. 43C are cross-sectional views taken along the line B-B' in FIG. 36.

Figure 37A:
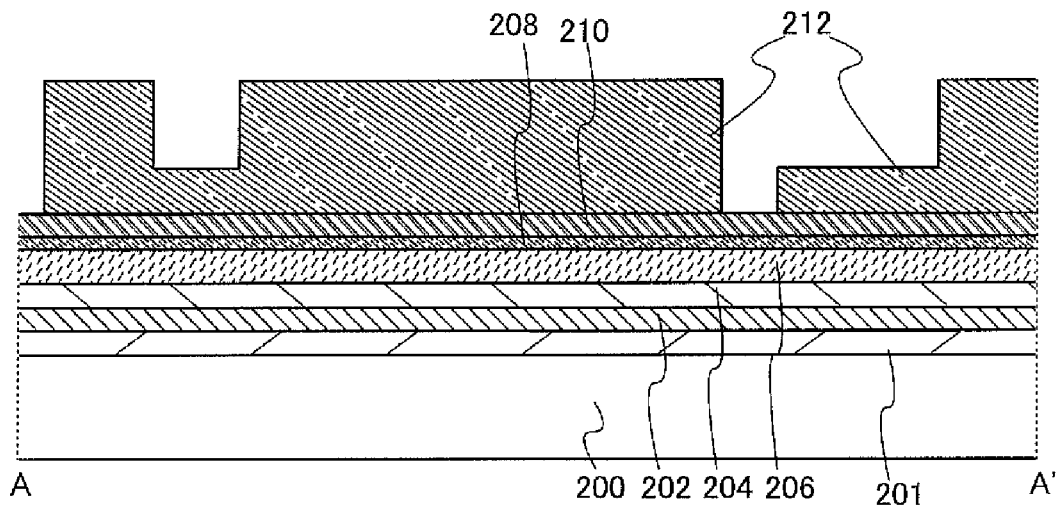
FIGS. 37A to 37C illustrate an example of a manufacturing method of a thin film transistor and a display device.
Figure 37B:
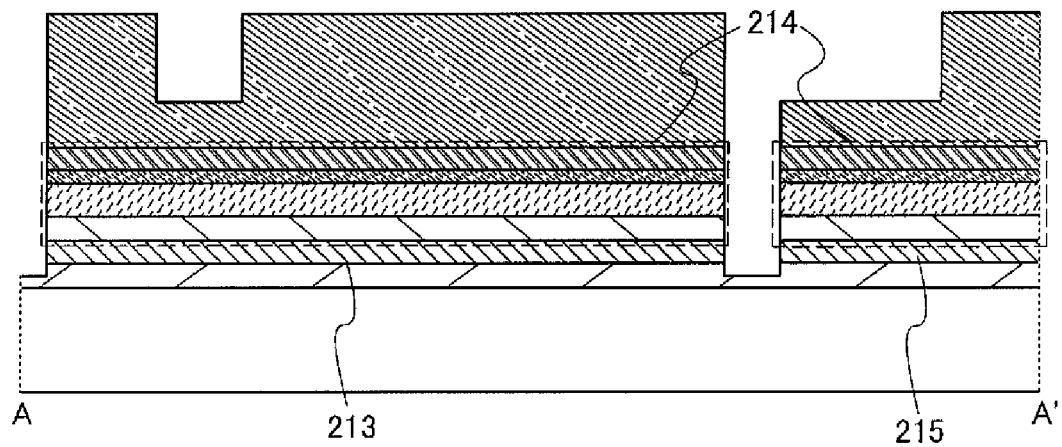
Figure 37C:
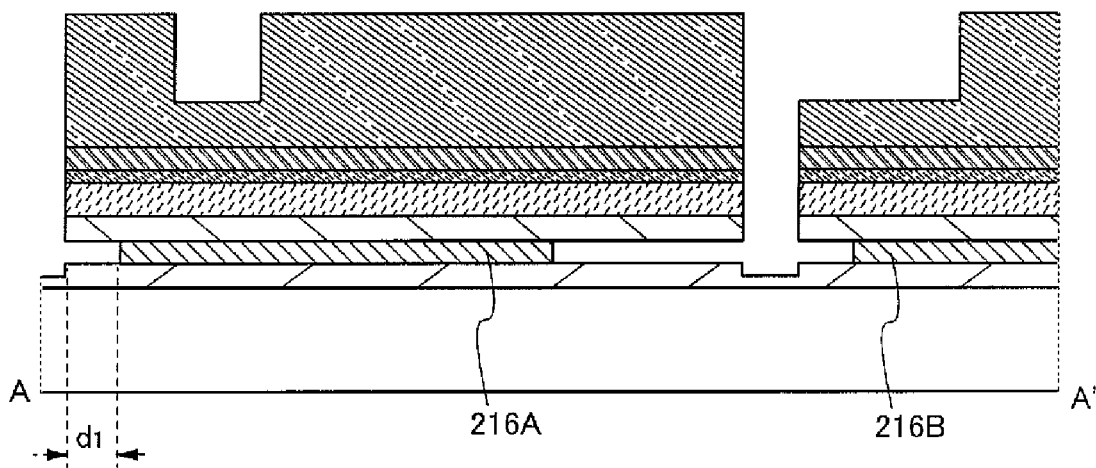

First, a first insulating film 201, a first conductive film 202, a second insulating film 204, a semiconductor film 206, an impurity semiconductor film 208, and a second conductive film 210 are formed over a substrate 200 (FIG. 37A).

Note that a similar substrate to the substrate 100 in Embodiment 1 can be used as the substrate 200. A material and a formation method of the first insulating film 201 can be similar to those of the first insulating film 101 in Embodiment 1. A material and a formation method of the first conductive film 202 can be similar to those of the first conductive film 102 in Embodiment 1. A material and a formation method of the second insulating film 204 can be similar to those of the second insulating film 104 in Embodiment 1.

As the semiconductor film 206, a stacked film of a crystalline semiconductor film and an amorphous semiconductor film is preferably used. As the crystalline semiconductor film, a polycrystalline semiconductor film, a microcrystalline semiconductor film, and the like can be given.

The polycrystalline semiconductor film means a semiconductor film which includes crystal grains and many grain boundaries between the crystal grains. The polycrystalline semiconductor film is formed by, for example, a thermal crystallization method or a laser crystallization method. Here, the thermal crystallization method is a crystallization method in which an amorphous semiconductor film is formed over a substrate and the amorphous semiconductor is crystallized by heating the substrate. The laser crystallization method is a crystallization method in which an amorphous semiconductor film is formed over a substrate and the amorphous semiconductor film is irradiated with a laser beam to crystallize the amorphous semiconductor. Alternatively, a crystallization method in which an element capable of promoting crystallization such as nickel is added to cause crystallization may be used. In the case where crystallization is performed by adding the element capable of promoting crystallization, the semiconductor film is preferably subjected to laser irradiation.

The polycrystalline semiconductor is classified into low temperature polysilicon (LTPS), which is obtained by crystallization at such a temperature and for such time as not to cause distortion in a glass substrate, and high temperature polysilicon (HTPS), which is obtained by crystallization at higher temperature.

The microcrystalline semiconductor film is a semiconductor film including crystal grains each having a diameter of approximately equal to or greater than 2 nm and equal to or less than 100 nm, and includes in its category a semiconductor film whose entire surface is formed of only crystal grains and a semiconductor film in which amorphous semiconductor exists between crystal grains. As a formation method of the microcrystalline semiconductor film, a method in which a crystal nucleus is formed and a crystalline of the semiconductor is allowed to grow using the crystal nucleus; a method in which an amorphous semiconductor film, an insulating film in contact with the amorphous semiconductor film, and a metal film are formed and the metal film is irradiated with a laser beam so that the amorphous semiconductor is crystallized by heat generated at the metal film; or the like may be employed. Note that a crystalline semiconductor film formed by performing a thermal crystallization method or a laser crystallization method on an amorphous semiconductor film is not included in the category of the microcrystalline semiconductor film.

For example, when a stacked film formed by stacking an amorphous semiconductor film over a crystalline semiconductor film is used as the semiconductor film 206, a transistor included in a pixel circuit of an EL display device can operate at high speed. Here, as the crystalline semiconductor film, a polycrystalline semiconductor (including LTPS and HTPS) film or a microcrystalline semiconductor film may be used.

When an amorphous semiconductor film is placed over a crystalline semiconductor film, a surface of the microcrystalline semiconductor film can be prevented from being oxidized. In addition, withstand voltage can be increased and off current can be reduced.

Note that the crystallinity of the semiconductor film 206 is not particularly limited as long as the pixel circuit of the EL display device operates normally.

The impurity semiconductor film 208 is a semiconductor film containing an impurity element imparting one conductivity type and is formed using a gas such as a gas for the preparation of semiconductor material to which the impurity element imparting one conductivity type is added. Since an n-channel thin film transistor is provided in this embodiment, a silicon film containing phosphorus may be provided as the impurity semiconductor film 208 by using a silane gas containing phosphine (chemical formula: $PH_3$), for example. Note that similarly to the first conductive film 202 and the like, the material of the impurity semiconductor film 208 needs to be a material which has heat resistance and is not unintentionally etched or eroded in a later step. As long as these requirements are satisfied, the material of the impurity semiconductor film 208 is not limited to a particular material. Note that the crystallinity of the impurity semiconductor film 208 is not particularly limited as well. In the case where a region capable of an ohmic contact is provided in part of the semiconductor layer formed using the semiconductor film 206 by doping or the like, the impurity semiconductor film 208 need not be provided.

Since an n-channel thin film transistor is manufactured in this embodiment, arsenic or the like may be used as the impurity element imparting one conductivity type to be added, and arsine (chemical formula: $AsH_3$) may be included at a desired concentration in a silane gas used for formation of the impurity semiconductor film 208.

Note that the impurity semiconductor film 208 can be formed by, for example, a CVD method (a thermal CVD method, a plasma CVD method, or the like) or the like; however, the formation method of the impurity semiconductor film 208 is not limited to a particular method.

The second conductive film 210 can be formed using a material which is similar to the material of the second conductive film 110 in Embodiment 1 but is different from the material used for the first conductive film 202. The second conductive film 210 can be formed by a similar method to the method of the second conductive film 110 in Embodiment 1.

Next, a first resist mask 212 is formed over the second conductive film 210 (see FIG. 37A). Here, the first resist mask 212 is preferably a resist mask having a recessed portion or a projected portion. In other words, the first resist mask 212 can also be referred to as a resist mask including a plurality of regions (here, two regions) having different thicknesses. In the first resist mask 212, the thick region is called a projected portion of the first resist mask 212 and the thin region is called a recessed portion of the first resist mask 212. Note that the present embodiment is not limited to this structure, and the first resist mask 212 may be a resist mask which has neither a recessed portion nor a projected portion.

In the first resist mask 212, the projected portion is formed in a region where a source and drain electrode layer is formed, and the recessed portion is formed in a region where a semiconductor layer is exposed without existence of the source and drain electrode layer.

The first resist mask 212 can be formed using a multi-tone mask described in Embodiment 1. Note that the multi-tone mask is not necessarily used.

Next, first etching is performed using the first resist mask 212. That is, the first conductive film 202, the second insulating film 204, the semiconductor film 206, the impurity semiconductor film 208, and the second conductive film 210 are patterned by etching to form a thin-film stack body 214 and an etched first conductive film 213 (see FIG. 32 and FIG. 37B). At this time, an upper portion of the first insulating film 201 is also etched to form an etched first insulating film 215. Similarly to Embodiment 1, when the first etching is performed in one step, dry etching is used; and when the first etching is performed in plural steps, dry etching is used at least for the etching of the first conductive film 202. In other words, dry etching is employed for a step of forming the etched first conductive film 213 by processing the first conductive film 202.

By the etched first insulating film 215 which serves as a base insulating film, unintentional etching of the substrate 200 can be prevented in the first etching. Therefore, an impurity metal element included in the substrate 200 can be prevented from attaching to and entering a semiconductor layer.

Next, second etching is performed using the first resist mask 212. That is, the etched first conductive film 213 is patterned by etching to form a gate electrode layer 216 (see FIG. 33 and FIG. 37C).

Note that the gate electrode layer 216 forms a gate electrode of a thin film transistor, a gate wiring, one electrode of a capacitor, and a supporting portion. The expression of a gate electrode layer 216A means an electrode layer forming a gate wiring, the gate electrode of the first transistor 181, and the gate electrode of the third transistor 183. The expression of a gate electrode layer 216B means an electrode layer forming the gate electrode of the second transistor 182 and one of electrodes of the capacitor 184. The expression of a gate electrode layer 216C means an electrode layer which forms a supporting portion. These gate electrode layers are collectively referred to as the gate electrode layer 216.

The second etching is performed under such etching conditions that a side surface of the gate electrode layer 216 formed from the first conductive film 202 is located inside a side surface of the thin-film stack body 214. In other words, the second etching is performed so that the side surface of the gate electrode layer 216 is in contact with a bottom surface of the thin-film stack body 214 (so that the width of the gate electrode layer 216 is narrower than that of the thin-film stack body 214 in the cross section along the line A-A'). Further, the second etching is performed under such conditions that the etching rate of the second conductive film 210 is low and the etching rate of the first conductive film 202 is high. In other words, the second etching is performed under the conditions that the etching selectivity of the first conductive film 202 with respect to the second conductive film 210 is high. By performing the second etching under such conditions, the gate electrode layer 216 can be formed.

Note that the shape of the side surface of the gate electrode layer 216 is not particularly limited. For example, the shape may be a tapered shape. The shape of the side surface of the gate electrode layer 216 is determined depending on the conditions such as a chemical used in the second etching.

Here, the phrase "the conditions that the etching rate of the second conductive film 210 is low and the etching rate of the first conductive film 202 is high" or "the conditions that the etching selectivity of the first conductive film 202 with respect to the second conductive film 210 is high" means conditions satisfying the following first requirement and second requirement.

The first requirement is that the gate electrode layer 216 is necessarily left in a prescribed place. The prescribed place for the gate electrode layer 216 is regions indicated by dotted lines in FIG. 33 to FIG. 36. That is, it is necessary that the gate electrode layer 216 is left so as to form a gate wiring, a gate electrode included in a transistor, and one of electrodes included in a capacitor after the second etching. In order that the gate electrode layer forms the gate wiring and the capacitor wiring, the second etching needs to be performed so as not to disconnect these wirings. As illustrated in FIG. 33 and FIGS. 37A to 37C, the side surface of the gate electrode layer 216 is preferably located inside the side surface of the thin-film stack body 214 with a distance $d_1$, and the distance $d_1$ may be set as appropriate by a practitioner according to the layout.

The second requirement is that a minimum width $d_3$ of the gate wiring or the capacitor wiring formed by the gate electrode layer 216 and a minimum width $d_2$ of a source wiring or a power supply line formed by a source and drain electrode layer 220 have appropriate values (see FIG. 36). This is because if the source and drain electrode layer 220 is unintentionally etched in the second etching, the minimum width $d_2$ of the source wiring or the power supply line is reduced, resulting in excessive increase in the current density of the source wiring or the power supply line and degradation of electric characteristics. Therefore, the second etching is performed under the conditions that the etching rate of the first conductive film 202 is not exclusively high and the etching rate of the second conductive film 210 is as low as possible.

It is difficult to enlarge the minimum width $d_2$ of the source wiring or the power supply line. This is because since the minimum width $d_2$ of the source wiring or the power supply line is determined by a minimum width $d_4$ of the semiconductor layer overlapping with the source wiring or the power supply line, enlargement of the minimum width $d_2$ of the source wiring or the power supply line requires the increase in the minimum width $d_4$ of the semiconductor layer, which provides difficulty in insulating the gate wiring and the capacitor wiring, which are adjacent to each other, from each other Therefore, the minimum width $d_4$ of the semiconductor layer is set smaller than about twice the distance $d_1$. In other words, the distance $d_1$ is set larger than about half the minimum width $d_4$ of the semiconductor layer.

Note that portion where the width of the semiconductor layer overlapping with the source wiring or the power supply line is the minimum width $d_4$ may be provided at an appropriate place for dividing the gate electrode layer in accordance with elements. By the second etching, a pattern in which the gate electrode layer 216 is not left in a region which overlaps with the portion where the width of the semiconductor layer is $d_4$ can be formed.

In addition, it is preferable that the width of the electrode in a portion connected to a pixel electrode layer, which is formed of the source and drain electrode layer, be equal to the minimum width $d_2$ of the source wiring or the power supply line.

As described above, the second etching under the condition in which side-etching can be performed is very important. This is because by the second etching in which the first conductive film 202 is side-etched, a pattern which enables desired connection between not only the gate wirings, which are adjacent to each other and are formed of the gate electrode layer 216, but also elements in the pixel circuit can be formed.

Here, since the second etching is etching in which side-etching is performed, the second etching proceeds in a substantially isotropic manner. Since, as mentioned above, the first conductive film 202 is processed by the first etching to form the etched first conductive film 213 and the gate electrode layer 216 is formed by the second etching, the distance $d_1$ can be made smaller than the thickness of the first conductive film 202. That is, the distance $d_1$ can be controlled independently of the thickness of the first conductive film 202, thereby increasing the freedom of layout design of a pixel structure.

Here, "side-etching" means etching in which a film is etched in not only a thickness direction of the film (a direction perpendicular to the substrate surface or a direction perpendicular to the surface of a base film) but also in a direction perpendicular to the thickness direction (a direction parallel to the substrate surface or a direction parallel to the surface of the base film). An end portion of the film subjected to side-etching can have various shapes depending on the etching rate of an etching gas or a chemical used for the etching of the film. The end portion of the film is, in many cases, formed with a curved surface.

Figure 33:
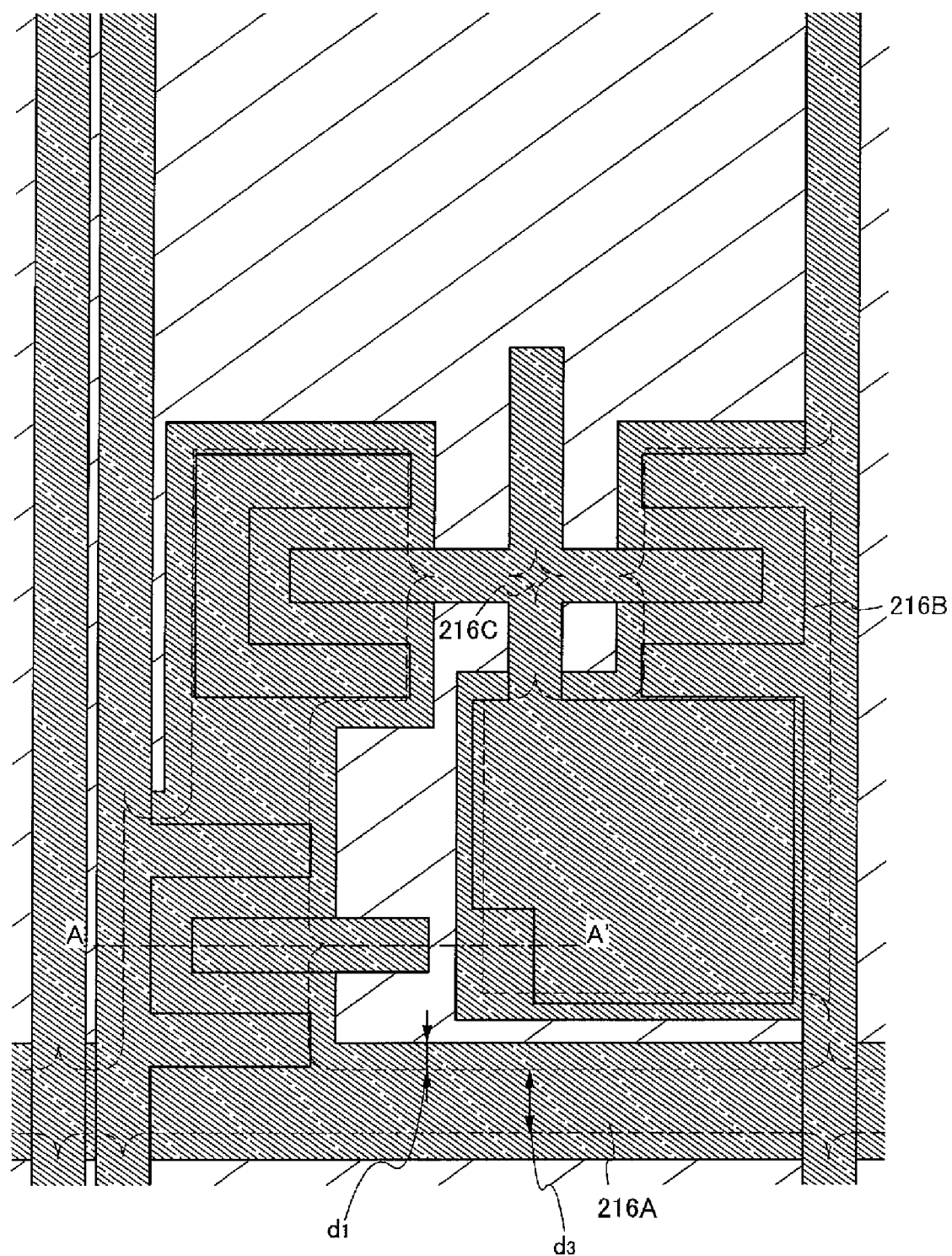
FIG. 33 illustrates an example of a manufacturing method of a thin film transistor and a display device.

The gate electrode layer 216C illustrated in FIG. 33 serves as a supporting portion which supports the thin-film stack body 214. By the existence of the supporting portion, peeling of a film such as a gate insulating film formed over the gate electrode layer can be prevented. Further, by the existence of the supporting portion, a cavity region formed adjacent to the gate electrode layer 216 by the second etching can be prevented form being larger than necessary. Furthermore, it is preferable to provide the supporting portion because the thin-film stack body 214 can be prevented from being broken or damaged due to its own weight and, accordingly, yield is increased. However, the present embodiment is not limited to the mode with the supporting portion, and the supporting portion is not necessarily provided.

As described above, the second etching is preferably performed by wet etching.

In the case where the second etching is performed by wet etching, aluminum or molybdenum may be deposited as the first conductive film 202, titanium or tungsten may be deposited as the second conductive film 210, and a chemical containing nitric acid, acetic acid, and phosphoric acid may be used for etching. Alternatively, molybdenum may be deposited as the first conductive film 202, titanium, aluminum, or tungsten may be deposited as the second conductive film 210, and a chemical containing an aqueous solution of hydrogen peroxide may be used for etching.

In the case where the second etching is performed by wet etching, it is most preferable that a stacked film in which molybdenum is deposited over aluminum to which neodymium is added be formed as the first conductive film 202, tungsten be deposited as the second conductive film 210, and a chemical containing nitric acid at 2%, acetic acid at 10%, and phosphoric acid at 72% be used for etching. By usage of a chemical having such a composition, the etched first conductive film 213 can be etched without the second conductive film 210 being etched. Note that neodymium is added to the first conductive film 202 for the purpose of reducing electrical resistance of aluminum and preventing the formation of hillocks.

The gate electrode layer 216, when seen from the above, has a projection (see FIG. 33). This is because the second etching for forming the gate electrode layer 216 proceeds almost isotropically so that the distance $d_1$ between the side surface of the gate electrode layer 216 and the side surface of the thin-film stack body 214 is almost uniform.

Next, the thickness of the first resist mask 212 is reduced. For example, the first resist mask 212 is thinned. Accordingly, the second conductive film 210 is exposed and a second resist mask 218 is formed. As means for forming the second resist mask 218 by reduction of the thickness of the first resist mask 212, for example, ashing using oxygen plasma can be given. However, the means for forming the second resist mask 218 by the reduction of the thickness of the first resist mask 212 is not limited to this method. The region where the second resist mask 218 is formed roughly corresponds to the region where the projected portion of the first resist mask 212 is formed. Note that the case where the second resist mask 218 is formed after the second etching is described here; however, the present embodiment is not limited to this case and the second etching may be performed after formation of the second resist mask 218.

In the case where a multi-tone mask is not used to form the first resist mask 212, the second resist mask 218 may be newly formed using a different photomask.

Figure 38A:
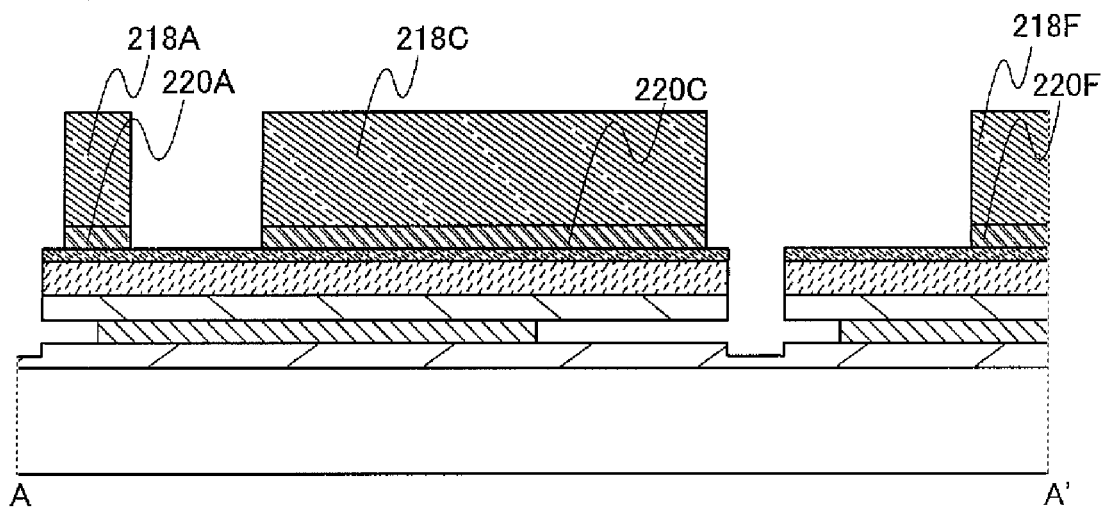
FIGS. 38A to 38C illustrate an example of a manufacturing method of a thin film transistor and a display device.

Next, the second conductive film 210 in the thin-film stack body 214 is etched using the second resist mask 218, so that the source and drain electrode layer 220 is formed (see FIG. 34 and FIG. 38A). Here, as the etching conditions, the conditions by which unintentional etching or erosion of the films other than the second conductive film 210 is negligible are selected. In particular, it is important that etching be performed under the conditions that unintentional etching or erosion of the gate electrode layer 216 is negligible.

Note that the source and drain electrode layer 220 forms the source electrode and the drain electrode of a thin film transistor, the source wiring, the power supply line, the other electrode of the capacitor, and an electrode which connects the thin film transistor and one electrode of a light-emitting element to each other. The expression of a source and drain electrode layer 220A means an electrode layer which forms the source wiring 188 and one of a source electrode and a drain electrode of the first transistor 181. The expression of a source and drain electrode layer 220B means an electrode layer which forms the first power supply line 187. The expression of a source and drain electrode layer 220C means an electrode layer which forms the other of the source electrode and the drain electrode of the first transistor 181 and an electrode which connects the first transistor 181 and the pixel electrode to each other. The expression of a source and drain electrode layer 220D means an electrode layer which forms the second power supply line 189 and one of a source electrode and a drain electrode of the second transistor 182. The expression of a source and drain electrode layer 220E means an electrode layer which forms one of a source electrode and a drain electrode of the third transistor 183. The expression of a source and drain electrode layer 220F means an electrode layer which forms the other electrode of the capacitor 184, the other of the source electrode and the drain electrode of the second transistor 182, the other of the source electrode and the drain electrode of the third transistor 183, and an electrode which connects any of these electrodes and one electrode of the light-emitting element to each other.

Note that the second resist mask 218A overlaps with the source and drain electrode layer 220A, the second resist mask 218B overlaps with the source and drain electrode layer 220B, the second resist mask 218C overlaps with the source and drain electrode layer 220C, the second resist mask 218D overlaps with the source and drain electrode layer 220D, the second resist mask 218E overlaps with the source and drain electrode layer 220E, and the second resist mask 218F overlaps with the source and drain electrode layer 220F.

Note that for etching the second conductive film 210 in the thin-film stack body 214, either wet etching or dry etching may be performed.

Figure 38B:
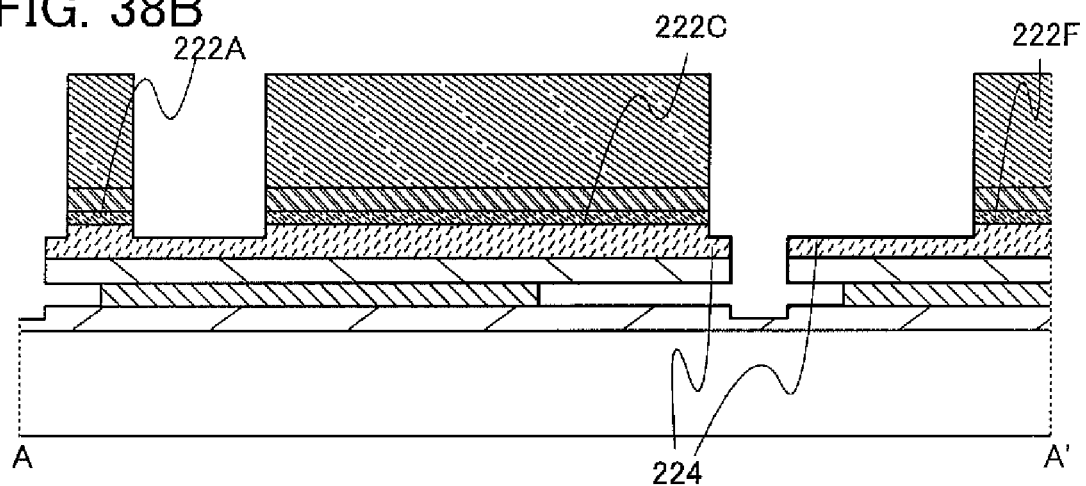

Then, the impurity semiconductor film 208 and an upper portion of the semiconductor film 206 (back channel portion) in the thin-film stack body 214 are etched to form a source and drain region 222 and a semiconductor layer 224 (see FIG. 35 and FIG. 38B). Here, as the etching conditions, the conditions by which the unintentional etching or erosion of the films other than the impurity semiconductor film 208 and the semiconductor film 206 is negligible are selected. In particular, it is important that etching be performed under the conditions that the unintentional etching or erosion of the gate electrode layer 216 can be neglected.

Note that the etching of the impurity semiconductor film 208 and the upper portion of the semiconductor film 206 (back channel portion) in the thin-film stack body 214 can be performed by dry etching or wet etching.

Figure 38C:
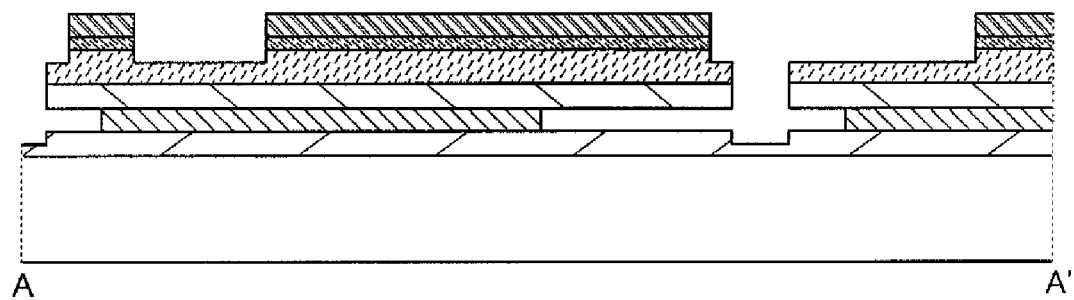

Then, the second resist mask 218 is removed; accordingly, a thin film transistor is completed (see FIG. 38C). In the above-described manner, a thin film transistor which can be used for an EL display device can be manufactured using one photomask (multi-tone mask).

Note that the steps described with reference to FIG. 38A and FIG. 38B are collectively referred to as "third etching." The third etching may be performed in plural steps as described above or may be performed in a single step.

A third insulating film is formed to cover the thin film transistor which is formed in the above-described manner. Although the third insulating film may be formed of only a first protective film 226, the third insulating film is formed of the first protective film 226 and a second protective film 228 here (see FIG. 39A and FIG. 43A). The first protective film 226 may be formed in a similar manner to the second insulating film 204. Preferably, the first protective film 226 is formed using silicon nitride containing hydrogen or silicon oxynitride containing hydrogen to prevent a semiconductor layer from being contaminated by entry and diffusion of impurities such as metal.

The second protective film 228 is formed by a method by which the surface thereof becomes almost planar. This is because when the surface of the second protective film 228 is almost even, disconnection or the like of a first pixel electrode layer 232 formed over the second protective film 228 can be prevented. Accordingly, the phrase "almost planar" means planar in such an extent that the aforementioned aim can be achieved, and does not mean that high planarity is required.

The second protective film 228 can be formed, for example, by a spin coating method or the like using photosensitive polyimide, acrylic, epoxy resin, or the like. Note that the material and the formation method of the second protective film 228 are not limited to the above-described materials and formation method.

The second protective film 228 is preferably formed by stacking the above-described protective film formed by a method by which the surface thereof becomes almost planar and a protective film which covers the protective film and prevents entry and release of moisture. Specifically, the protective film which prevents entry and release of moisture is preferably formed using silicon nitride, silicon oxynitride, aluminum oxynitride, aluminum nitride, or the like. As a formation method of the second protective film 228, a sputtering method is preferably used.

Figure 39A:
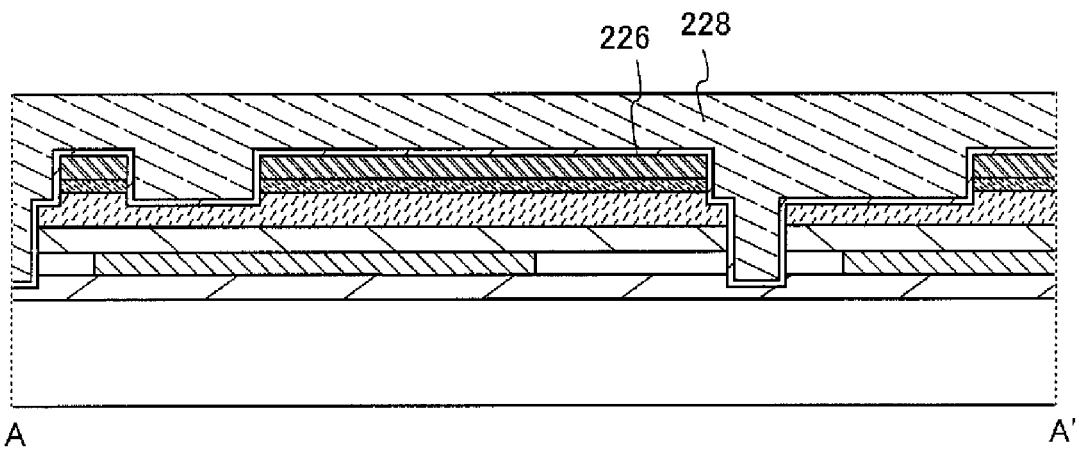
FIGS. 39A to 39C illustrate an example of a manufacturing method of a thin film transistor and a display device.
Figure 39B:
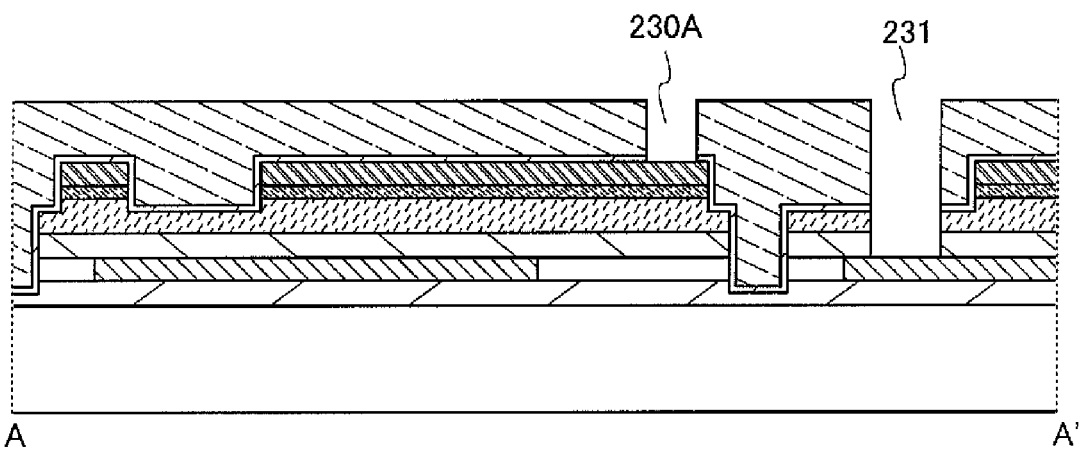

Next, a first opening portion 230 and a second opening portion 231 are formed in the third insulating film (see FIG. 39B and FIG. 43B). The first opening portion 230 is formed so as to reach at least the surface of the source and drain electrode layer The second opening portion 231 is formed so as to reach at least the surface of the gate electrode layer. The formation method of the first opening portion 230 and the second opening portion 231 is not limited to a particular method and may be determined as appropriate by a practitioner in accordance with the diameter of the first opening portion 230 or the like. For example, the first opening portion 230 and the second opening portion 231 can be formed by dry etching using photolithography.

The first opening portion 230 is provided so as to reach the source and drain electrode layer 220, and a plurality of first opening portions 230 are provided in appropriate places as illustrated in FIG. 36. The first opening portion 230A is provided on the source and drain electrode layer 220C, the first opening portion 230B is provided on the source and drain electrode layer 220B, the first opening portion 230C is provided on the source and drain electrode layer 220E, and the first opening portion 230D is provided on the source and drain electrode layer 220F.

The second opening portion 231 is provided so as to reach the gate electrode layer 216. In other words, not only the third insulating film but also desired regions of the second insulating film 204 and the semiconductor layer 224 are removed to provide the second opening portion 231.

Note that in the case of forming the opening portions by photolithography, one photomask is used.

Figure 39C:
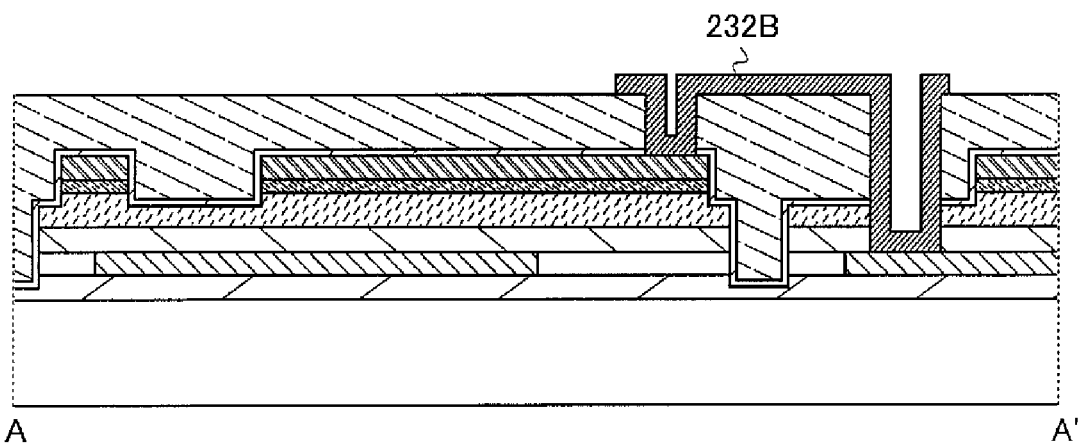

Next, the first pixel electrode layer 232 is formed over the third insulating film (see FIG. 36, FIG. 39C, and FIG. 43C). The first pixel electrode layer 232 is formed so as to be connected to the source and drain electrode layer 220 or the gate electrode layer 216 through the first opening portion 230 or the second opening portion 231, respectively. Specifically, the first pixel electrode layer 232 is formed so as to be connected to the source and drain electrode layer 220C through the first opening portion 230A, the source and drain electrode layer 220B through the first opening portion 230B, the source and drain electrode layer 220E through the first opening portion 230C, the source and drain electrode layer 220F through the first opening portion 230D, and the gate electrode layer 216B through the second opening portion 231. The first pixel electrode layer 232 may have a single layer structure or a stacked structure including a plurality of films.

Note that in the case of forming the first pixel electrode layer 232 by photolithography, one photomask is used.

Since the thin film transistor included in the pixel is an n-channel transistor, it is preferable to form the first pixel electrode layer 232 using a material which forms a cathode. As the material which forms a cathode, a material having a low work function such as Ca, Al, MgAg, AlLi, or the like can be given.

Next, a partition wall 233 is formed on the side surface (end portion) of the first pixel electrode layer 232 and over the third insulating film (see FIG. 43C). The partition wall 233 has an opening portion, and the first pixel electrode layer 232 is exposed through the opening portion. The partition wall 233 is formed using an organic resin film, an inorganic insulating film, or organic polysiloxane. Specifically, the partition wall 233 may be formed using polyimide, polyamide, polyimide amide, acrylic, or benzocyclobutene-based resin. It is particularly preferable that the partition wall 233 be formed using a photosensitive material to have an opening portion over the first pixel electrode layer 232 and a sidewall of the opening portion have a tilted surface with continuous curvature.

Next, an EL layer 234 is formed to be in contact with the first pixel electrode layer 232 at the opening portion of the partition wall 233 (see, FIG. 43C). The EL layer 234 may be formed using a single layer structure or a stacked structure including a plurality of layers. The EL layer 234 includes at least a light-emitting layer. It is preferred that the EL layer 234 is connected to a second pixel electrode layer 235 through an electron injection layer.

Then, the second pixel electrode layer 235 is formed using a material which forms an anode, to cover the EL layer 234. The second pixel electrode layer 235 corresponds to the common electrode 190 in FIG. 31. The second pixel electrode layer 235 can be formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the formation method is not limited to a particular method. In addition, the second pixel electrode layer 235 may be formed using a single layer structure or a stacked structure including a plurality of films.

Here, ITO is used for the second pixel electrode layer 235. In the opening portion of the partition wall 233, the first pixel electrode layer 232, the EL layer 234, and the second pixel electrode layer 235 overlap with one another; accordingly, a light-emitting element 236 is formed. The light-emitting element 236 corresponds to the light-emitting element 185 in FIG. 31. Then, a third protective film 237 (not shown) is preferably formed over the second pixel electrode layer 235 and the partition wall 233 so that oxygen, hydrogen, moisture, carbon dioxide, or the like does not enter the light-emitting element 236. As a material of the third protective film 237, a material having a function of preventing entry and release of moisture is selected from materials which are similar to those of the first protective film 226. The third protective film 237 is preferably formed using silicon nitride, silicon oxynitride, aluminum oxynitride, aluminum nitride, or the like. Further, a silicon nitride film, a DLC film, or the like is preferably provided to cover the third protective film 237.

Then, it is preferable to further perform packaging (sealing) with a protective film (e.g., a bonding film or an ultraviolet curable resin film) or a covering material in order to prevent exposure to air. The protective film or the covering material is preferably formed using a material which has low gas-permeability and causes less degassing.

In the above-described manner, a light-emitting element of a top emission EL display device can be formed (see FIG. 43C). However, an EL display device which is one embodiment of the present invention is not limited by the above description and can be a bottom emission EL display device or a dual emission EL display device. In the bottom emission structure or the dual emission structure, the first pixel electrode layer 232 is formed using a conductive material having a light-transmitting property. Note that, in the case where the first pixel electrode layer 232 is formed by a material functioning as an cathode, the first pixel electrode layer 232 may be formed using ITO, for example. The use of such a structure for the first pixel electrode layer allows the manufacture of a light emitting element with the bottom-emission structure. In this case, the second pixel electrode layer 235 can be formed using a material functioning as an anode so as to cover the EL layer 234. The material functioning as the anode is exemplified by a material with low work function such as Ca, Al. MgAg, and AlLi. Note that the EL layer 234 and the second pixel electrode layer 235 are preferably formed by the vapor deposition using a mask. Thus, it is preferred to form the second pixel electrode layer 235 using a material which is capable of forming a film by the vapor deposition.

Note that the materials and the formation methods of the protective film and the like described above are not limited to those described above as long as light emission of the EL layer is not interfered and deterioration and the like can be prevented.

Further, in the top emission structure, the first pixel electrode layer 232A may be formed so as to cover the region where the pixel circuit is formed. In this case, first, only the conductive layers corresponding to the first pixel electrode layer 232B and the first pixel electrode layer 232C are formed, insulating films each having the first opening portion 230D are formed over the conductive layers, and then, the first pixel electrode layer 232A is formed so as to be connected to the source and drain electrode layer 220F through the first opening portions 230D. By forming the first pixel electrode layer 232A so as to cover the region where the pixel circuit is formed, the light-emitting region can be enlarged and higher definition display can be performed.

Note that although an organic EL element is described here as a light-emitting element, an inorganic EL element can also be used as a light-emitting element.

Note that a terminal connection portion is similar to any of the terminal connection portions described in Embodiment 1.

In the above-described manner, an EL display device can be manufactured.

As described above, the number of manufacturing steps of a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, since the number of photomasks to be used is reduced, the number of manufacturing steps of a thin film transistor and a display device can be significantly reduced.

In addition, the number of manufacturing steps of a thin film transistor can be significantly reduced without a complicated step using backside light exposure, resist reflow, a lift-off method, or the like. Therefore, the number of manufacturing steps of a display device can be significantly reduced without a complicated step. Thus, the number of manufacturing steps of a display device can be significantly reduced without reducing yield.

Moreover, the number of manufacturing steps of a thin film transistor can be significantly reduced while electric characteristics of the thin film transistor are maintained.

Furthermore, by the aforementioned effects, manufacturing cost can be significantly reduced.

In addition, since the first conductive film 202 is processed by the first etching, the distance $d_1$ between the side surface of the thin-film stack body 214 and the side surface of the gate electrode layer 216 can be controlled independently of the thickness of the first conductive film 202, thereby increasing the freedom of layout design of a pixel structure.

Even if a glass substrate containing an impurity metal element is used as the substrate, the impurity metal element can be prevented from attaching to and entering a semiconductor layer, so that degradation of electric characteristics (e.g., high off current) of the thin film transistor can be prevented. Accordingly, a thin film transistor having favorable electric characteristics can be manufactured. Further, variation in characteristics over the substrate of the thin film transistor to be manufactured can be made small. Therefore, display unevenness of the display device can be made small.

Furthermore, the bottom emission EL display device is preferable because the optical design can be performed utilizing adjustment of the thickness of the first insulating film 201.

Furthermore, since a thin film transistor in which leakage current generated at an end portion of the gate electrode layer is low can be manufactured, a display device with a high contrast ratio and favorable display quality can be obtained.

The pixel structure of the invention disclosed in this specification is not limited to the one described above and can be applied to a variety of EL display devices.

Embodiment 4

In Embodiment 4, electronic devices in which a display panel or a display device manufactured by any of the methods described in Embodiments 1 to 3 is incorporated as a display portion will be described with reference to FIGS. 40A and 40B, FIG. 41, and FIGS. 42A to 42C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic device are illustrated in FIGS. 40A and 40B.

Figure 40A:
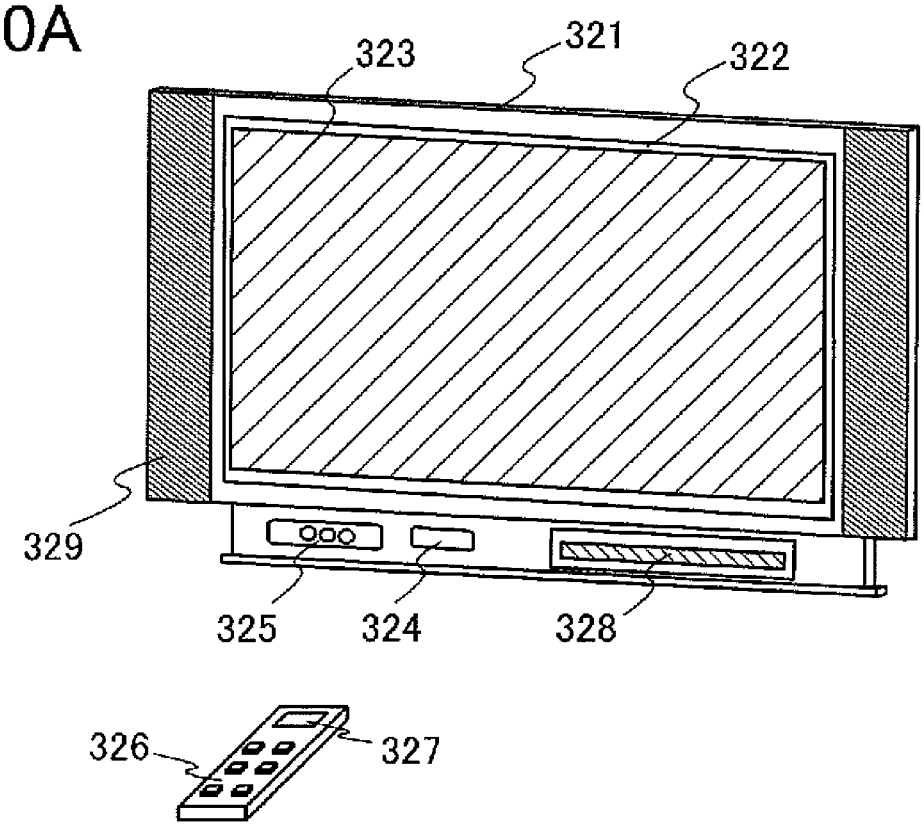
FIGS. 40A and 40B each illustrate an electronic device.
Figure 40B:
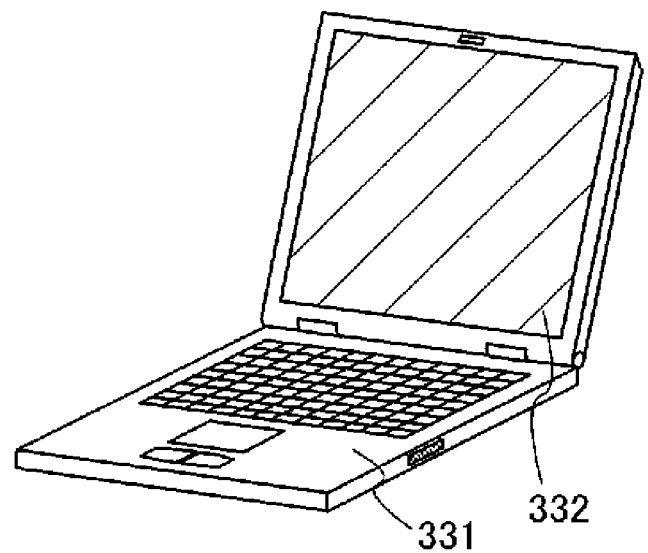

FIG. 40A illustrates a television device. A television device illustrated in FIG. 40A can be completed by incorporating a display panel into a housing. A main screen 323 is formed using the display panel manufactured by any of the manufacturing methods described in Embodiments 1 to 3, and a speaker portion 329, operation switches, and the like are provided as its accessory equipment.

As illustrated in FIG. 40A, a display panel 322 manufactured by any of the manufacturing methods described in Embodiments 1 to 3 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) information communication can be performed. The television device can be operated using switches incorporated into the housing or by a remote control device 326 provided separately. A display portion 327 which displays output information may be provided for the remote control device 326.

Further, the television device may include a sub-screen 328 formed using a second display panel for displaying channels, volume, and the like, in addition to the main screen 323.

Figure 41:
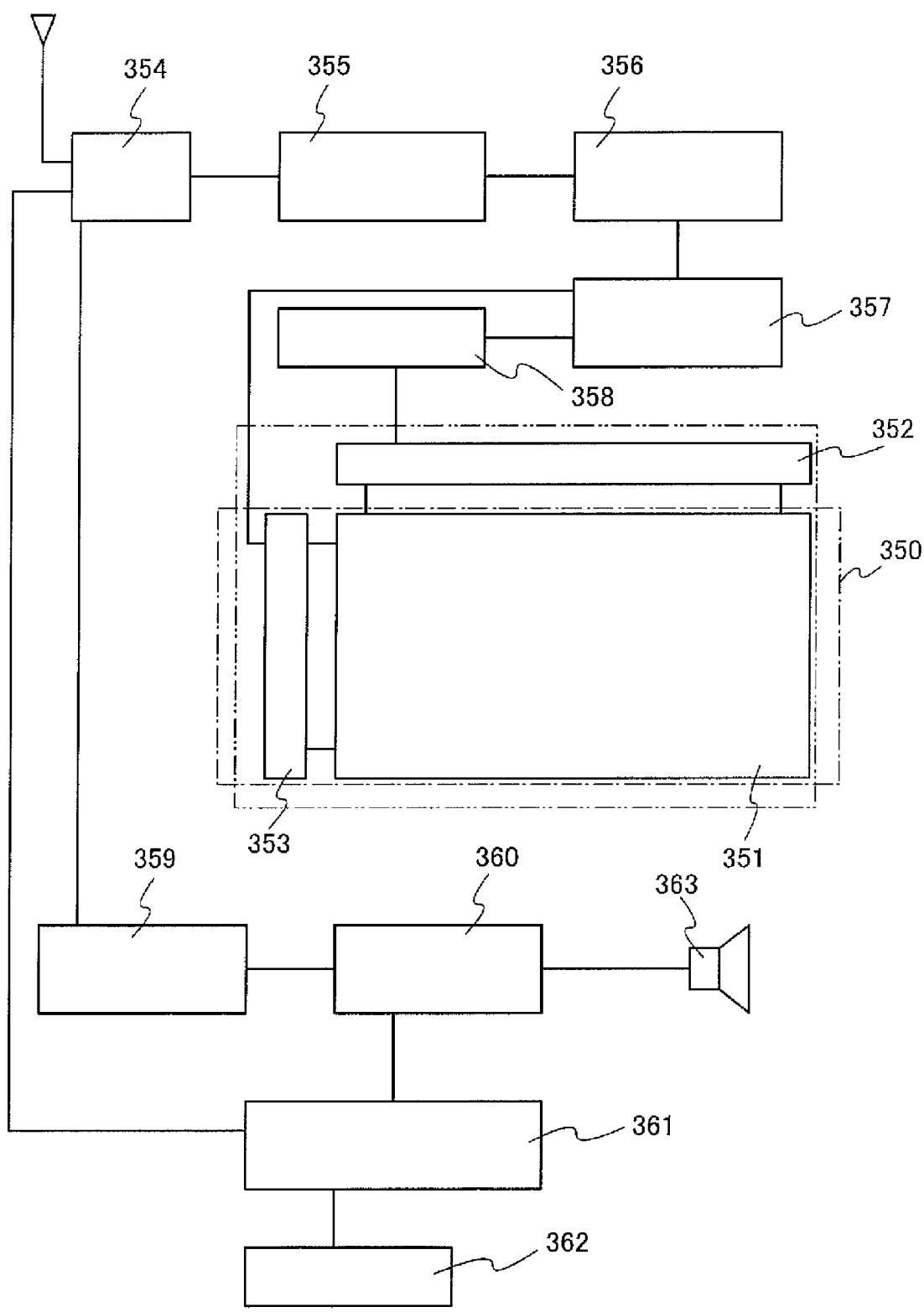
FIG. 41 illustrates a block diagram of an electronic device.

FIG. 41 is a block diagram of a main structure of a television device. A pixel portion 351 is formed in a display panel 350. A signal line driver circuit 352 and a scanning line driver circuit 353 may be mounted on the display panel by a COG method.

As structures of other external circuits, a video signal amplifier circuit 355 amplifying a video signal among signals received by a tuner 354, a video signal processing circuit 356 converting signals output from the video signal amplifier circuit 355 into chrominance signals corresponding to respective colors of red, green, and blue, a control circuit 357 for converting the video signal into a signal which meets input specifications of a driver IC, and the like are provided on the input side of the video signal. The control circuit 357 outputs signals to each of the scanning line side and the signal line side. In the case of digital drive, a signal dividing circuit 358 may be provided on the signal line side and an input digital signal may be divided into m (m is an integer) pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control information on receiving station (receiving frequency) and volume from an input portion 362 and transmits signals to the tuner 354 and the audio signal processing circuit 360.

Naturally, the display device which is one aspect of the invention disclosed in this specification is not limited to the television device and can also be applied to a large-size display medium such as an information display board at a train station, an airport, and the like, or an advertisement display board on the street, as well as a monitor of a personal computer. By using the manufacturing method of a display device which is one embodiment of the present invention, productivity of these display mediums can be improved.

When the display panel or display device manufactured by any of the manufacturing methods of a display device described in Embodiments 1 to 3 is applied to the main screen 323 and the sub screen 328, productivity of television devices can be increased.

A mobile computer illustrated in FIG. 40B includes a main body 331, a display portion 332, and the like. When the display panel or display device manufactured by any of the manufacturing methods of a display device described in Embodiments 1 to 3 is applied to the display portion 332, productivity of computers can be increased.

FIGS. 42A to 42C illustrate an example of a mobile phone. FIG. 42A is a front view, FIG. 42B is a rear view, and FIG. 42C is a development view when two housings slide. A mobile phone 300 includes two housings 301 and 302. The mobile phone 300 is a so-called smartphone which has both functions of a mobile phone and a portable information terminal, and incorporates a computer and can process a variety of data processing in addition to voice calls.

The mobile phone 300 includes the housing 301 and the housing 302. The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above-described structure, a wireless IC chip, a small size memory device, or the like may be incorporated in the mobile phone 300.

The housings 301 and 302 overlapped with each other (illustrated in FIG. 42A) slide and can be developed as illustrated in FIG. 42C. The display panel or display device manufactured by any of the manufacturing methods of a display device described in Embodiments 1 to 3 can be incorporated in the display portion 303. Since the display portion 303 and the front camera lens 308 are provided in the same plane, the mobile phone 300 can be used as a videophone. A still image and a moving image can be taken by the rear camera 313 and the light 314 by using the display portion 303 as a viewfinder.

By using the speaker 304 and the microphone 305, the mobile phone 300 can be used as an audio recording device (sound recorder) or an audio reproducing device. With use of the operation keys 306, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 300 as a portable information terminal, the use of the keyboard 311 is convenient. The housings 301 and 302 overlapped with each other (FIG. 42A) slide and can be developed as illustrated in FIG. 42C. In the case where the mobile phone 300 is used as a portable information terminal, smooth operation can be performed with the keyboard 311 and the pointing device 307. The jack 309 for an external connection terminal can be connected to various cables such as an AC adopter or a USB cable, whereby the mobile phone 300 can be charged or can perform data communication with a personal computer or the like. Moreover, by inserting a recording medium into the external memory slot 312, the mobile phone 300 can deal with storing and moving a large capacity of data.

In the rear surface of the housing 302 (FIG. 42B), the rear camera 313 and the light 314 are provided, and a still image and a moving image can be taken by using the display portion 303 as a viewfinder.

Further, the mobile phone 300 may have an infrared communication function, a USB port, a function of receiving one segment television broadcast, a non-contact IC chip, an earphone jack, or the like, in addition to the above-described functions and structures.

Since various electronic devices described in this embodiment can be manufactured by any of the manufacturing methods of a thin film transistor and a display device described in Embodiments 1 to 3, productivity of these electronic devices can be increased.

Accordingly, manufacturing cost of these electronic devices can be significantly reduced.

Furthermore, as described in Embodiments 1 to 3, a display device having high display quality can be manufactured.

This application is based on Japanese Patent Application serial no. 2008-057208 filed with Japan Patent Office on Mar. 7, 2008, the entire contents of which are hereby incorporated by reference.

What is claimed is:

1. A manufacturing method of a thin film transistor using a single photomask, the method comprising the steps of:
   sequentially forming a first insulating film, a first conductive film, a second insulating film, a semiconductor film, an impurity semiconductor film, and a second conductive film;

forming a first resist mask over the second conductive film using the single photomask, wherein the first resist mask has a recessed portion and a projected portion;

performing first etching, using the first resist mask, to etch the first conductive film, the second insulating film, the semiconductor film, the impurity semiconductor film, and the second conductive film;

performing second etching in which the first conductive film is selectively side-etched to allow a width of the first conductive film to be narrower than a width of the first resist mask;

forming a second resist mask from the first resist mask after performing the second etching, the second resist mask having an opening over the second conductive film; and performing third etching using the second resist mask, wherein, underneath the opening, the third etching is performed to allow the second conductive film, the impurity semiconductor film, and a part of the semiconductor film to be removed, and wherein, underneath the projected portion, the third etching is performed to allow the second conductive film, the impurity semiconductor film, and the semiconductor film to be left.

2. The manufacturing method of the thin film transistor according to claim 1, wherein the first resist mask is formed by photolithography using the single photomask.

3. The manufacturing method of the thin film transistor according to claim 1, wherein the formation of the second resist mask is performed by thinning the first resist mask to allow a part of an upper surface of the second conductive film which overlaps with the recessed portion to be exposed.

4. The manufacturing method of the thin film transistor according to claim 1, wherein the second etching is performed to allow a side surface of the first conductive film to be located underneath and inside a side surface of the first resist mask.

5. The manufacturing method of the thin film transistor according to claim 1, wherein an upper portion of the first insulating film is etched in the first etching.

6. The manufacturing method of the thin film transistor according to claim 1, wherein the first etching is dry etching and the second etching is wet etching.

7. The manufacturing method of the thin film transistor according to claim 1, wherein the single photomask comprises a single multi-tone mask and the first resist mask is formed by photolithography using the single multi-tone mask.

8. A manufacturing method of a thin film transistor using a single photomask, the method comprising the steps of:

sequentially forming a first insulating film, a first conductive film, a second insulating film, a semiconductor film, an impurity semiconductor film, and a second conductive film;

forming a first resist mask over the second conductive film using the single photomask, wherein the first resist mask has a recessed portion and a projected portion;

performing first etching, using the first resist mask, to etch the first conductive film, the second insulating film, the semiconductor film, the impurity semiconductor film, and the second conductive film;

forming a second resist mask from the first resist mask, the second resist mask having an opening over the second conductive film;

performing second etching, after forming the second resist mask, in which the first conductive film is selectively side-etched to allow a width of the first conductive film to be narrower than a width of the first resist mask; and performing third etching using the second resist mask, wherein, underneath the opening, the third etching is performed to allow the second conductive film, the impurity semiconductor film, and a part of the semiconductor film to be removed, and wherein, underneath the projected portion, the third etching is performed to allow the second conductive film, the impurity semiconductor film, and the semiconductor film to be left.

9. The manufacturing method of the thin film transistor according to claim 8, wherein the first resist mask is formed by photolithography using the single photomask.

10. The manufacturing method of the thin film transistor according to claim 8, wherein the formation of the second resist mask is performed by thinning the first resist mask to allow a part of an upper surface of the second conductive film which overlaps with the recessed portion to be exposed.

11. The manufacturing method of the thin film transistor according to claim 8, wherein the second etching is performed to allow a side surface of the first conductive film to be located underneath and inside a side surface of the first resist mask.

12. The manufacturing method of the thin film transistor according to claim 8, wherein an upper portion of the first insulating film is etched in the first etching.

13. The manufacturing method of the thin film transistor according to claim 8, wherein the first etching is dry etching and the second etching is wet etching.

14. The manufacturing method of the thin film transistor according to claim 8, wherein the single photomask comprises a single multi-tone mask and the first resist mask is formed by photolithography using the single multi-tone mask.

15. A manufacturing method of a thin film transistor using a single photomask, the method comprising the steps of:

sequentially forming a first insulating film, a first conductive film, a second insulating film, a semiconductor film, and a second conductive film;

forming a first resist mask over the second conductive film using the single photomask, wherein the first resist mask has a recessed portion and a projected portion;

performing first etching, using the first resist mask, to etch the first conductive film, the second insulating film, the semiconductor film, and the second conductive film;

performing second etching in which the first conductive film is selectively side-etched to allow a width of the first conductive film to be narrower than a width of the first resist mask;

forming a second resist mask from the first resist mask, the second resist mask having an opening over the second conductive film; and performing third etching using the second resist mask, wherein, underneath the opening, the third etching is performed to allow the second conductive film, and a part of the semiconductor film to be removed, and wherein, underneath the projected portion, the third etching is performed to allow the second conductive film and the semiconductor film to be left.

16. The manufacturing method of the thin film transistor according to claim 13, further comprising the steps of:
- removing the second resist mask,
- forming a protective film over the second conductive film,
- forming a second opening in the protective film to allow the second conductive film to be exposed, and
- forming a pixel electrode which is electrically connected to the second conductive film through the second opening.

17. The manufacturing method of the thin film transistor according to claim 15,
- wherein the first resist mask is formed by photolithography using the single photomask.

18. The manufacturing method of the thin film transistor according to claim 15,
- wherein the formation of the second resist mask is performed by thinning the first resist mask to allow a part of an upper surface of the second conductive film which overlaps with the recessed portion to be exposed.

19. The manufacturing method of the thin film transistor according to claim 15,
- wherein the second etching is performed to allow a side surface of the first conductive film to be located underneath and inside a side surface of the first resist mask.

20. The manufacturing method of the thin film transistor according to claim 15,
- wherein an upper portion of the first insulating film is etched in the first etching.

21. The manufacturing method of the thin film transistor according to claim 15,
- wherein the first etching is dry etching and the second etching is wet etching.

22. The manufacturing method of the thin film transistor according to claim 15,
- wherein the single photomask comprises a single multi-tone mask and the first resist mask is formed by photolithography using the single multi-tone mask.

* * * * *

UNITED STATES PATENT AND TRADEMARK OFFICE
CERTIFICATE OF CORRECTION

| | | |
|---|---|---|
| PATENT NO. | : 7,749,820 B2 | Page 1 of 1 |
| APPLICATION NO. | : 12/393121 | |
| DATED | : July 6, 2010 | |
| INVENTOR(S) | : Hidekazu Miyairi | |

It is certified that error appears in the above-identified patent and that said Letters Patent is hereby corrected as shown below:

Column 13, line 63, replace "wring" with --wiring--;

Column 19, line 32, replace "conducive" with --conductive--;

Column 41, line 2, in claim 16 replace "13" with --15--.

Signed and Sealed this
Eleventh Day of January, 2011

David J. Kappos
*Director of the United States Patent and Trademark Office*